United States Patent
Huang et al.

(10) Patent No.: US 12,040,219 B2
(45) Date of Patent: Jul. 16, 2024

(54) ETCH PROFILE CONTROL OF ISOLATION TRENCH

(71) Applicant: TAIWAN SEMICONDUCTOR MANUFACTURING COMPANY, LTD., Hsinchu (TW)

(72) Inventors: Hsien-Chung Huang, Hsinchu (TW); Chiung-Wen Hsu, Tainan (TW); Mei-Ju Kuo, Hsinchu (TW); Yu-Ting Weng, Taichung (TW); Yu-Chi Lin, Hsinchu County (TW); Ting-Chung Wang, Kaohsiung (TW); Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 363 days.

(21) Appl. No.: 17/371,618

(22) Filed: Jul. 9, 2021

(65) Prior Publication Data

US 2022/0301922 A1 Sep. 22, 2022

Related U.S. Application Data

(60) Provisional application No. 63/163,232, filed on Mar. 19, 2021.

(51) Int. Cl.
*H01L 21/762* (2006.01)
*H01L 21/02* (2006.01)
(Continued)

(52) U.S. Cl.
CPC .... *H01L 21/76232* (2013.01); *H01L 21/0259* (2013.01); *H01L 21/3065* (2013.01);
(Continued)

(58) Field of Classification Search
CPC .......... H01L 21/02603; H01L 21/0259; H01L 21/28141; H01L 21/3065; H01L 21/308;
(Continued)

(56) References Cited

U.S. PATENT DOCUMENTS 9,209,247 B2  12/2015 Colinge et al.
9,236,267 B2  1/2016 De et al.
(Continued)

*Primary Examiner* — David C Spalla
(74) *Attorney, Agent, or Firm* — Birch, Stewart, Kolasch & Birch, LLP

(57) ABSTRACT

A device includes a substrate, a first fin, a second fin, a first isolation structure, a second isolation structure, and a gate structure. The first fin extends from a p-type region of the substrate. The second fin extends from an n-type region of the substrate. The first isolation structure is over the p-type region and adjacent to the first fin. The first isolation structure has a bottom surface and opposite first and second sidewalls connected to the bottom surface, a first round corner is between the bottom surface and the first sidewall of the first isolation structure, and the first sidewall is substantially parallel to the second sidewall. The second isolation structure is over the n-type region and adjacent to the first fin. The first isolation structure is deeper than the second isolation structure. The gate structure is over the first isolation structure and covering the first fin.

20 Claims, 72 Drawing Sheets

(51) Int. Cl.
*H01L 21/3065* (2006.01)
*H01L 21/308* (2006.01)
*H01L 21/8238* (2006.01)
*H01L 27/092* (2006.01)
*H01L 29/06* (2006.01)
*H01L 29/423* (2006.01)
*H01L 29/66* (2006.01)
*H01L 29/78* (2006.01)
*H01L 29/786* (2006.01)

(52) U.S. Cl.
CPC .... *H01L 21/308* (2013.01); *H01L 21/823807* (2013.01); *H01L 21/823814* (2013.01); *H01L 21/823821* (2013.01); *H01L 21/823878* (2013.01); *H01L 27/0924* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/66795* (2013.01); *H01L 29/7851* (2013.01); *H01L 29/78696* (2013.01)

(58) Field of Classification Search
CPC ....... H01L 21/76232; H01L 21/823431; H01L 21/823807; H01L 21/823814; H01L 21/823821; H01L 21/823878; H01L 21/845; H01L 27/0886; H01L 27/0924; H01L 27/1211; H01L 29/0653; H01L 29/0665; H01L 29/0669; H01L 29/0673; H01L 29/41791; H01L 29/42392; H01L 29/66439; H01L 29/6653; H01L 29/66553; H01L 29/66545; H01L 29/6656; H01L 29/66742; H01L 29/66795; H01L 29/775; H01L 29/785; H01L 29/7851; H01L 29/7853; H01L 29/7855; H01L 29/78696; H01L 2029/7858

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2017/0294437 A1* | 10/2017 | Cantoro ............ H01L 21/02532 |
| 2018/0151414 A1* | 5/2018 | Wu ...................... H01L 27/0886 |
| 2019/0067417 A1* | 2/2019 | Ching ................ H01L 29/66545 |
| 2019/0097053 A1* | 3/2019 | Cheng ................ H01L 29/0649 |
| 2019/0393303 A1* | 12/2019 | Choi .................. H01L 29/0653 |
| 2021/0035976 A1* | 2/2021 | Gwon ................ H01L 27/0924 |
| 2022/0223720 A1* | 7/2022 | Yang .................. H01L 29/0653 |

\* cited by examiner

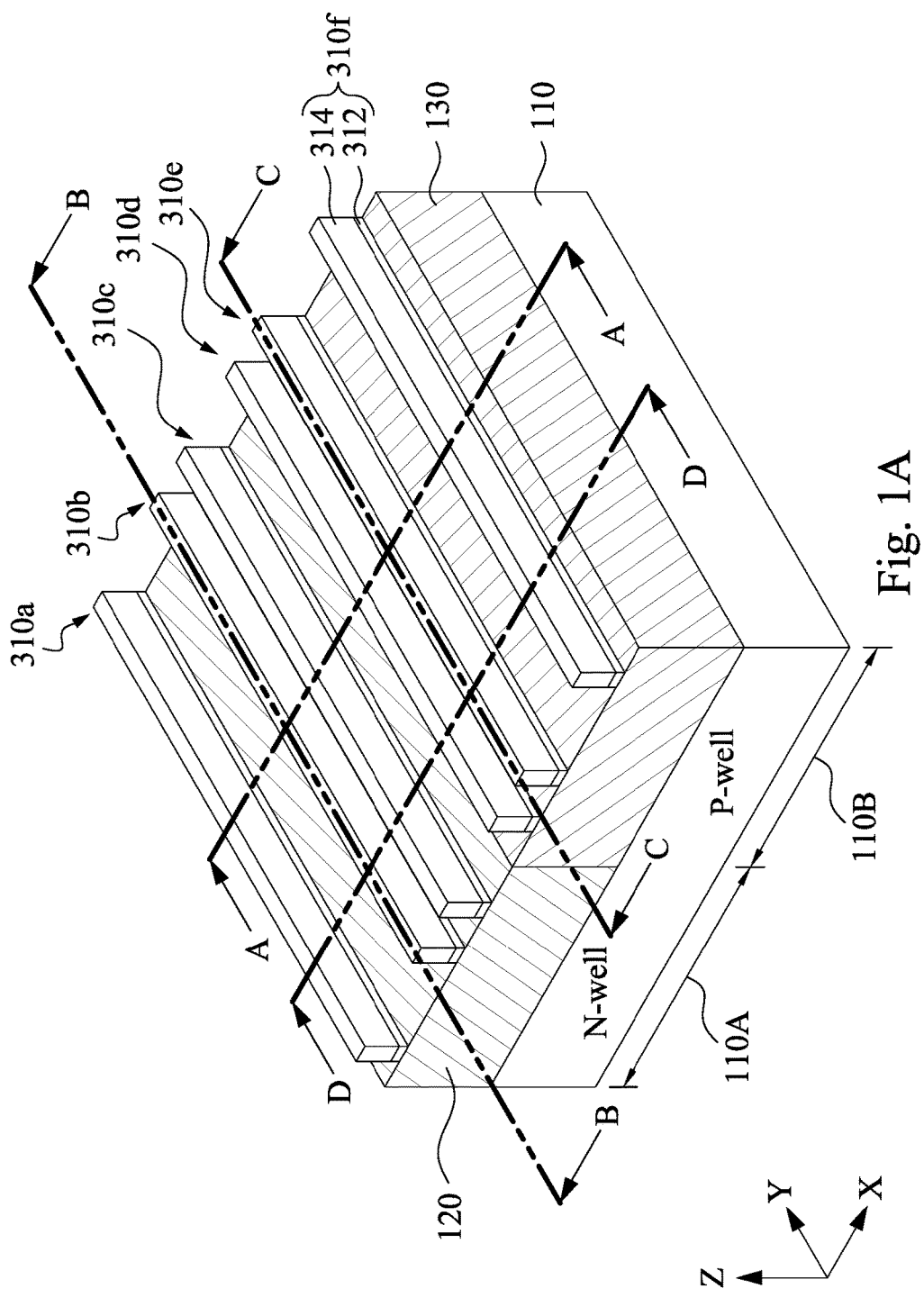

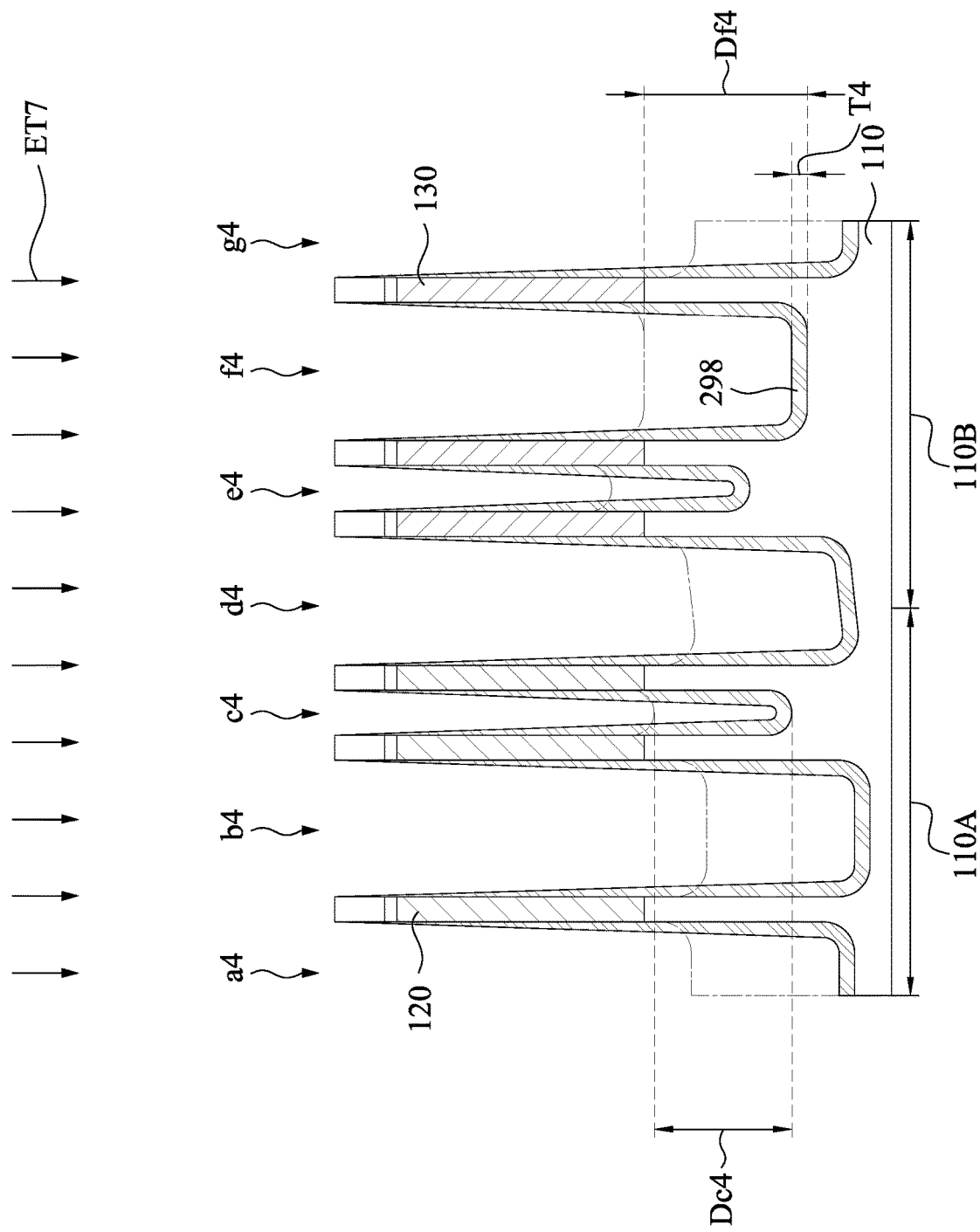

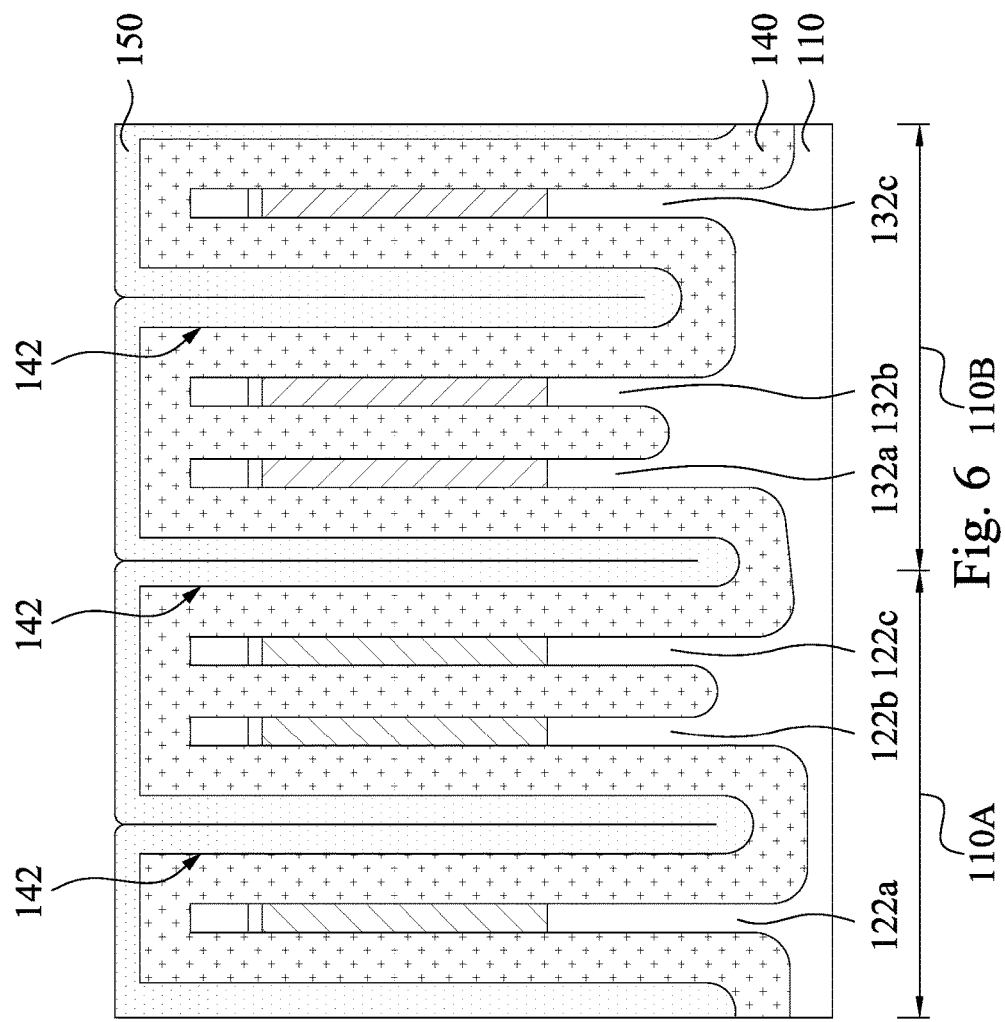

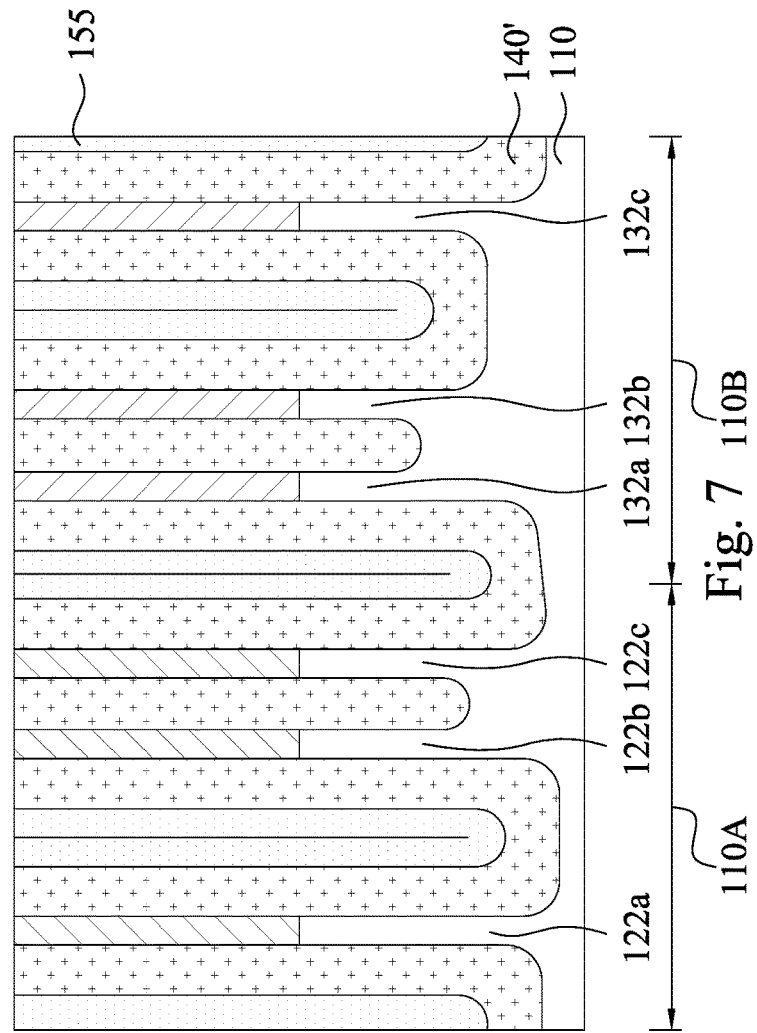

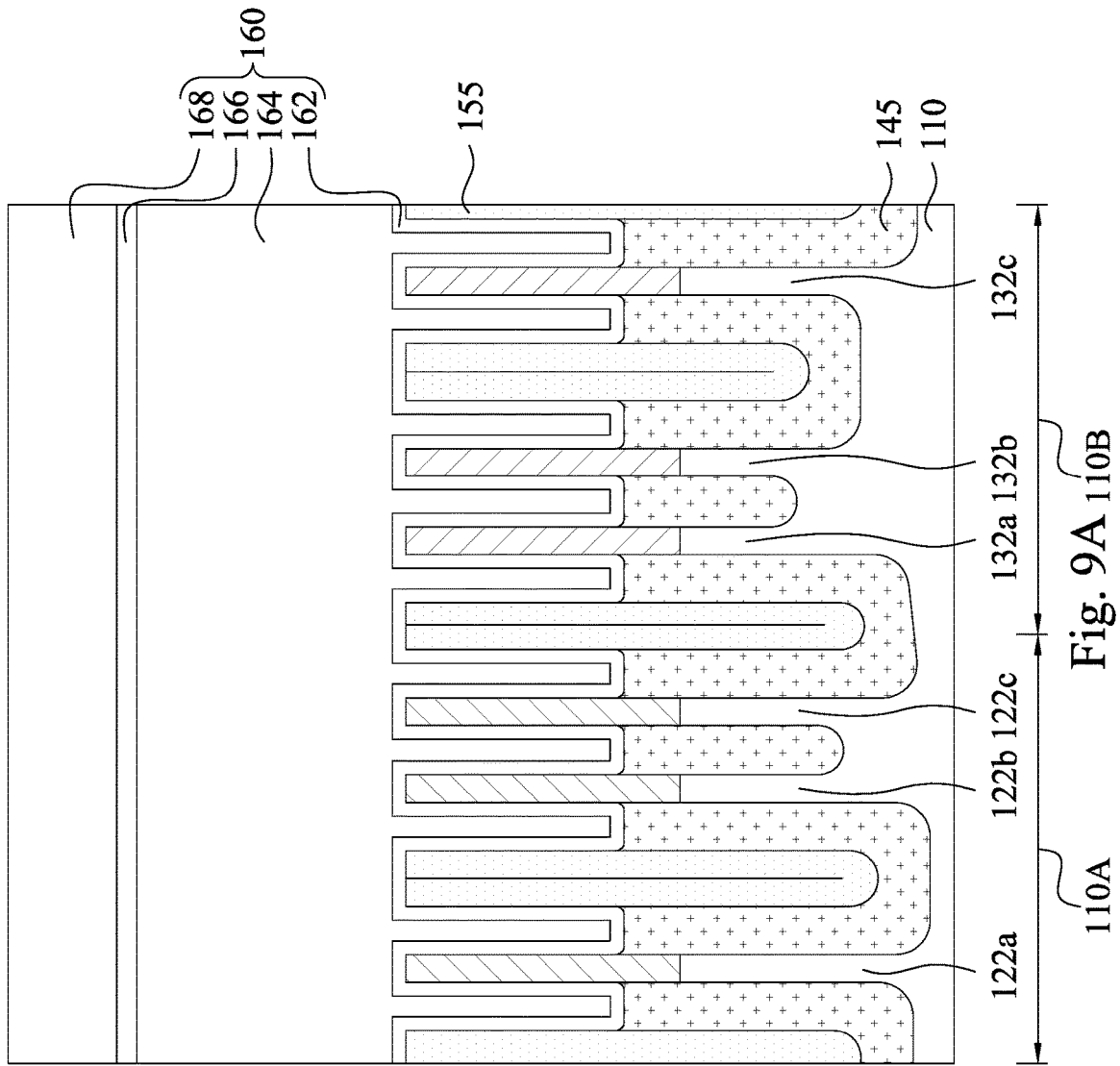

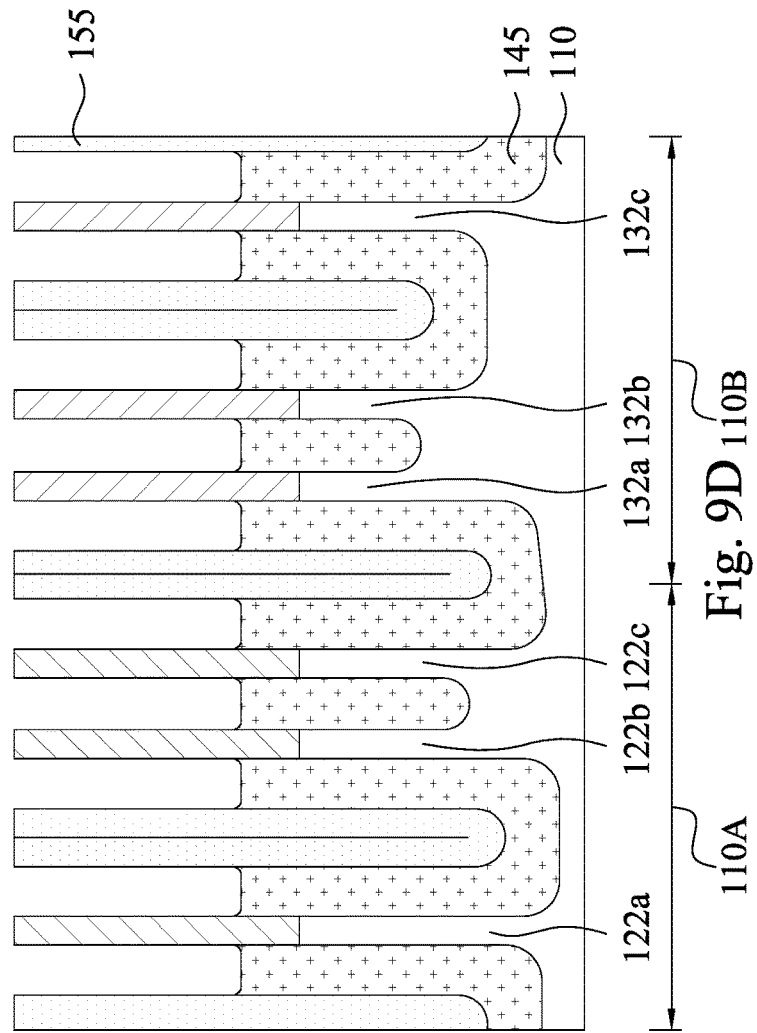

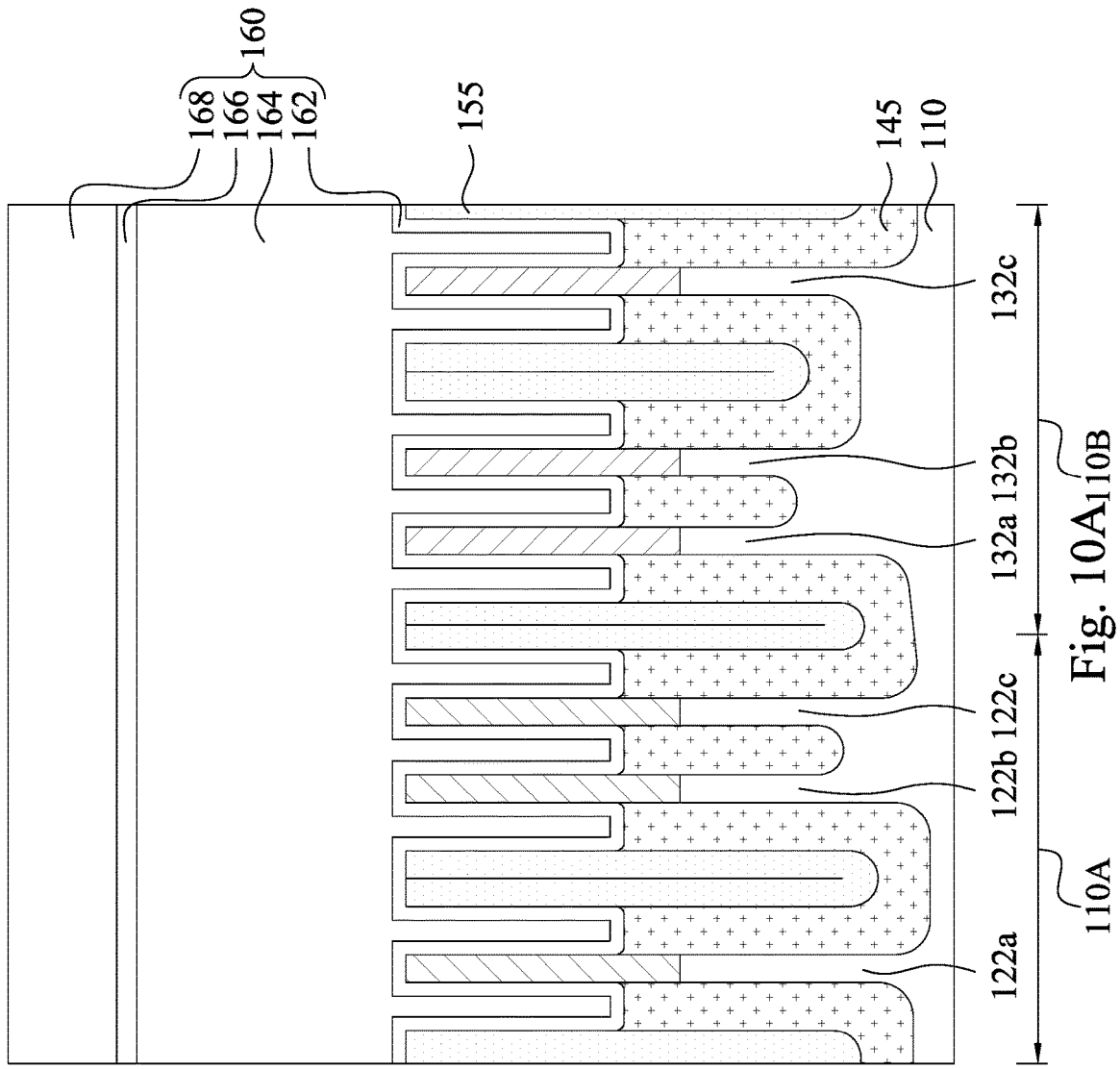

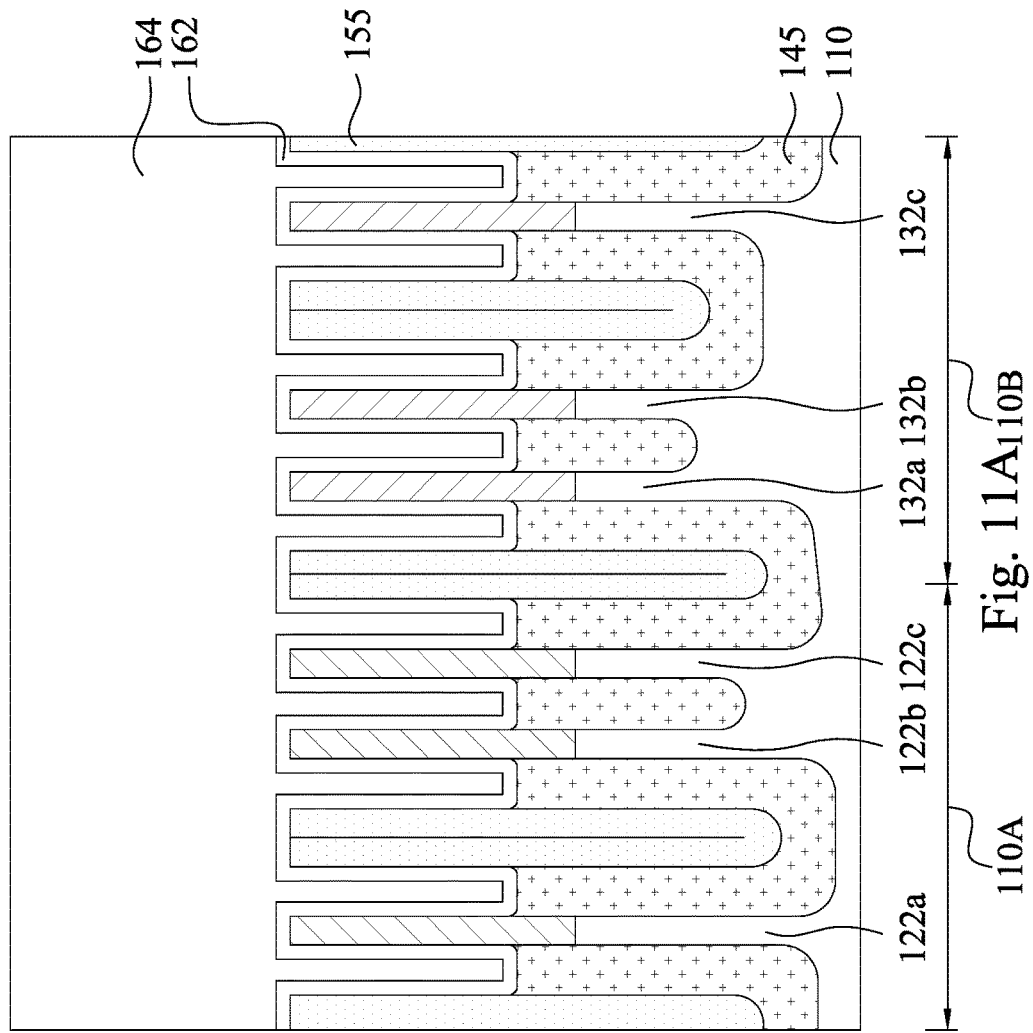

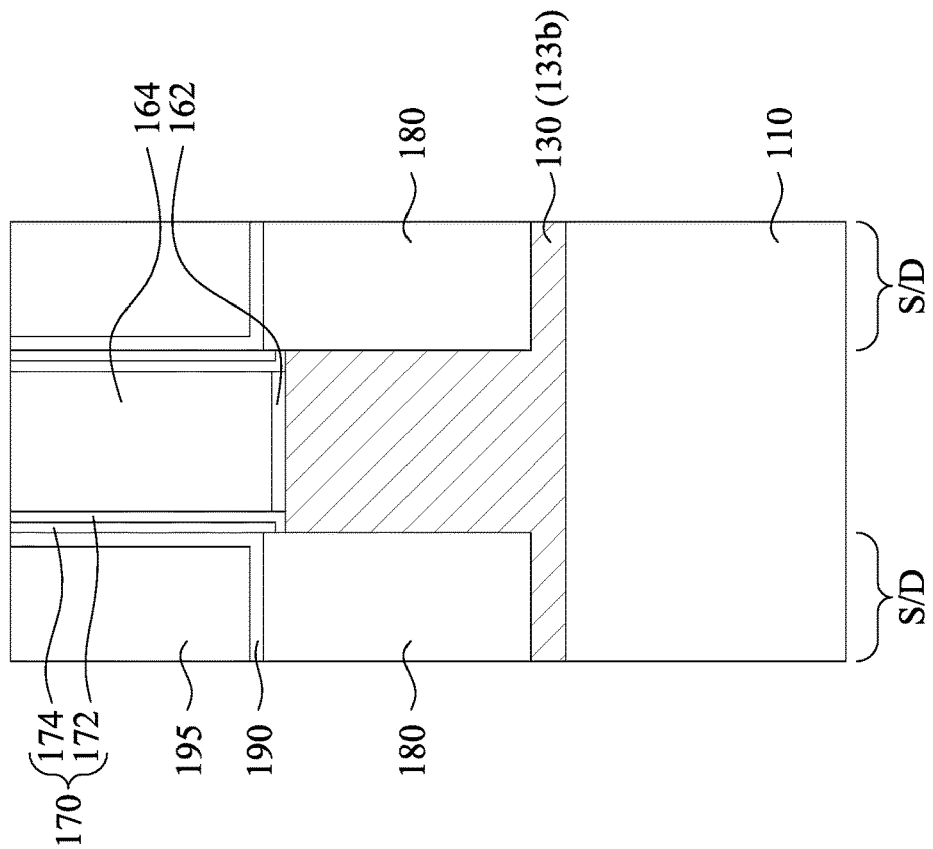
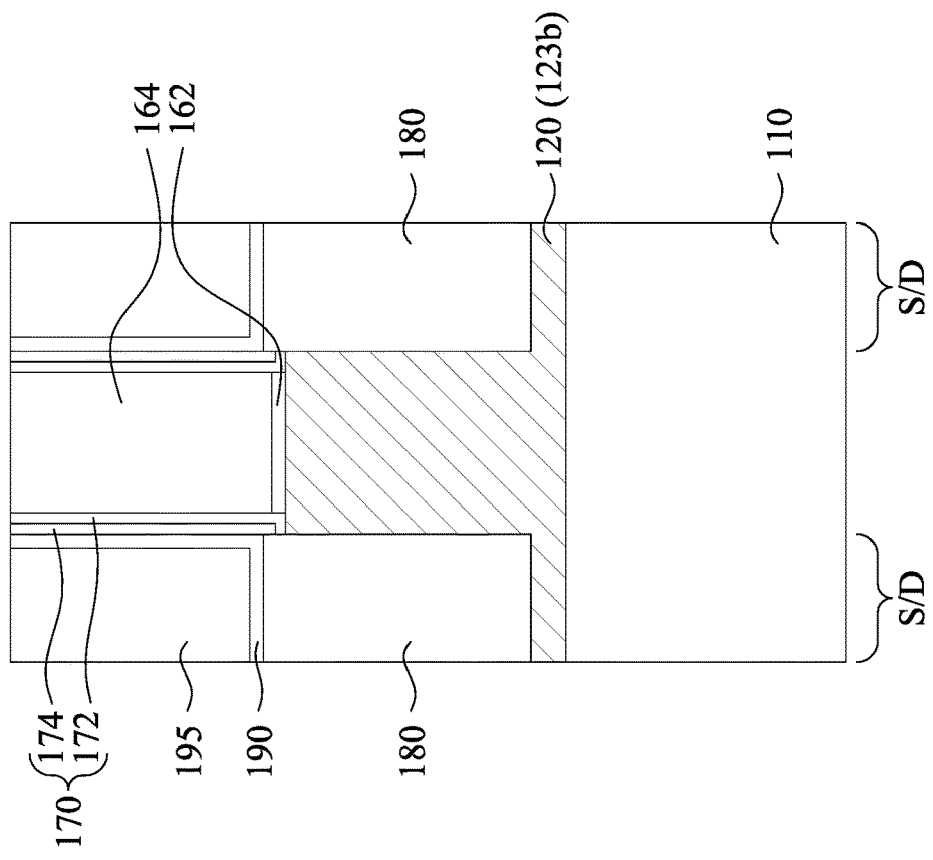

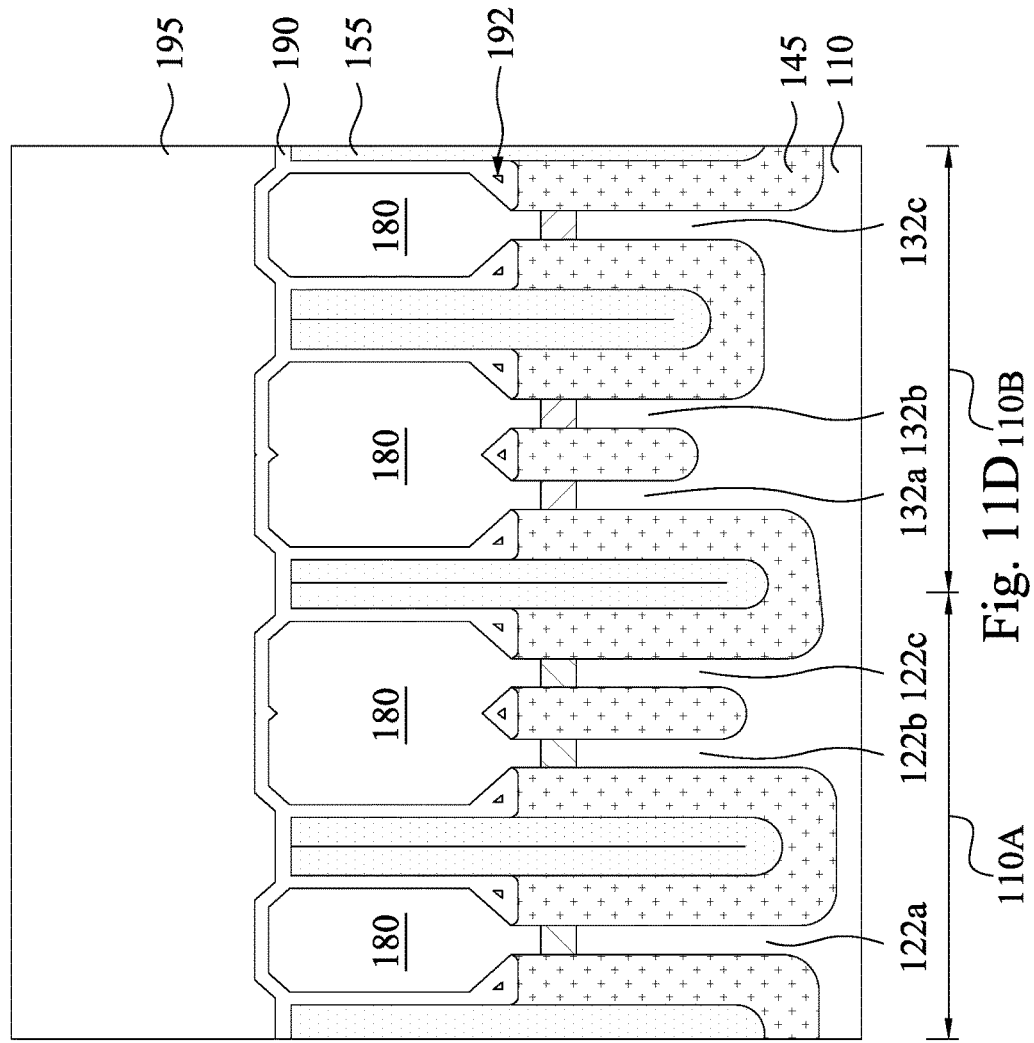

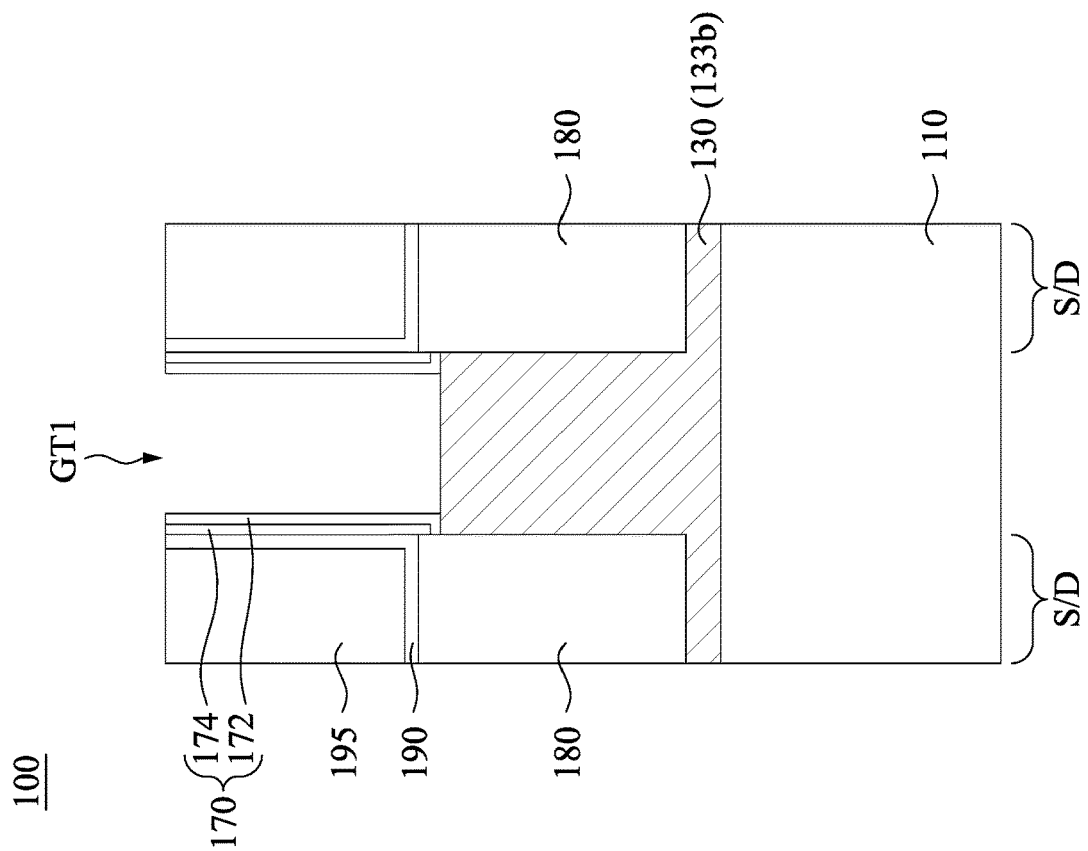

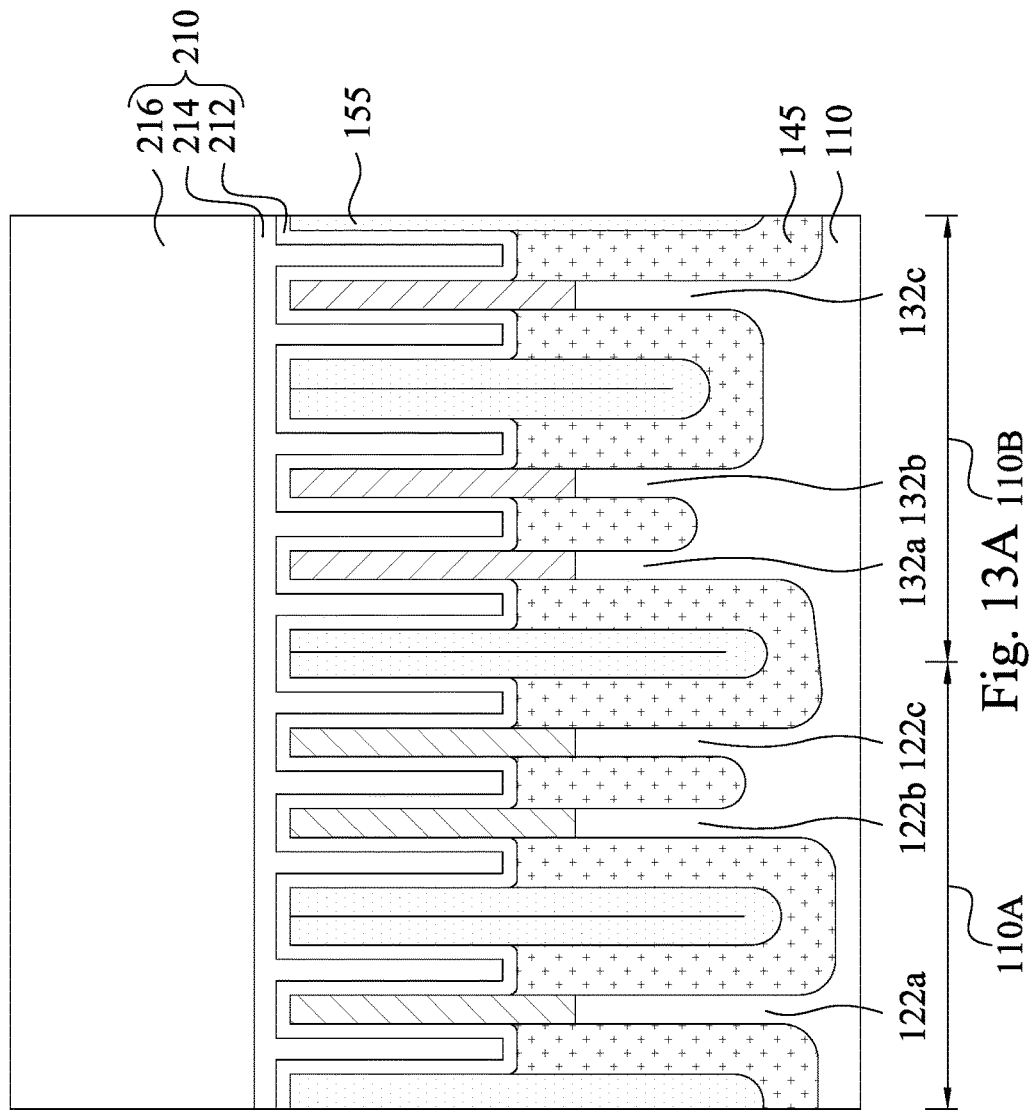

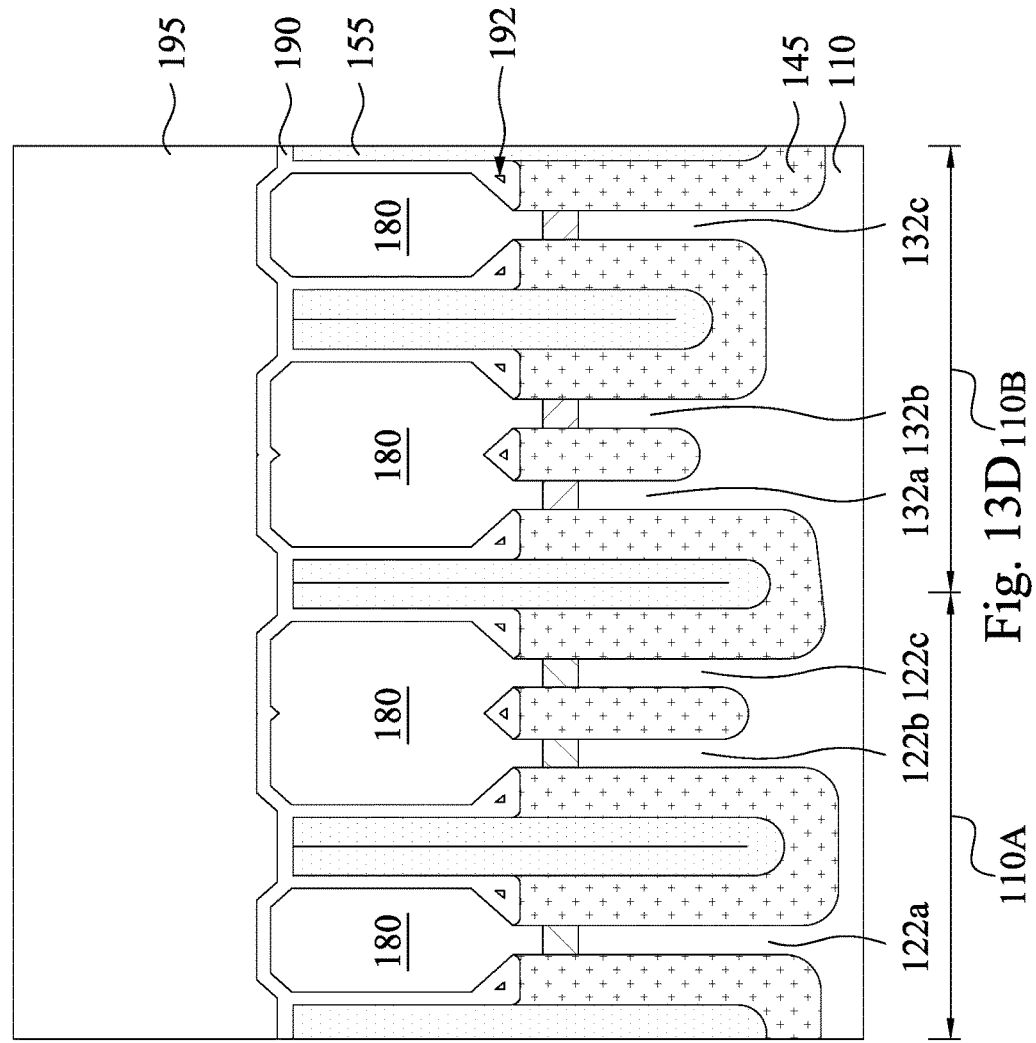

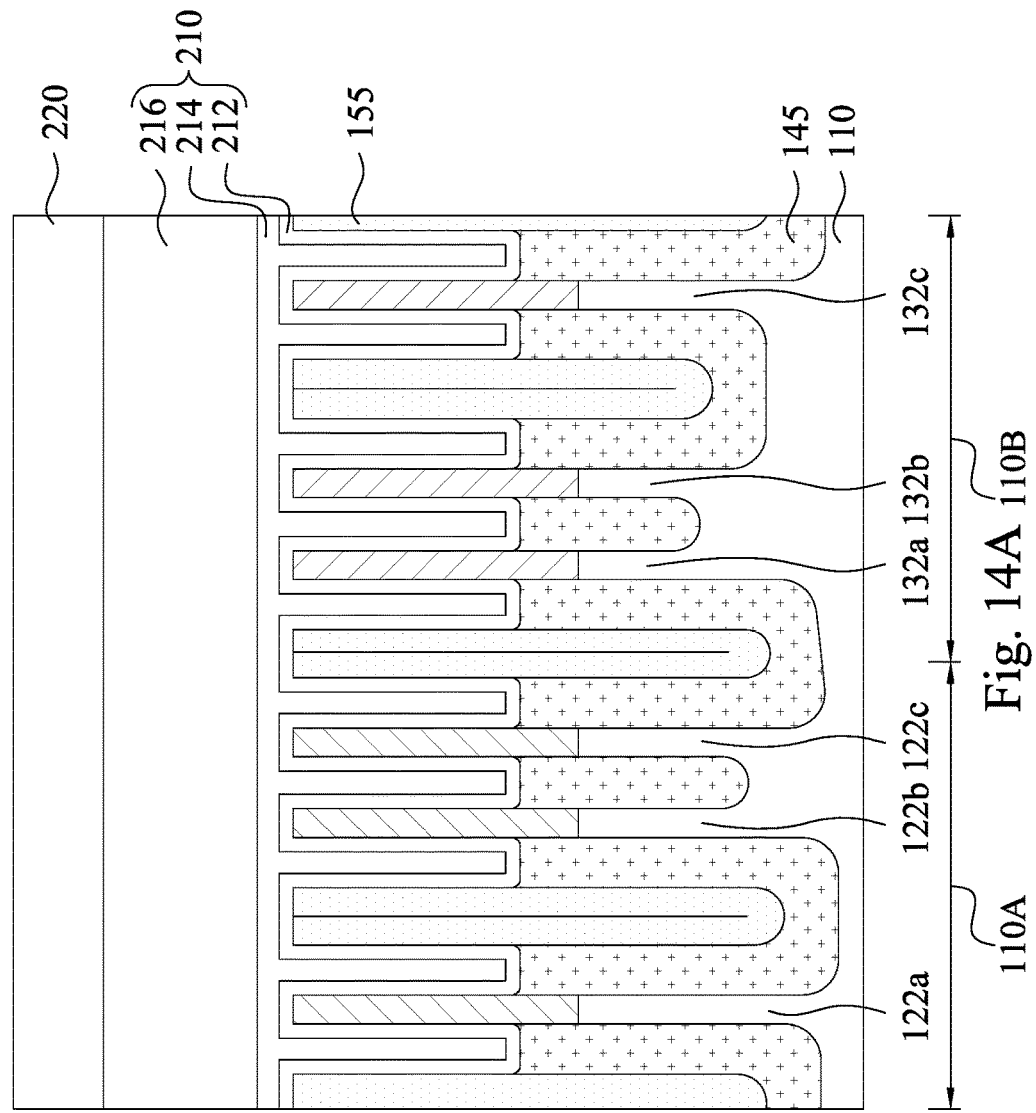

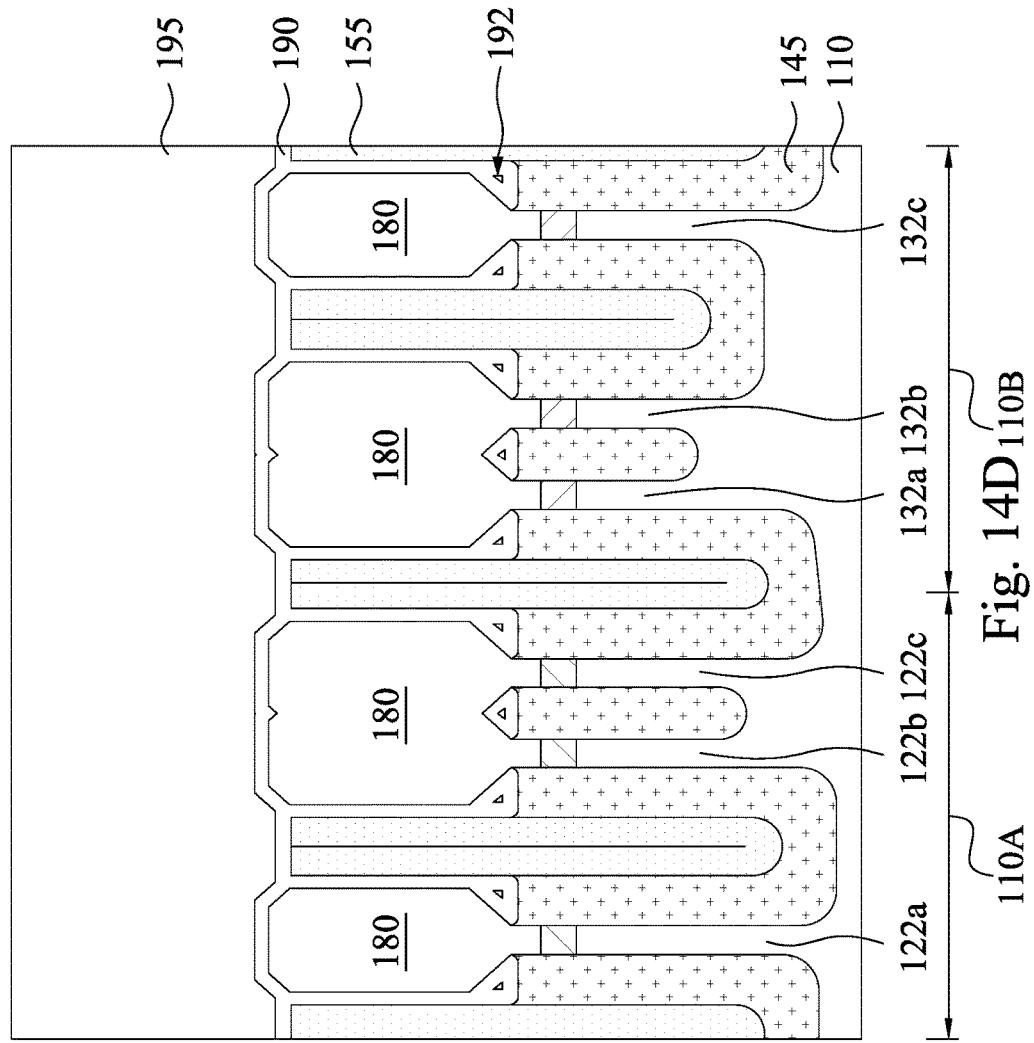

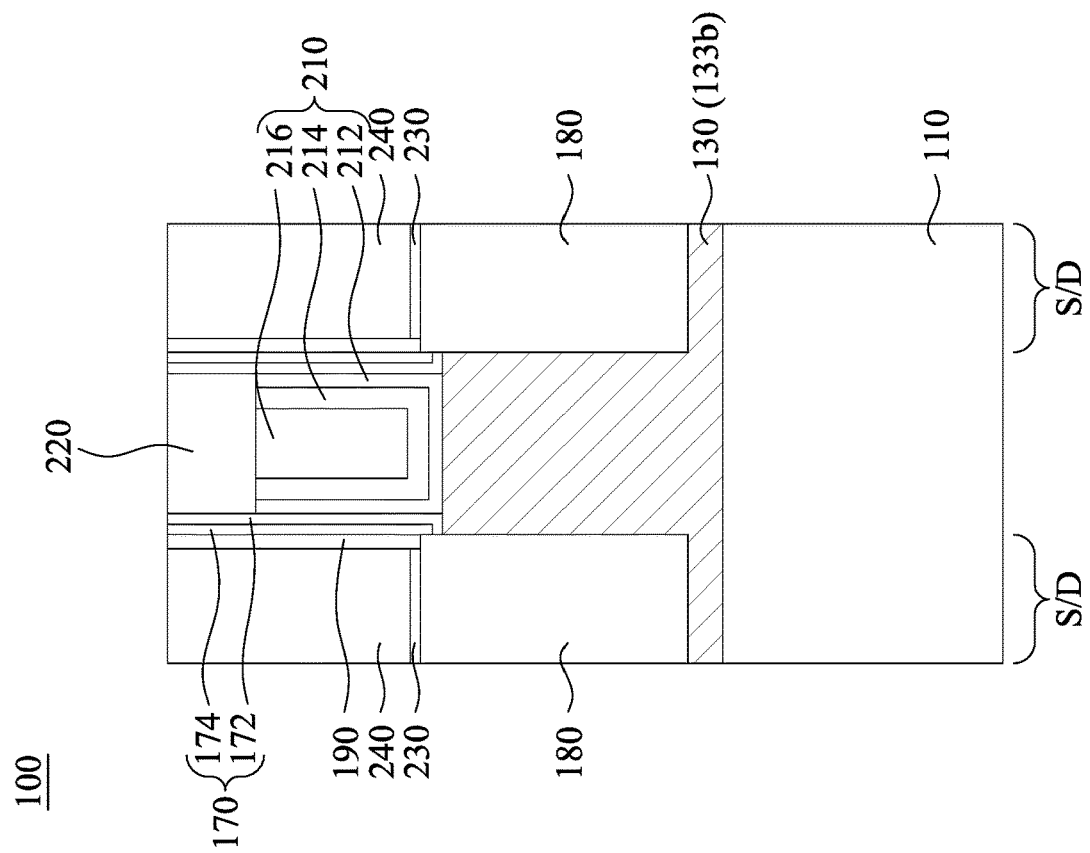
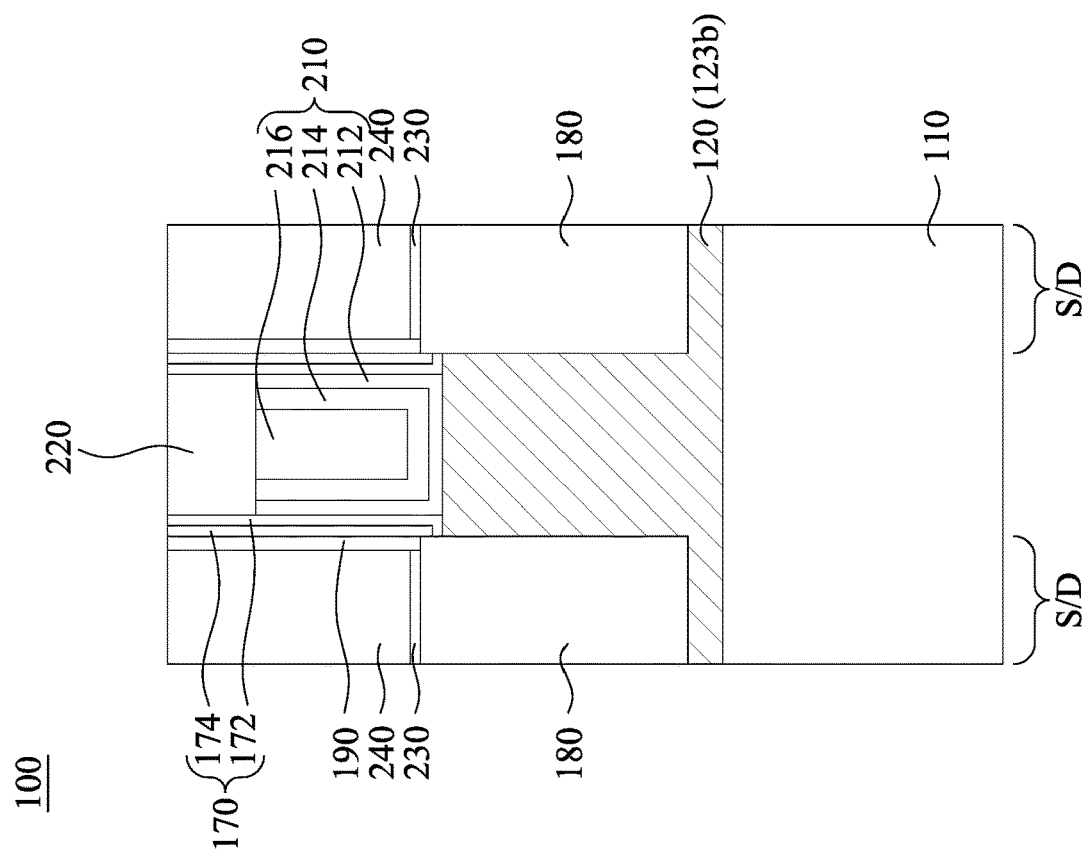
Fig. 15C
Fig. 15B

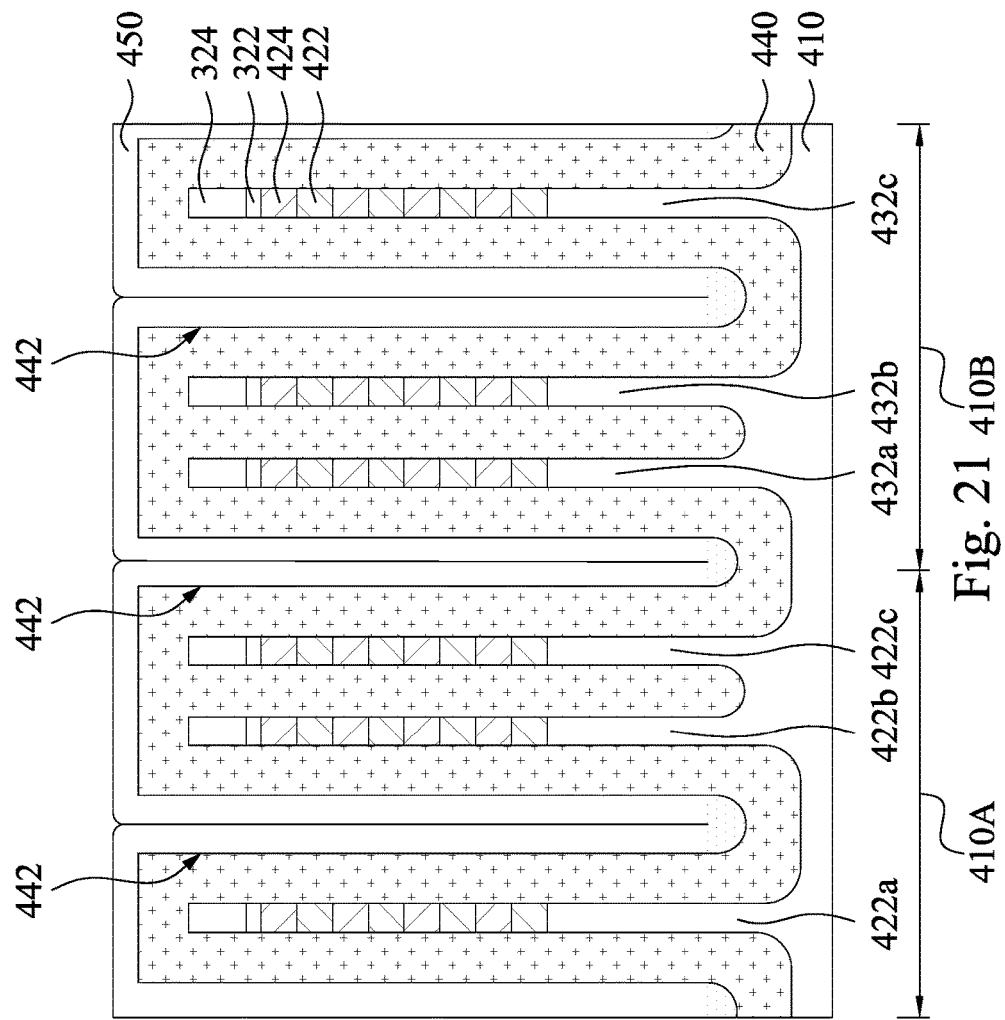

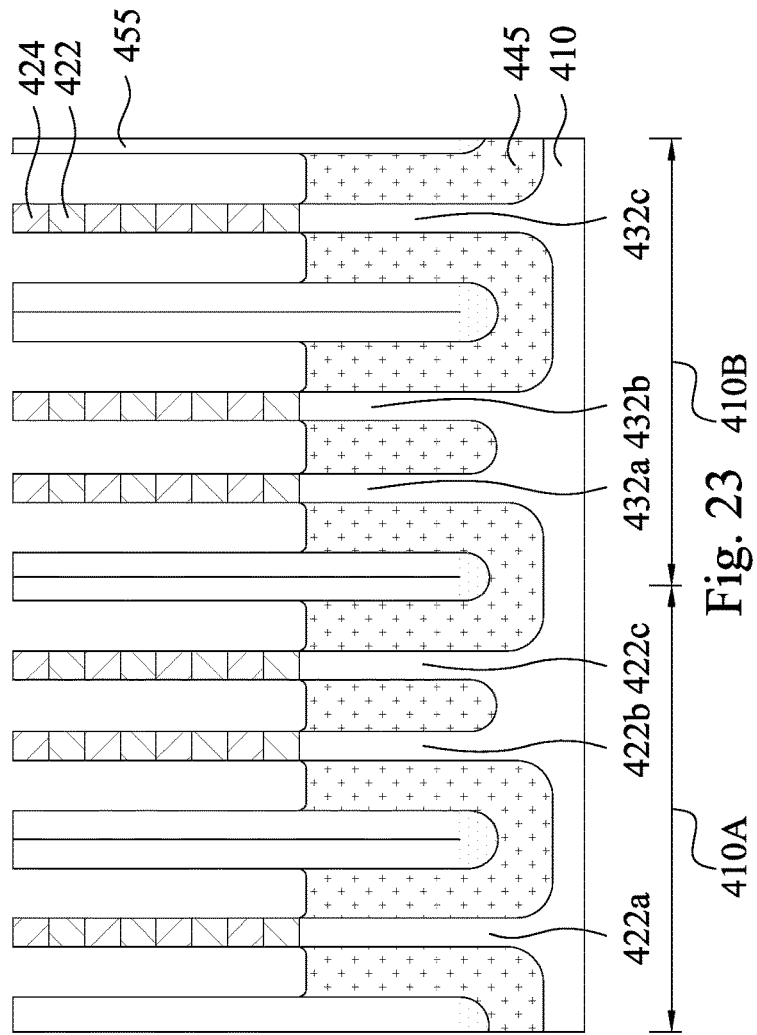

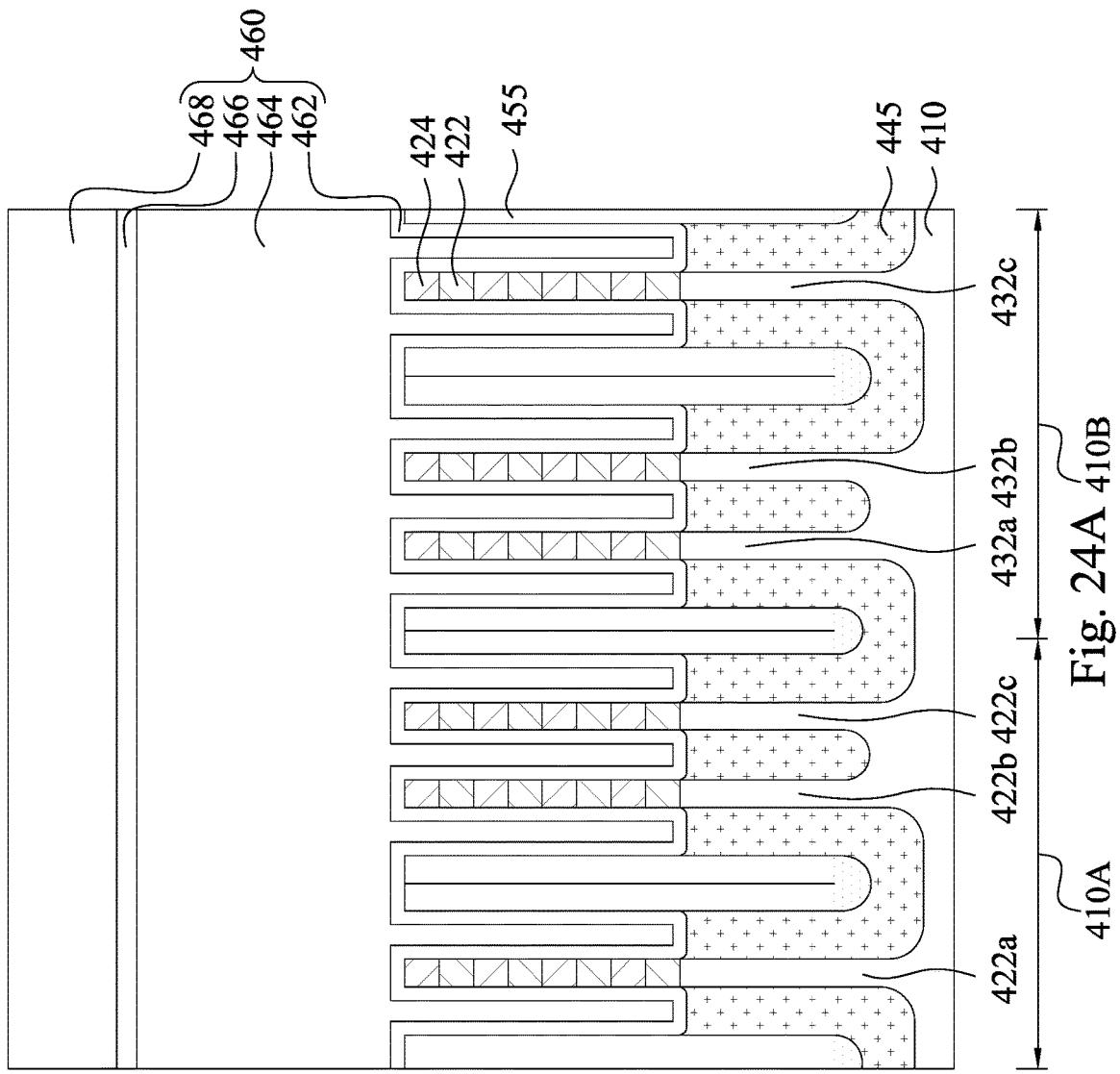

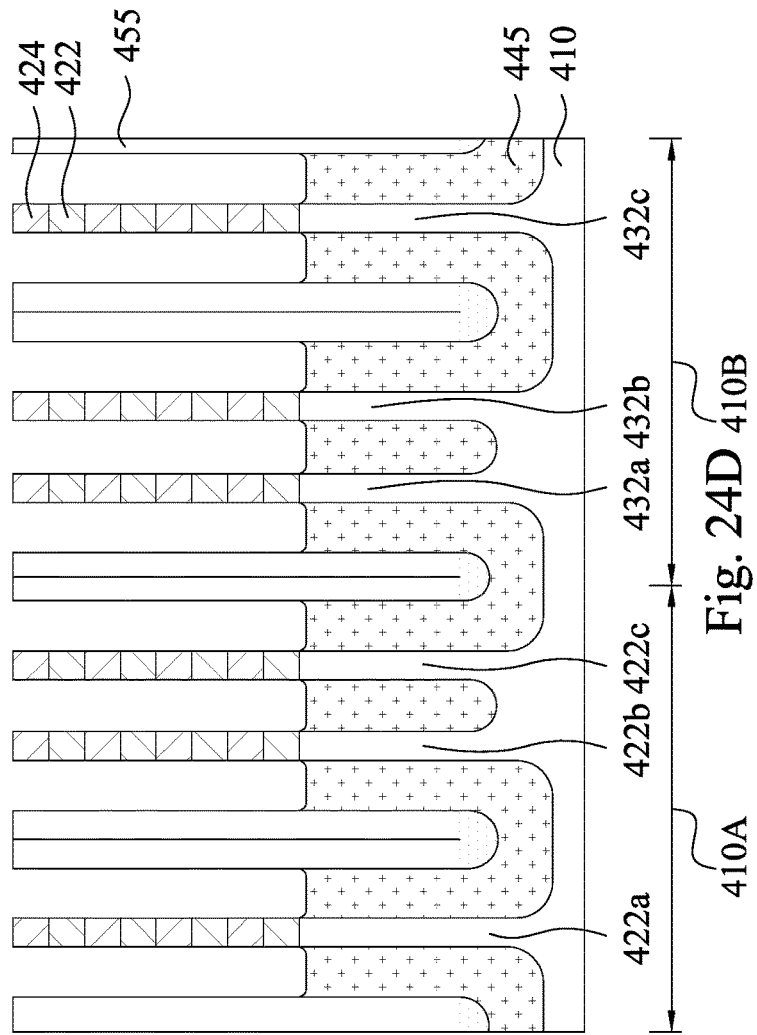

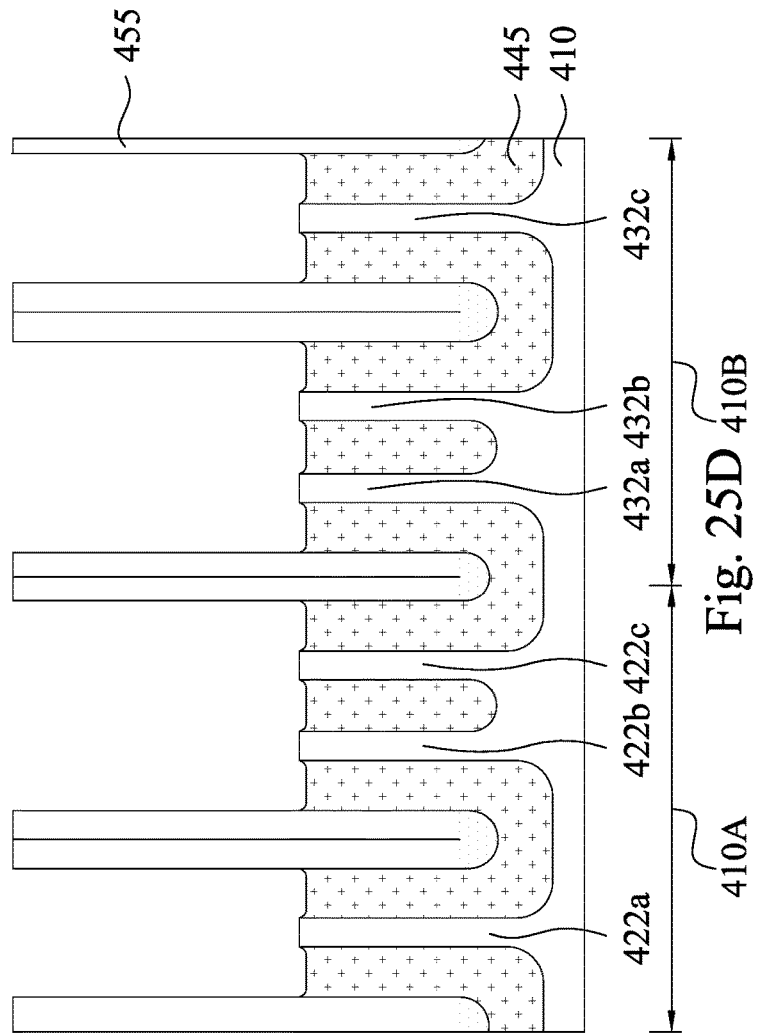

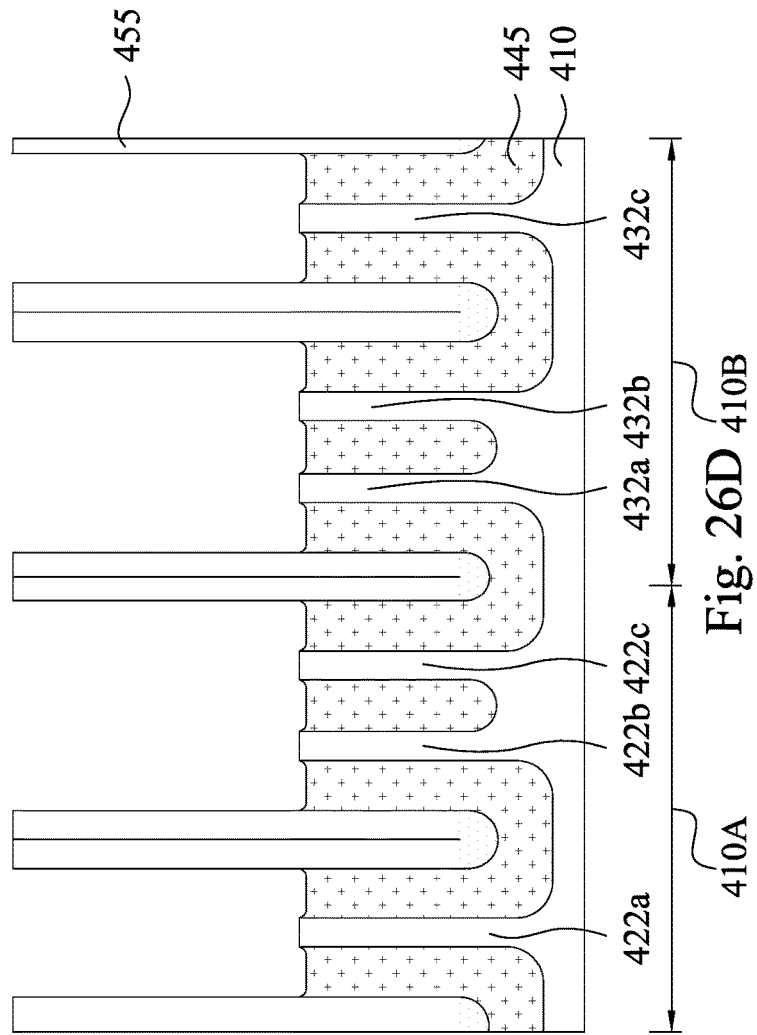

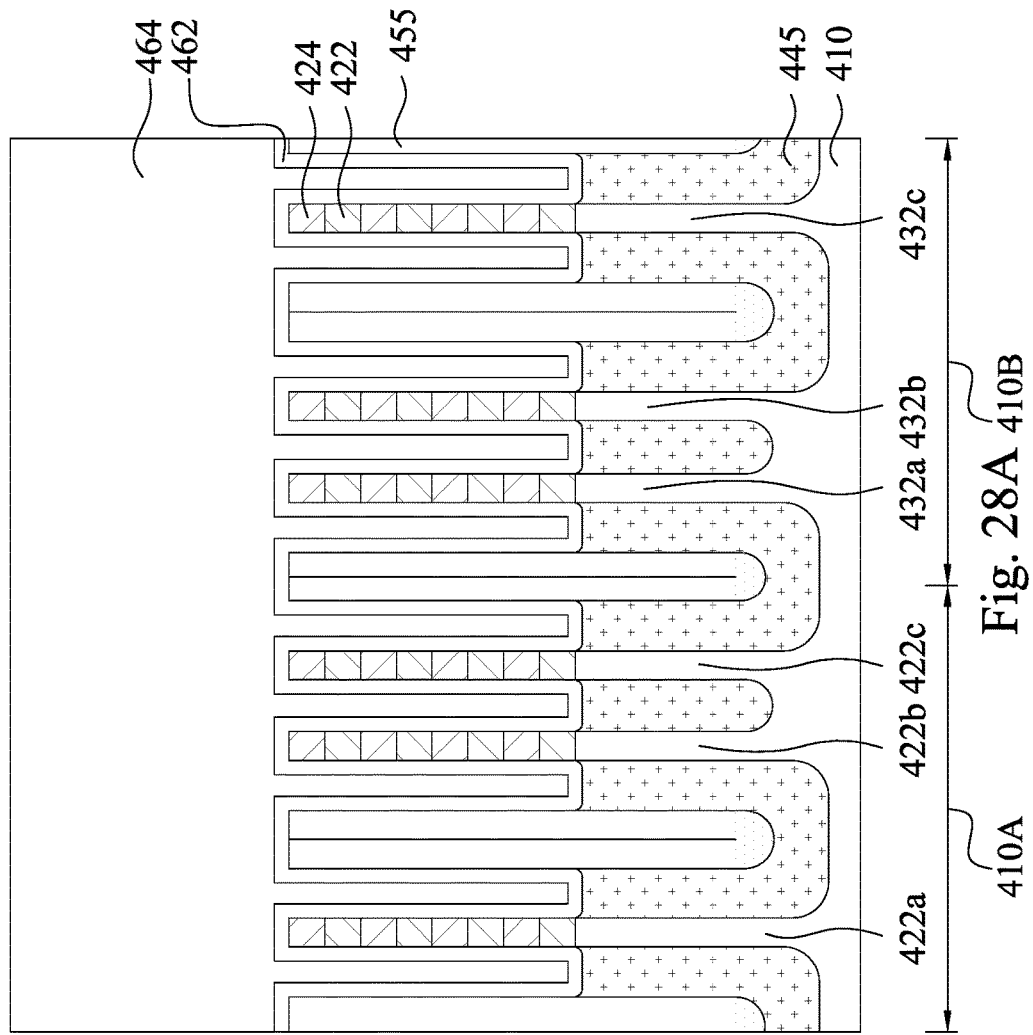

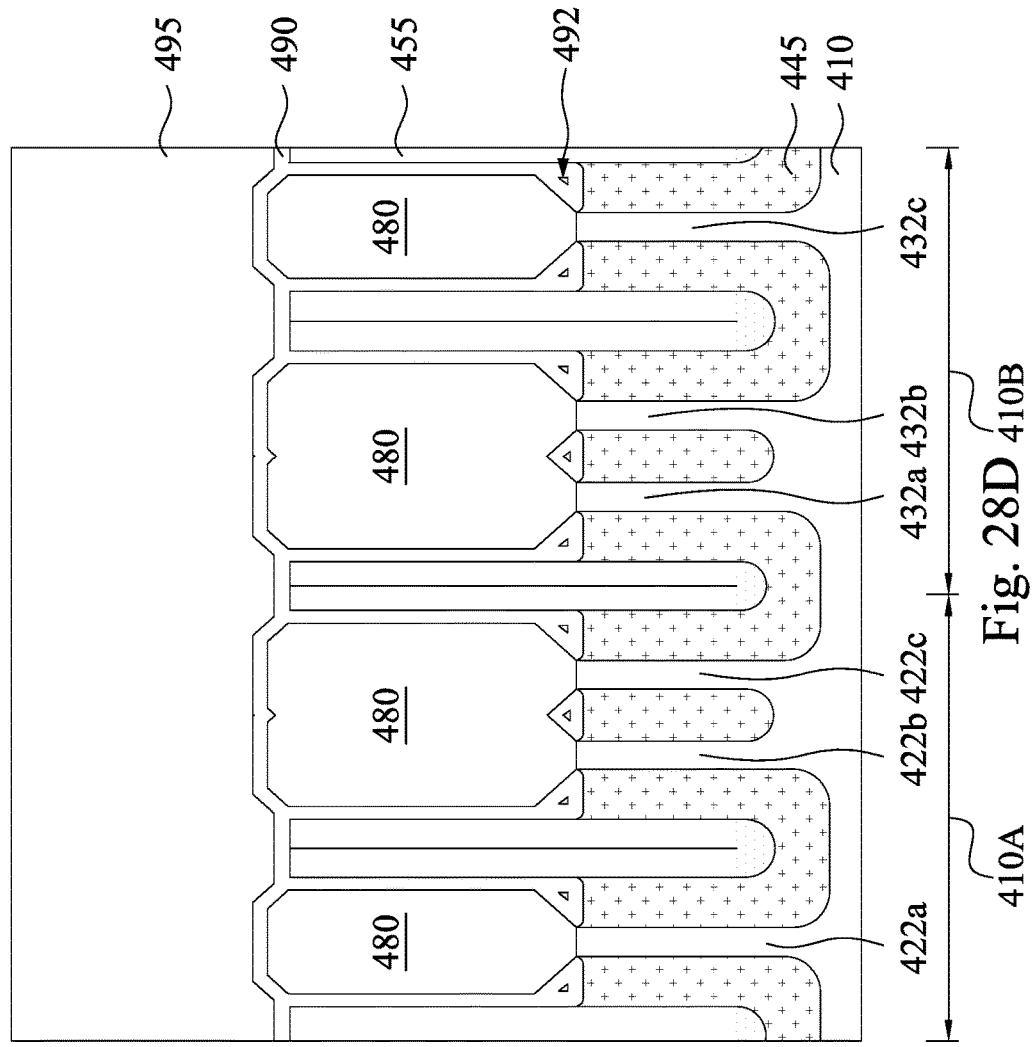

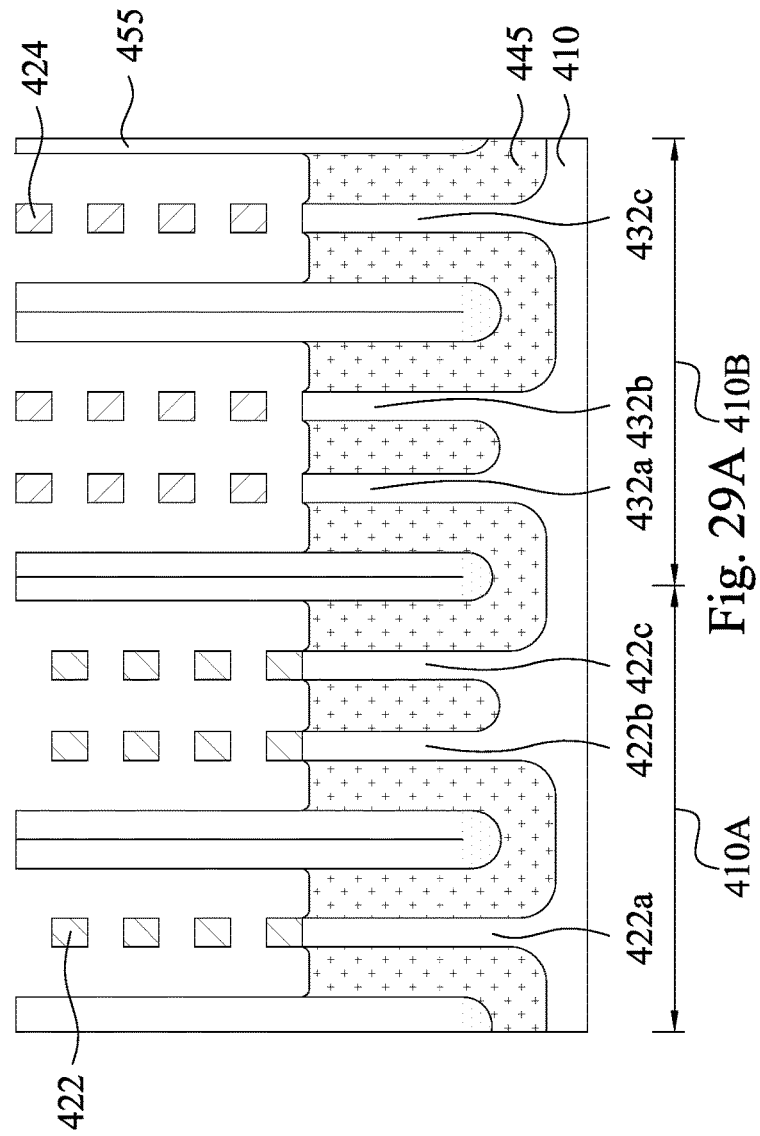

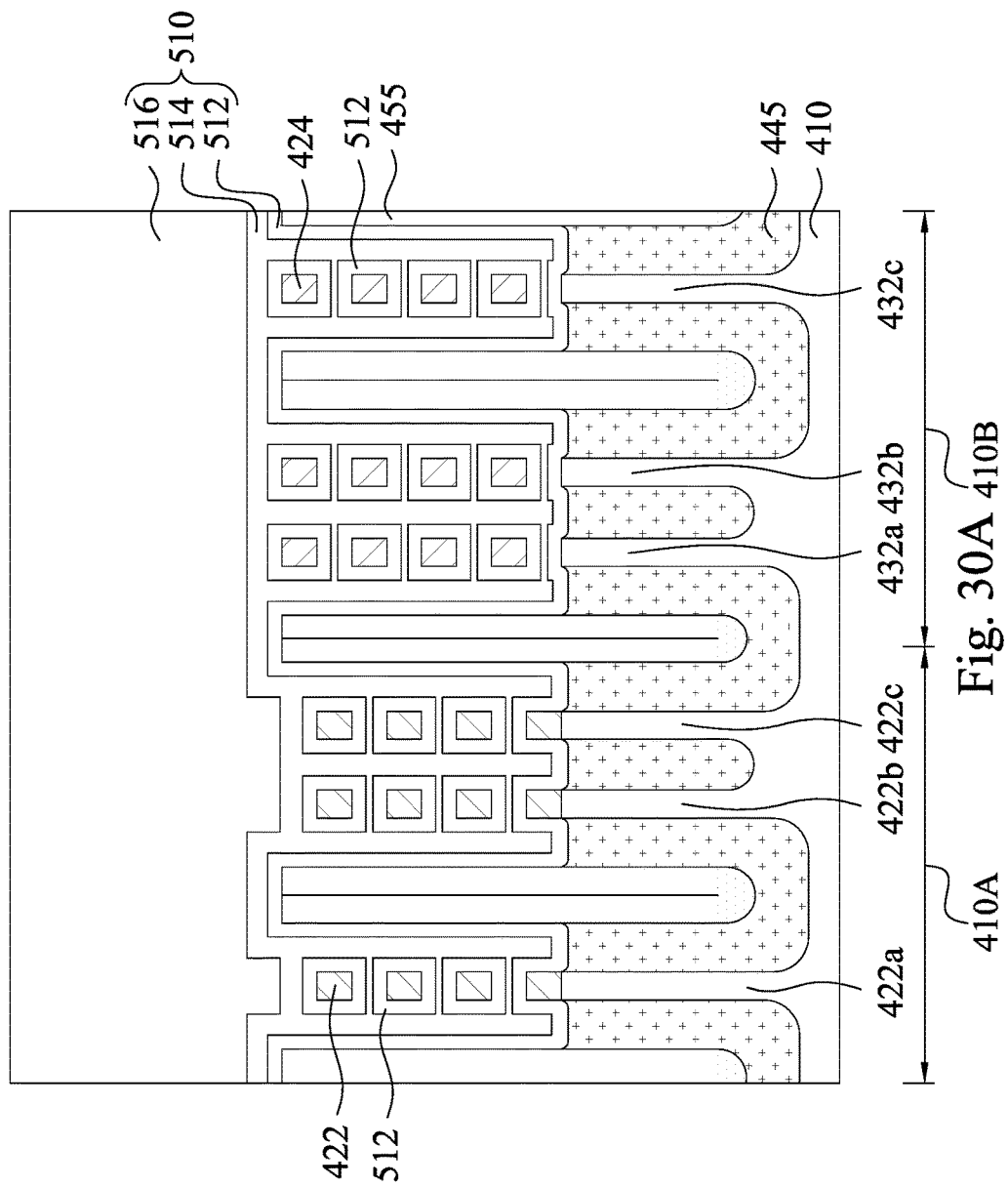

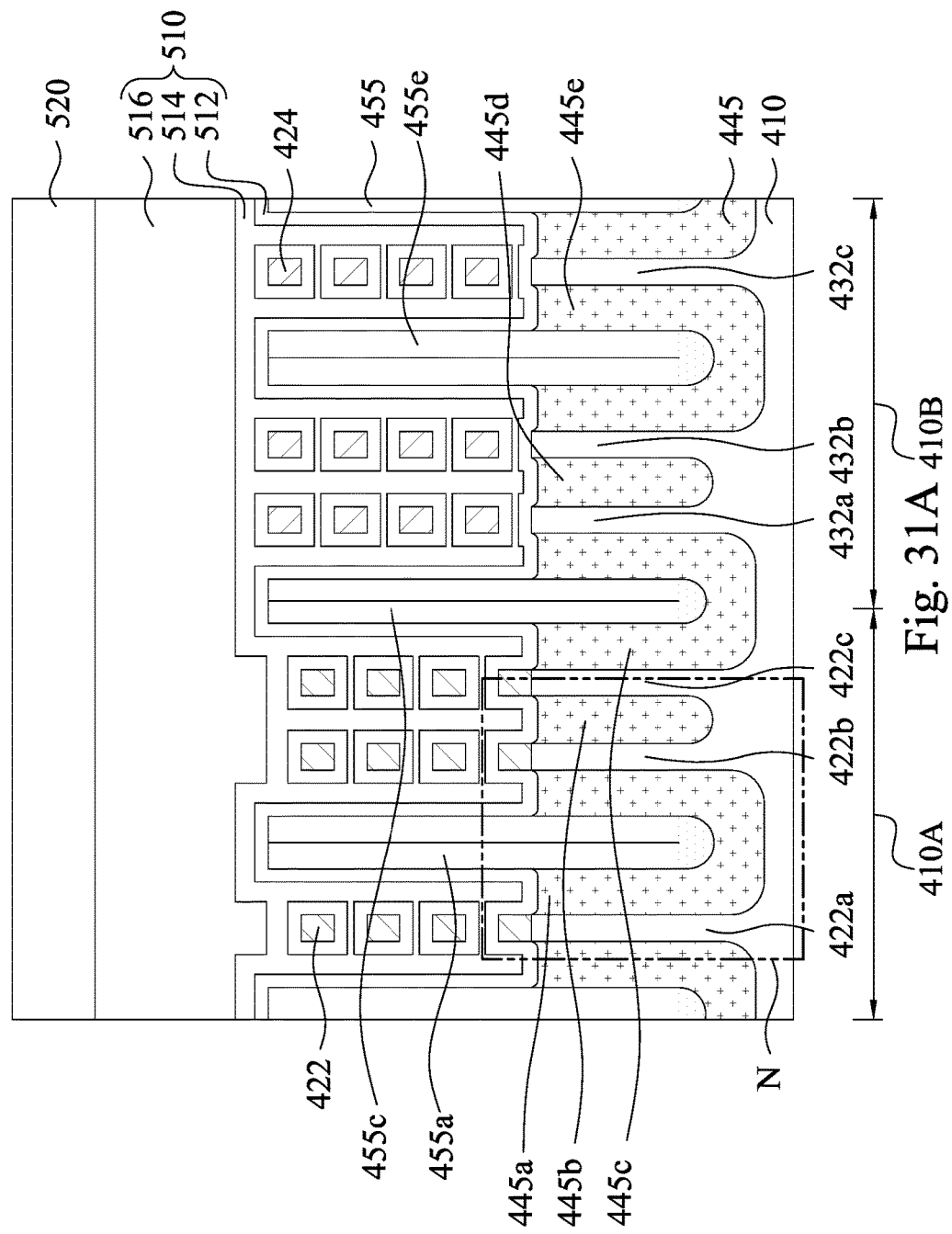

ETCH PROFILE CONTROL OF ISOLATION TRENCH

PRIORITY CLAIM AND CROSS-REFERENCE

This application claims priority to U.S. Provisional Application Ser. No. 63/163,232, filed Mar. 19, 2021, which is herein incorporated by reference.

BACKGROUND

Transistors are components of modern integrated circuits. To satisfy the requirements of increasingly faster speed, the drive currents of transistors are increasingly greater. To achieve this increase in performance, the gate lengths of transistors are constantly being scaled down. Scaling down the gate lengths, however, leads to undesirable effects such as "short-channel effects," in which the control of current flow by the gates is compromised. Among the short-channel effects are the Drain-Induced Barrier Lowering (DIBL) and the degradation of sub-threshold slope, both of which resulting in the degradation in the performance of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-15D illustrate perspective views and cross-sectional views of intermediate stages in the formation of an integrated circuit structure in accordance with some embodiments of the present disclosure.

FIGS. 16A-31D illustrate perspective views and cross-sectional views of intermediate stages in the formation of an integrated circuit structure in accordance with some embodiments of the present disclosure.

DETAILED DESCRIPTION

Figure 1B:
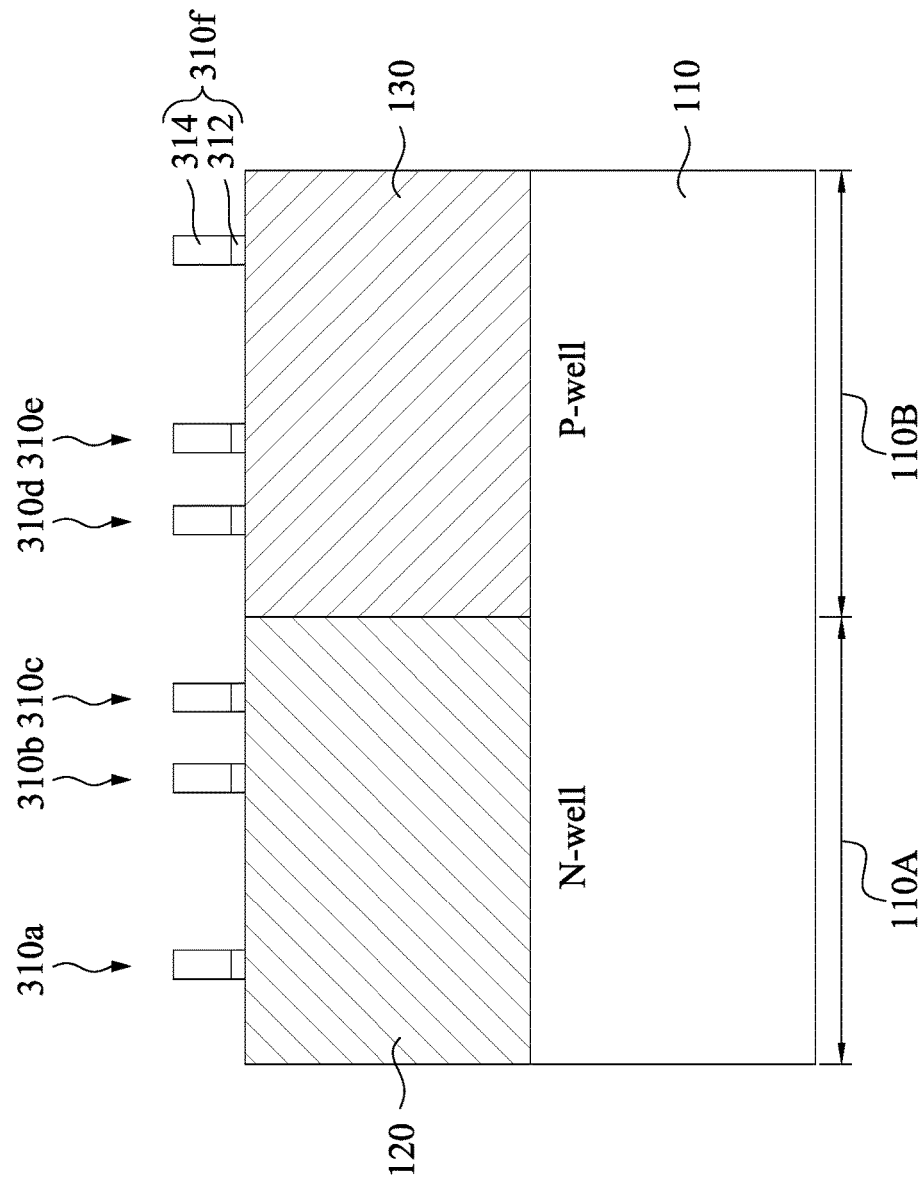

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the present disclosure are related to integrated circuit structures and methods of forming the same. More particularly, some embodiments of the present disclosure are related to semiconductor devices including isolation structures having convex bottom surfaces and straight sidewalls at the bottom of the isolation structures. The improved shape of isolation structures improves the current leakage problem of the source/drain epitaxial structures.

FIGS. 1A-15D illustrate perspective views and cross-sectional views of intermediate stages in the formation of an integrated circuit structure (or a semiconductor device) 100 in accordance with some embodiments of the present disclosure. In addition to the integrated circuit structure, FIG. 1A depicts X-axis, Y-axis, and Z-axis directions. The formed transistors (integrated circuit structure) may include a p-type transistor (such as a p-type Fin FET) and/or an n-type transistor (such as an n-type Fin FET) in accordance with some exemplary embodiments. Throughout the various views and illustrative embodiments, like reference numbers are used to designate like elements. It is understood that additional operations can be provided before, during, and after the processes shown by FIGS. 1A-15D, and some of the operations described below can be replaced or eliminated, for additional embodiments of the method. The order of the operations/processes may be interchangeable.

FIG. 1A is a perspective view of some embodiments of the integrated circuit structure 100 at intermediate stages in accordance with some embodiments of the present disclosure. FIGS. 1B, 2A-9A, 10A, 11A, 12A, 13A, 14A, and 15A are cross-sectional views of some embodiments of the integrated circuit structure 100 at intermediate stages along a first cut (e.g., cut A-A in FIG. 1A). FIGS. 9B, 10B, 11B, 12B, 13B, 14B, and 15B are cross-sectional views of some embodiments of the integrated circuit structure 100 at intermediate stages along a second cut (e.g., cut B-B in FIG. 1A). FIGS. 9C, 10C, 11C, 12C, 13C, 14C, and 15C are cross-sectional views of some embodiments of the integrated circuit structure 100 at intermediate stages along a third cut (e.g., cut C-C in FIG. 1A). FIGS. 9D, 10D, 11D, 12D, 13D, 14D, and 15D are cross-sectional views of some embodiments of the integrated circuit structure 100 at intermediate stages along a fourth cut (e.g., cut D-D in FIG. 1A).

Reference is made to FIGS. 1A and 1B. A substrate 110 is illustrated. In some embodiments, the substrate 110 includes silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or combinations thereof) or other appropriate semiconductor materials. In some embodiments, the substrate 110 includes a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The substrate 110 includes a P-type device region 110A and an N-type device region 110B, and an N-type well N-well and a P-type well P-well are respectively in the P-type device region 110A and the N-type device region 110B. The N-type well N-well and the P-type well P-well may be formed by implanting dopants of appropriate types into the substrate 110. For example, the N-type well N-well may be formed by implanting N-type dopants, such as phosphorus, antimony, arsenic, and/or the like, and the P-type well P-well may be formed by implanting P-type dopants, such as boron, gallium, indium, and/or the like.

Semiconductor layers 120 and 130 are formed over the substrate 110. As shown in FIGS. 1A and 1B, the semiconductor layer 120 is formed on the N-type well N-well and the P-type device region 110A, and the semiconductor layer 130 is formed on the P-type well P-well and the N-type device region 110B. The semiconductor layer 120 may be formed from, for example, silicon, germanium, silicon germanium, germanium boron, silicon germanium boron, a III-V material (such as indium antimonide, gallium antimonide, indium gallium antimonide), combinations thereof, or the like. The semiconductor layer 130 may be formed from, for example, silicon, silicon phosphide, silicon carbide, silicon phosphide carbide, germanium, germanium phosphide, a III-V material (such as indium phosphide, aluminium arsenide, gallium arsenide, indium arsenide, gallium indium arsenide and aluminium indium arsenide), combinations thereof, or the like. In some embodiments, the semiconductor layer 120 is a silicon germanium layer and the semiconductor layer 130 is a silicon layer, e.g., a substantially pure silicon layer. Each of the semiconductor layers 120 and 130 may be formed by using an epitaxy process, such as a metal-organic (MO) CVD process, a liquid phase epitaxy (LPE) process, a vapor phase epitaxy (VPE) process, a molecular beam epitaxy (MBE) process, a selective epitaxial growth (SEG) process, combinations thereof, and/or another suitable process. Subsequently, the semiconductor layers 120 and 130 are doped with dopants of appropriate types and concentrations. For example, P-type dopants, such as boron, boron fluorine, silicon, germanium, carbon, zinc, cadmium, beryllium, magnesium, indium, combinations thereof, and/or the like, may be implanted into the semiconductor layer 120, and N-type dopants, such as phosphorus, arsenic, antimony, silicon, germanium, carbon, oxygen, sulfur, selenium, tellurium, combinations thereof, and/or the like, may be implanted into the semiconductor layer 130.

Mask patterns 310a-310f are formed over the semiconductor layers 120 and 130. Each of the mask patterns 310a-310f includes a mask layer 314 and a pad layer 312 between the mask layer 314 and the substrate 110. In some embodiments, the mask layer 314 is a nitride layer, and the pad layer 312 is an oxide layer. In some embodiments, the mask patterns 310a-310f have different pitches according to different layout designs. For example, a pitch between the mask patterns 310a and 310b is greater than a pitch between the mask patterns 310b and 310c, and/or a pitch between the mask patterns 310e and 310f is greater than a pitch between the mask patterns 310d and 310e. The pitch between the mask patterns 310a and 310b may be substantially the same as the pitch between the mask patterns 310e and 310f, and/or the pitch between the mask patterns 310b and 310c may be substantially the same as the pitch between the mask patterns 310d and 310e. Further, a pitch between the mask patterns 310c and 310d may be different from the pitch between the mask patterns 310a and 310b and the pitch between the mask patterns 310b and 310c. For example, the pitch between the mask patterns 310c and 310d is less than the pitch between the mask patterns 310a and 310b and greater than the pitch between the mask patterns 310b and 310c.

Figure 2A:
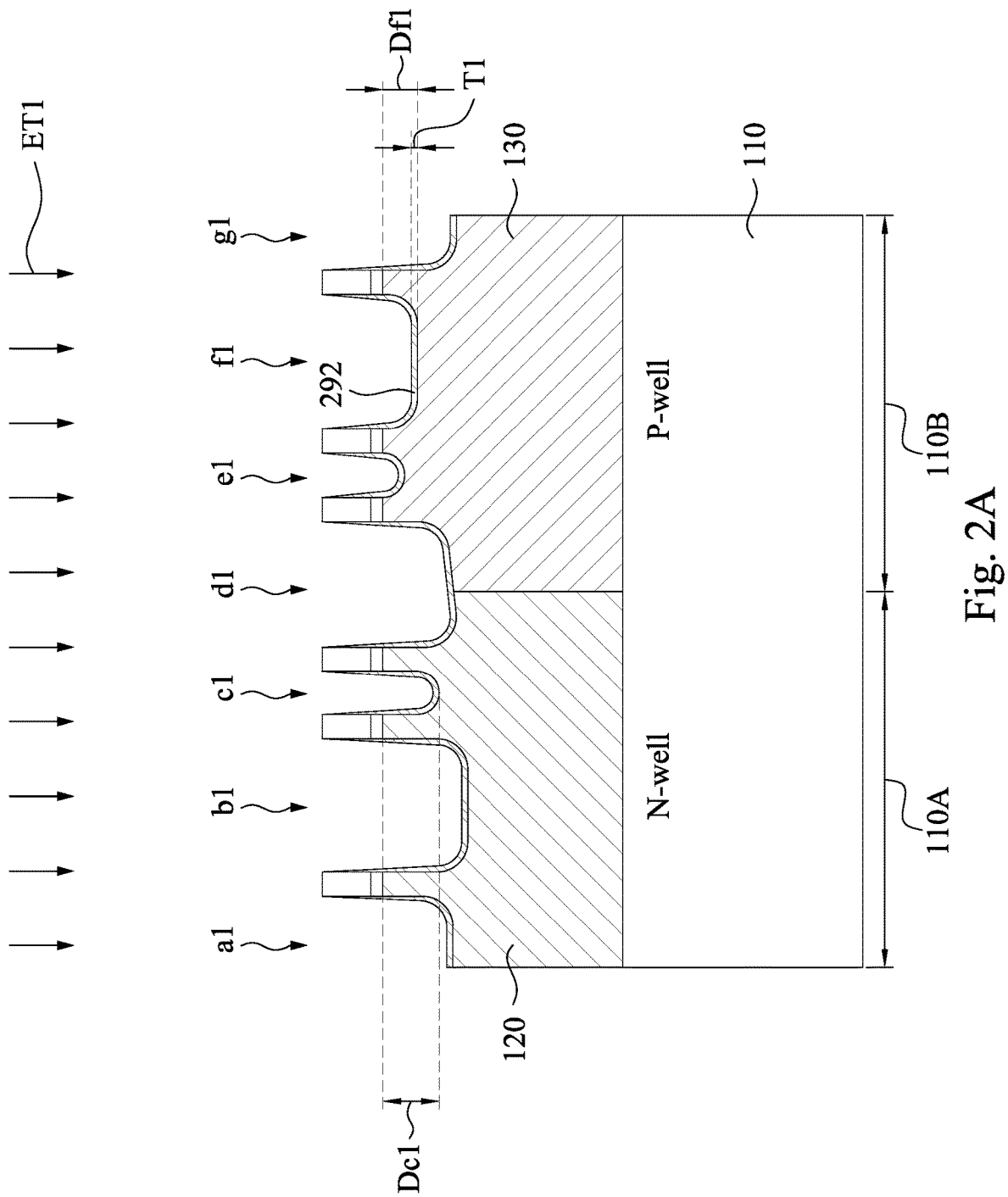

Reference is made to FIG. 2A. A first etching process ET1 is performed on the structure in FIGS. 1A and 1B. In some embodiments, the first etching process ET1 is at least one of a plasma etching process, a reactive ion etching (RIE) process, a wet etching process, or other applicable techniques. In some embodiments, the first etching process ET1 utilizes at least one of $CF_4$, $Cl_2$, $CHF_3$, or other applicable materials. For example, the first etching process ET1 uses a carbon-poor fluorine-based etchant gas (such as $CF_4$, $NF_3$, etc.) or another etchant gas, and can use a carbon-rich polymer-passivating gas (such as $CHF_3$, $CH_2F_2$, $CH_3F$, $C_4F_6$, $C_4F_8$, etc.) or another polymer gas, and a ratio of the etchant gas to the polymer-passivating gas is tuned to implement the first etching process ET1 and the following etching processes.

The first etching process ET1 etches the semiconductor layers 120 and 130 by using the mask patterns 310a-310f as etching masks. The first etching process ET1 forms trenches a1, b1, c1, d1, e1, f1, and g1 in the semiconductor layers 120 and/or 130. In some embodiments, since the pitch between the mask patterns 310b and 310c is smaller than the pitch between the mask patterns 310a and 310b, the trench c1 is shallower than the trench b1. Similarly, the trench e1 is shallower than the trench f1. The depth of the trench a1 is determined by a pitch between the mask pattern 310a and another mask pattern next to the mask pattern 310a, and the depth of the trench g1 is determined by a pitch between the mask pattern 310f and another mask pattern next to the mask pattern 310f.

In some embodiments, the first etching process ET1 etches the semiconductor layer 120 (e.g., SiGe) at a faster etch rate than it etches the semiconductor layer 130 (e.g., Si). As such, the trench b1 is deeper than the trench f1, and the trench c1 is deeper than the trench e1. Also, a portion of the trench d1 in the semiconductor layer 120 is deeper than another portion of the trench d1 in the semiconductor layer 130.

In some embodiments, the carbon-rich polymer-passivating gas is polymerized during the first etching process ET1 and form polymer layers 292 on surfaces of the trenches a1, b1, c1, d1, e1, f1, and g1. In some embodiments, since the semiconductor layers 120 and 130 include silicon (and germanium), the polymer layers 292 include silicon (and germanium), or other applicable materials from the semiconductor layers 120 and 130 being etched by the first etching process ET1. In some embodiments, the polymer layers 292 include elements from a gas used in the first etching process ET1, such as carbon or other applicable materials. In some embodiments, the polymer layers 292 have a thickness T1.

Figure 2B:
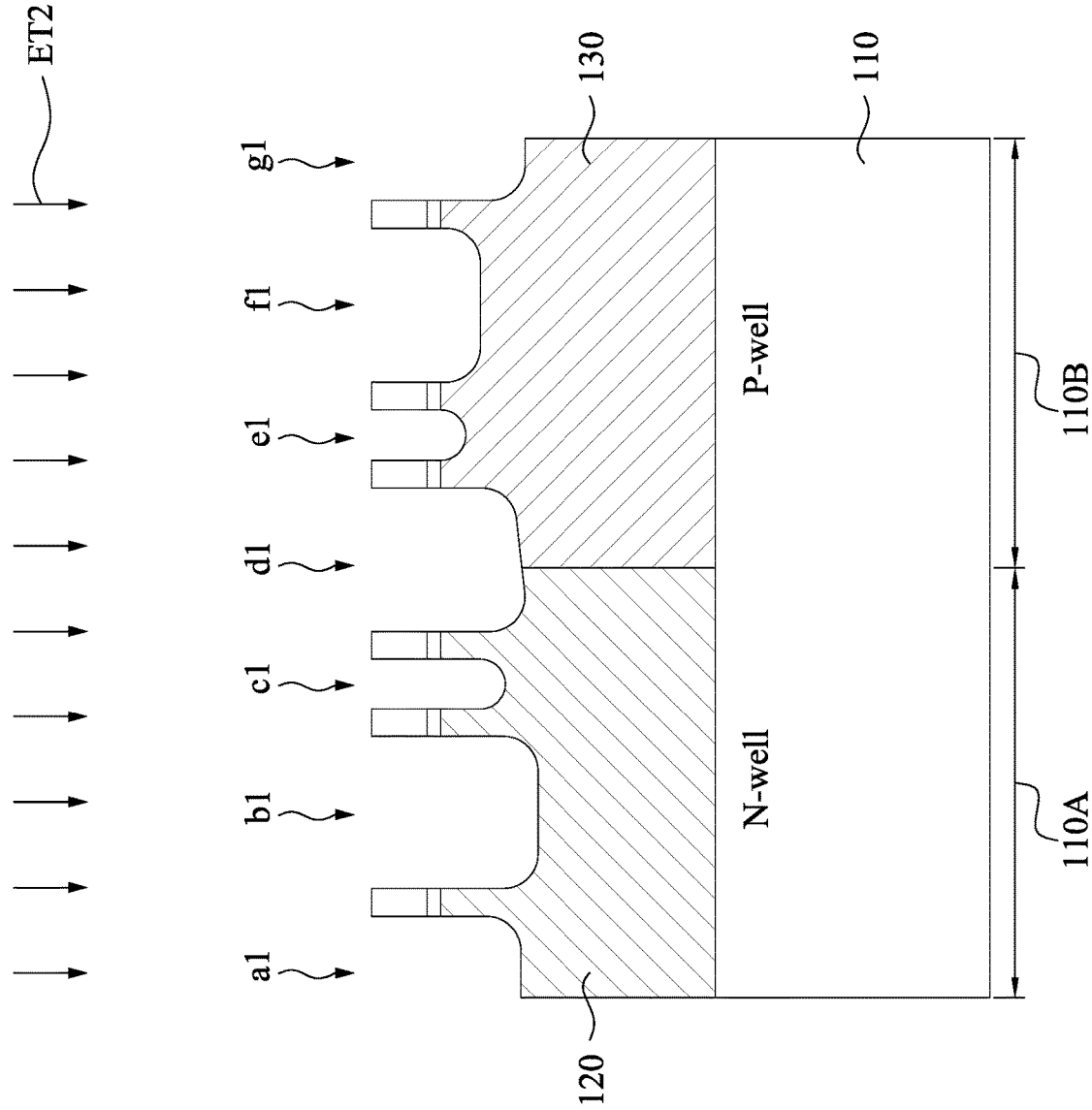

Reference is made to FIG. 2B. The polymer layers 292 (see FIG. 2A) are removed by a second etching process ET2, in accordance with some embodiments. In some embodiments, the second etching process ET2 is at least one of a plasma etching process, a reactive ion etching (RIE) process, a wet etching process, or other applicable techniques. According to some embodiments, the second etching process ET2 utilizes fluorine. According to some embodiments, the second etching process ET2 utilizes at least one of $CF_4$, $SF_6$, $NF_3$, $CHF_3$, or other applicable materials. In some embodiments, one or more of the materials utilized in the second etching process ET2 are gaseous. According to some embodiments, the second etching process ET2 is different than the first etching process ET1 at least in terms of at least one of pressure, temperature, etchants, or other applicable parameters such that the polymer layers 292 formed by the first etching process ET1 is removed by the second etching process ET2.

Figure 3A:
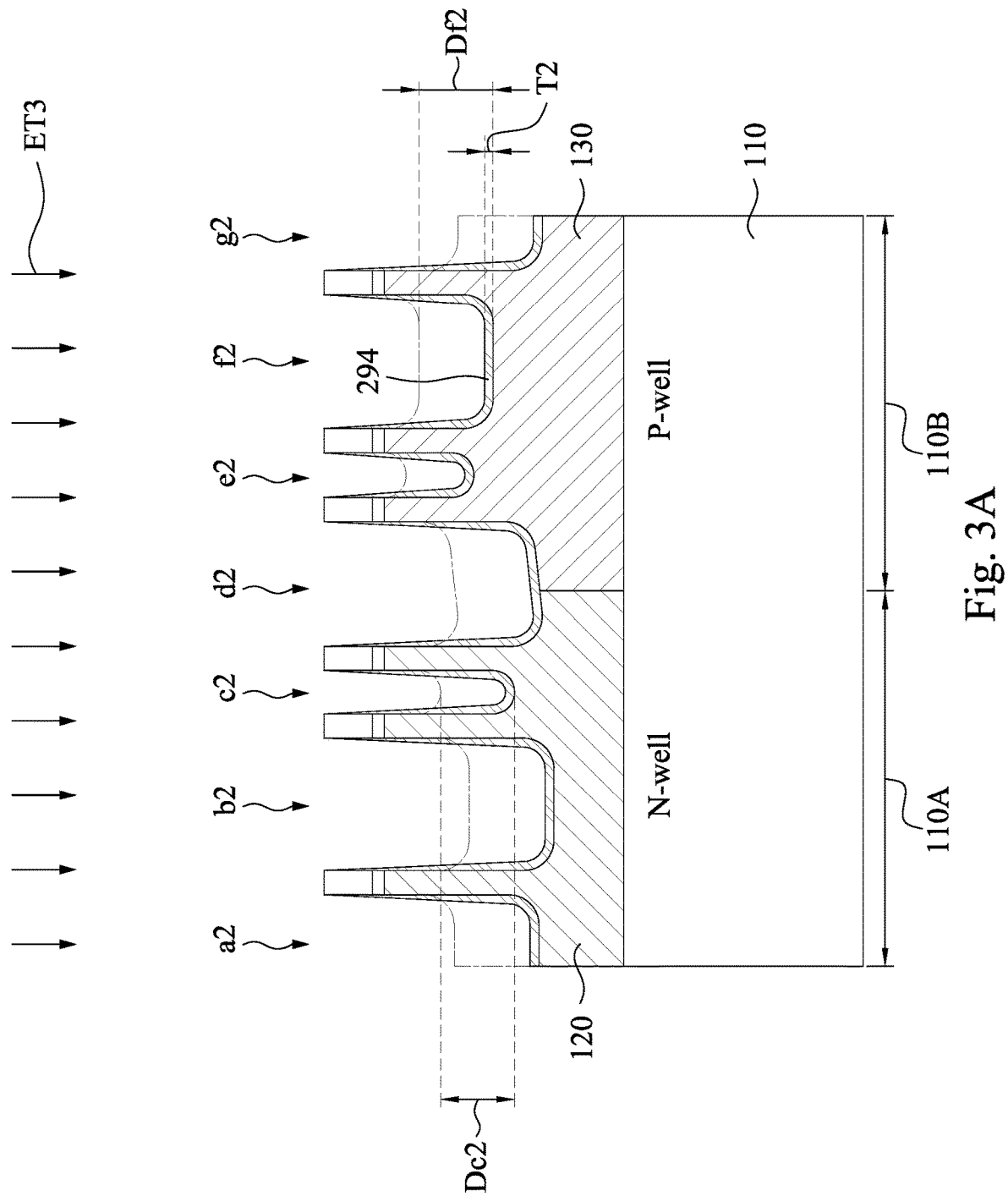

Reference is made to FIG. 3A. A third etching process ET3 is performed on the structure in FIG. 2B. The third etching process ET3 deepens the trenches a1, b1, c1, d1, e1, f1, and g1 of FIG. 2B to form trenches a2, b2, c2, d2, e2, f2, and g2 in the semiconductor layers 120 and/or 130. In some embodiments, the third etching process ET3 is substantially the same as the first etching process ET1 expect the flow rate of the etchant gas and the polymer-passivating gas and/or the ratio of the etchant gas to the polymer-passivating gas.

In some embodiments, the flow rate of the etchant gas and the polymer-passivating gas of the third etching process ET3 is higher than the flow rate of the etchant gas and the polymer-passivating gas of the first etching process ET1. As such, the etching depths of the third etching process ET3 is greater than the etching depths of the first etching process ET1. For example, the etching depth Df2 in the third etching process ET3 is greater than the etching depth Df1 in the first etching process ET1 (see FIG. 2A), and/or the etching depth Dc2 in the third etching process ET3 is greater than the etching depth Dc1 in the first etching process ET1 (see FIG. 2A). For clarity, the profiles of the trenches a1, b1, c1, d1, e1, f1, and g1 in FIG. 2B is illustrated in FIG. 3A with dash-dotted lines.

In some embodiments, the carbon-rich polymer-passivating gas is polymerized during the third etching process ET3 and form polymer layers 294 on surfaces of the trenches a2, b2, c2, d2, e2, f2, and g2. In some embodiments, the ratio of the etchant gas to the polymer-passivating gas of the third etching process ET3 is different from that of the first etching process ET1. For example, the amount of the fluorine-based etchant gas (e.g., $CF_4$) of the third etching process ET3 is greater than the amount of the polymer-passivating gas of the first etching process ET1. With more fluorine, the lateral etching rate of the plasma etching is increased, and the bottoms of the trenches a2, b2, c2, d2, e2, f2, and g2 are enlarged. Further, since the etching depth in the third etching process ET3 is greater than that in the first etching process ET1, more polymer-passivating gas are deposited in the trenches a2, b2, c2, d2, e2, f2, and g2, such that the thickness T2 of the polymer layers 294 is greater than the thickness T1 of the polymer layers 292 (see FIG. 2A).

Figure 3B:
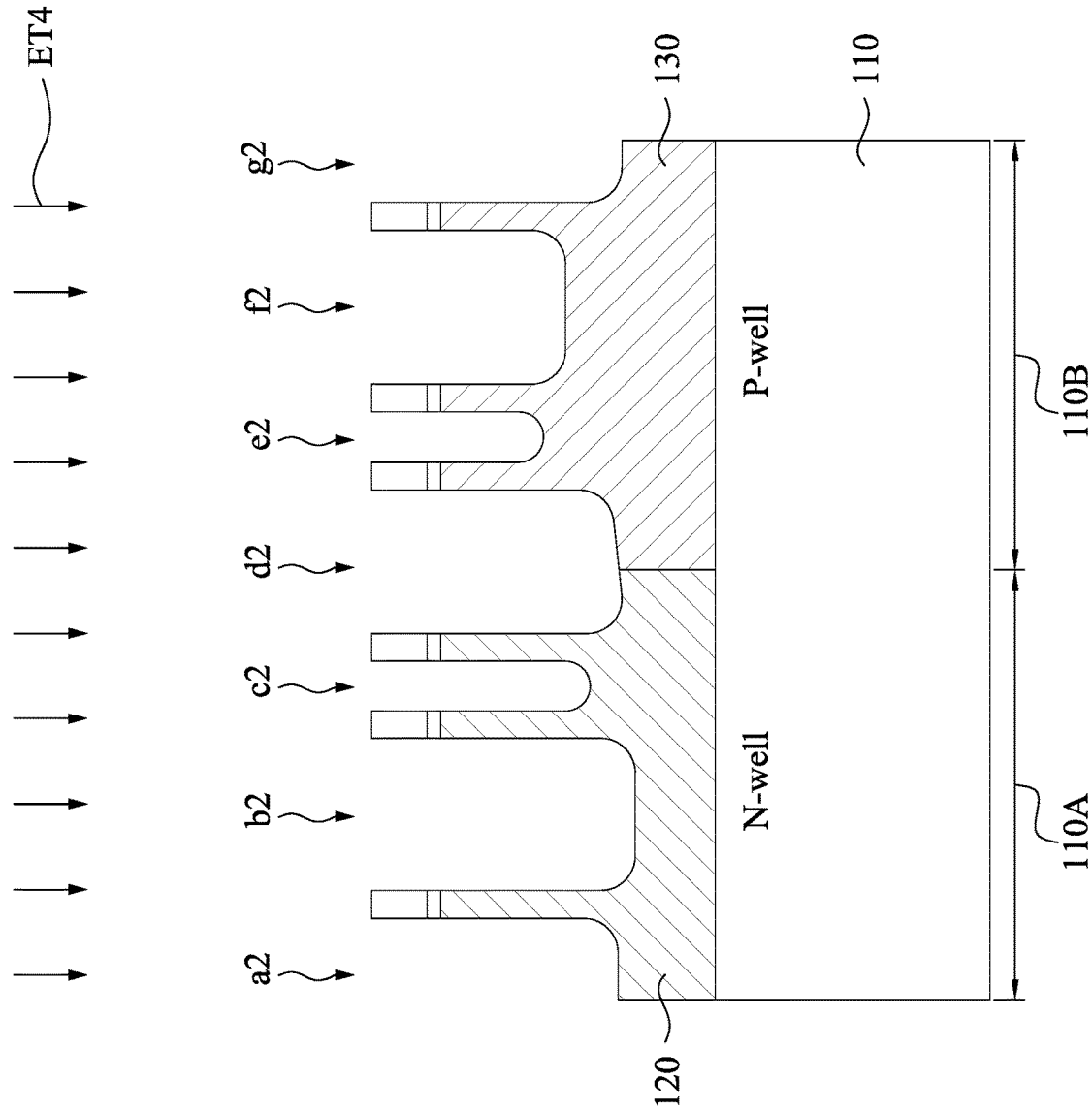

Reference is made to FIG. 3B. The polymer layers 294 (see FIG. 3A) are removed by a fourth etching process ET4, in accordance with some embodiments. In some embodiments, the fourth etching process ET4 is at least one of a plasma etching process, a reactive ion etching (RIE) process, a wet etching process, or other applicable techniques. According to some embodiments, the fourth etching process ET4 utilizes fluorine. According to some embodiments, the fourth etching process ET4 utilizes at least one of $CF_4$, $SF_6$, $NF_3$, $CHF_3$, or other applicable materials. In some embodiments, one or more of the materials utilized in the fourth etching process ET4 are gaseous. According to some embodiments, the fourth etching process ET4 is different than the third etching process ET3 at least in terms of at least one of pressure, temperature, etchants, or other applicable parameters such that the polymer layers 294 formed by the third etching process ET3 is removed by the fourth etching process ET4.

Figure 4A:
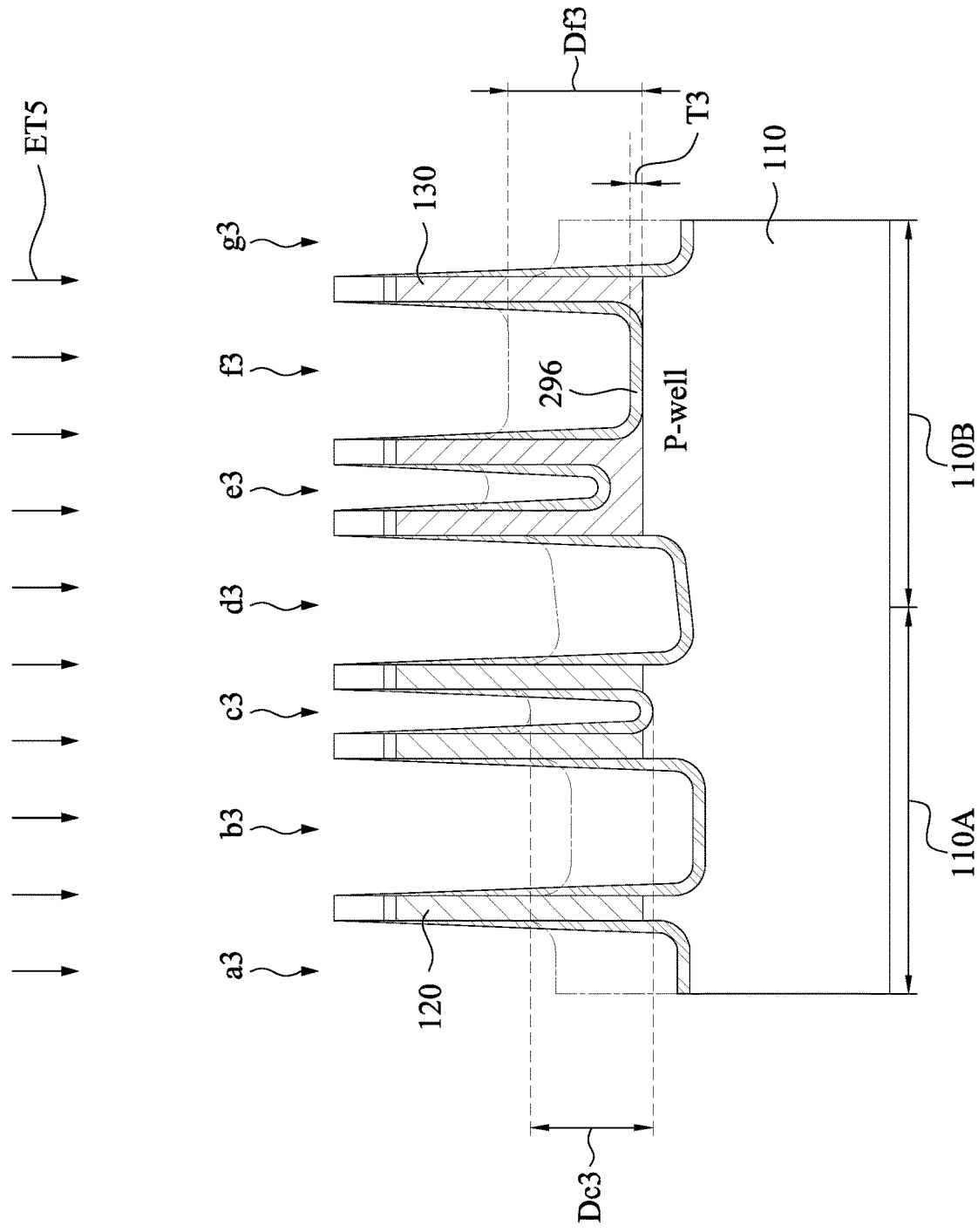

Reference is made to FIG. 4A. A fifth etching process ET5 is performed on the structure in FIG. 3B. The fifth etching process ET5 deepens the trenches a2, b2, c2, d2, e2, f2, and g2 of FIG. 3B to form trenches a3, b3, c3, d3, e3, f3, and g3 in the semiconductor layers 120 and/or 130 (and the substrate 110). In some embodiments, the fifth etching process ET5 is substantially the same as the third etching process ET3 expect the flow rate of the etchant gas and the polymer-passivating gas and/or the ratio of the etchant gas to the polymer-passivating gas.

In some embodiments, the flow rate of the etchant gas and the polymer-passivating gas of the fifth etching process ET5 is higher than the flow rate of the etchant gas and the polymer-passivating gas of the third etching process ET3. As such, the etching depths of the fifth etching process ET5 is greater than the etching depths of the third etching process ET3. For example, the etching depth Df3 in the fifth etching process ET5 is greater than the etching depth Df2 in the third etching process ET3 (see FIG. 3A), and/or the etching depth Dc3 in the fifth etching process ET5 is greater than the etching depth Dc2 in the third etching process ET3 (see FIG. 3A). For clarity, the profiles of the trenches a2, b2, c2, d2, e2, f2, and g2 in FIG. 3B is illustrated in FIG. 4A with dash-dotted lines.

In some embodiments, the carbon-rich polymer-passivating gas is polymerized during the fifth etching process ET5 and form polymer layers 296 on surfaces of the trenches a3, b3, c3, d3, e3, f3, and g3. In some embodiments, the ratio of the etchant gas to the polymer-passivating gas of the fifth etching process ET5 is different from that of the third etching process ET3. For example, the amount of the fluorine-based etchant gas (e.g., $CF_4$) of the fifth etching process ET5 is greater than the amount of the polymer-passivating gas of the third etching process ET3. With more fluorine, the lateral etching rate of the plasma etching is increased, and the bottoms of the trenches a3, b3, c3, d3, e3, f3, and g3 are enlarged. Further, since the etching depth in the fifth etching process ET5 is greater than that in the third etching process ET3, more polymer-passivating gas are deposited in the trenches a3, b3, c3, d3, e3, f3, and g3, such that the thickness T3 of the polymer layers 296 is greater than the thickness T2 of the polymer layers 294 (see FIG. 3A).

Figure 4B:
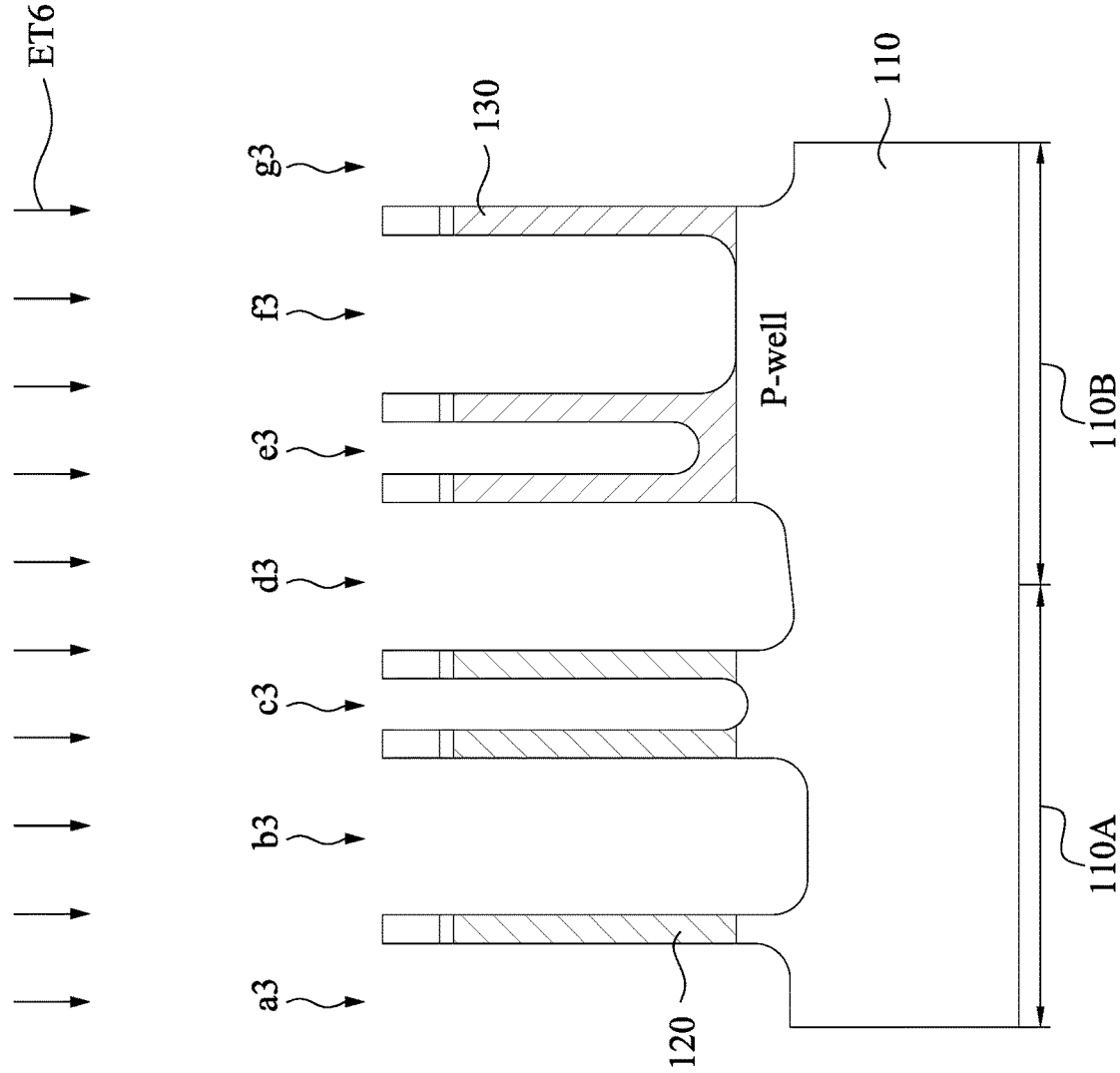

Reference is made to FIG. 4B. The polymer layers 296 (see FIG. 4A) are removed by a sixth etching process ET6, in accordance with some embodiments. In some embodiments, the sixth etching process ET6 is at least one of a plasma etching process, a reactive ion etching (RIE) process, a wet etching process, or other applicable techniques. According to some embodiments, the sixth etching process ET6 utilizes fluorine. According to some embodiments, the sixth etching process ET6 utilizes at least one of $CF_4$, $SF_6$, $NF_3$, $CHF_3$, or other applicable materials. In some embodiments, one or more of the materials utilized in the sixth etching process ET6 are gaseous. According to some embodiments, the sixth etching process ET6 is different than the fifth etching process ET5 at least in terms of at least one of pressure, temperature, etchants, or other applicable parameters such that the polymer layers 296 formed by the fifth etching process ET5 is removed by the sixth etching process ET6.

Reference is made to FIG. 5A. A seventh etching process ET7 is performed on the structure in FIG. 4B. The seventh etching process ET7 deepens the trenches a3, b3, c3, d3, e3, f3, and g3 of FIG. 4B to form trenches a4, b4, c4, d4, e4, f4, and g4 in the semiconductor layers 120 and/or 130 (and the substrate 110). In some embodiments, the seventh etching process ET7 is substantially the same as the fifth etching process ET5 expect the flow rate of the etchant gas and the polymer-passivating gas and/or the ratio of the etchant gas to the polymer-passivating gas.

In some embodiments, the flow rate of the etchant gas and the polymer-passivating gas of the seventh etching process ET7 is higher than the flow rate of the etchant gas and the polymer-passivating gas of the fifth etching process ET5. As such, the etching depths of the seventh etching process ET7 is greater than the etching depths of the fifth etching process ET5. For example, the etching depth Df4 in the seventh etching process ET7 is greater than the etching depth Df3 in the fifth etching process ET5 (see FIG. 4A), and/or the etching depth Dc4 in the seventh etching process ET7 is greater than the etching depth Dc3 in the fifth etching process ET5 (see FIG. 4A). For clarity, the profiles of the trenches a3, b3, c3, d3, e3, f3, and g3 in FIG. 4B is illustrated in FIG. 5A with dash-dotted lines.

In some embodiments, the carbon-rich polymer-passivating gas is polymerized during the seventh etching process ET7 and form polymer layers 298 on surfaces of the trenches a4, b4, c4, d4, e4, f4, and g4. In some embodiments, the ratio of the etchant gas to the polymer-passivating gas of the seventh etching process ET7 is different from that of the fifth etching process ET5. For example, the amount of the fluorine-based etchant gas (e.g., $CF_4$) of the seventh etching process ET7 is greater than the amount of the polymer-passivating gas of the fifth etching process ET5. With more fluorine, the lateral etching rate of the plasma etching is increased, and the bottoms of the trenches a4, b4, c4, d4, e4, f4, and g4 are enlarged. Further, since the etching depth in the seventh etching process ET7 is greater than that in the fifth etching process ET5, more polymer-passivating gas are deposited in the trenches a4, b4, c4, d4, e4, f4, and g4, such that the thickness T4 of the polymer layers 298 is greater than the thickness T3 of the polymer layers 296 (see FIG. 4A).

Figure 5B:
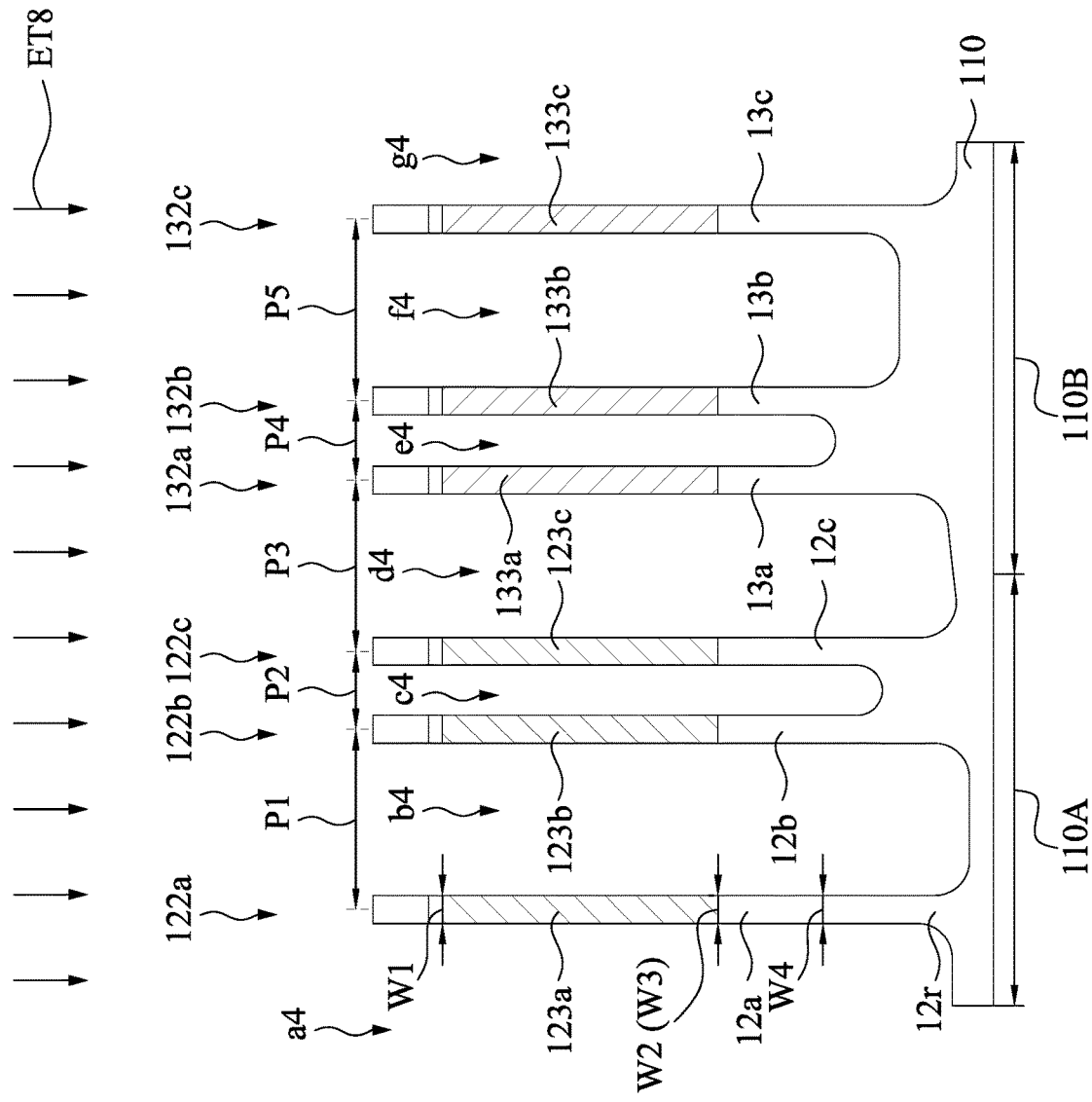

Reference is made to FIG. 5B. The polymer layers 298 (see FIG. 5A) are removed by an eighth etching process ET8, in accordance with some embodiments. In some embodiments, the eighth etching process ET8 is at least one of a plasma etching process, a reactive ion etching (RIE) process, a wet etching process, or other applicable techniques. According to some embodiments, the eighth etching process ET8 utilizes fluorine. According to some embodiments, the eighth etching process ET8 eighth etching process ET8 utilizes at least one of $CF_4$, $SF_6$, $NF_3$, $CHF_3$, or other applicable materials. In some embodiments, one or more of the materials utilized in the eighth etching process ET8 are gaseous. According to some embodiments, the eighth etching process ET8 is different than the seventh etching process ET7 at least in terms of at least one of pressure, temperature, etchants, or other applicable parameters such that the polymer layers 298 formed by the seventh etching process ET7 is removed by the eighth etching process ET8.

In some embodiments, one etching cycle includes a polymer deposition process (e.g., the first etching process ET1, the third etching process ET3, the fifth etching process ET5, and the seventh etching process ET7) and a polymer removal process (e.g., the second etching process ET2, the fourth etching process ET4, the sixth etching process ET6, and the eighth etching process ET8). It is noted that although 4 cycles are illustrated, less or more than 4 cycles can be performed to form the trenches a4, b4, c4, d4, e4, f4, and g4 in other embodiments.

In FIG. 5B, semiconductor fins 122a, 122b, 122c, 132a, 132b, and 132c are formed. The semiconductor fin 122a includes a base portion 12a and a channel portion 123a, the semiconductor fin 122b includes a base portion 12b and a channel portion 123b, the semiconductor fin 122c includes a base portion 12c and a channel portion 123c, the semiconductor fin 132a includes a base portion 13a and a channel portion 133a, the semiconductor fin 132b includes a base portion 13b and a channel portion 133b, and the semiconductor fin 132c includes a base portion 13c and a channel portion 133c.

Each of the sidewalls of the channel portions 123a, 123b, 123c, 133a, 133b, and 133c are substantially straight. That is, a width of each of the channel portions 123a, 123b, 123c, 133a, 133b, and 133c at the top thereof is substantially the same as a width of each of the channel portions 123a, 123b, 123c, 133a, 133b, and 133c at the bottom thereof. Take the channel portion 123a as an example, a top width W1 of the channel portion 123a is substantially the same as a bottom width W2 of the channel portion 123a. Stated another way, a difference between the top width W1 and the bottom width W2 is less than about 1 nm.

Each of the sidewalls of the base portions 12a, 12b, 12c, 13a, 13b, and 13c are substantially straight. That is, a width of each of the base portions 12a, 12b, 12c, 13a, 13b, and 13c at the top thereof is substantially the same as a width of each of the base portions 12a, 12b, 12c, 13a, 13b, and 13c at the bottom thereof. Take the base portion 12a as an example, a top width W3 of the base portion 12a is substantially the same as a middle width W4 of the base portion 12a. Stated another way, a difference between the top width W3 and the middle width W4 is less than about 1 nm. It is noted that the middle width W4 is a width of the base portion 12a at a middle position of the top surface of the base portion 12a and a root 12r of the base portion 12a.

In some embodiments, each of the semiconductor fins 122a, 122b, 122c, 132a, 132b, and 132c has a height in a range of about 90 nm to about 300 nm. If the height is greater than about 300 nm, the semiconductor fins 122a, 122b, 122c, 132a, 132b, and 132c may collapse; if the height is less than about 90 nm, the channel portions 123a, 123b, 123c, 133a, 133b, and 133c may not be well controlled. Further, the trenches b4 and c4 are respectively deeper than the trenches f4 and e4 by a distance of about 10 nm to about 30 nm due to the etching selectivity between the semiconductor layers 120 and 130 during the etching processes ET1 to ET8.

The semiconductor fins 122a and 122b have a pitch P1 therebetween, the semiconductor fins 122b and 122c have a pitch P2 therebetween, the semiconductor fins 122c and 132a have a pitch P3 therebetween, the semiconductor fins 132a and 132b have a pitch P4 therebetween, and the semiconductor fins 132b and 132c have a pitch P5 therebetween. As mentioned above, the pitch P1 is substantially the same as the pitch P5, and the pitch P2 is substantially the same as the pitch P4. In some embodiments, the pitch P3 is greater than the pitch P2 (P4) and smaller than the pitch P1 (P5). In some embodiments, each of the pitches P1-P5 is in a range of about 15 nm to about 100 nm. If each of the pitches P1-P5 is less than about 15 nm, the loading effect of the integrated circuit structure 100 may be worse; if each of the pitches P1-P5 is greater than about 100 nm, the layout area of the integrated circuit structure 100 may be large.

Reference is made to FIG. 6. An isolation layer 140 is formed over the substrate 110 and in the trenches a4, b4, c4, d4, e4, f4, and g4. In some embodiments, the isolation layer 140 is formed to conformally cover the semiconductor fins 122a-122c and 132a-132c by suitable deposition process, such as atomic layer deposition (ALD). Thus, plural trenches 142 are formed in the isolation layer 140 and between the semiconductor fins 122a-122c or between the semiconductor fins 132a-132c.

In some embodiments, if two adjacent fins are too close, the isolation layer 140 may be filled in the space between the fins. For example, in FIG. 6, since the semiconductor fins 122b and 122c (or 132a and 132b) are close enough, the isolation layer 140 is filled in the space between the adjacent semiconductor fins 122b and 122c (or 132a and 132b). That is, no trench is formed between the semiconductor fins 122b and 122c (or 132a and 132b).

Subsequently, a dielectric fin layer 150 is formed over the substrate 110 and covers the isolation layer 140. The dielectric fin layer 150 is filled in the trenches 142 in the isolation layer 140. In some embodiments, filling of the trenches 142 may be performed by an ALD process. In some embodiments, the trenches 142 may be filled by suitable processes such as, for example, ALD, CVD, FCVD, PVD, MBE, HDPCVD, MOCVD, RPCVD, PECVD, other suitable methods, and/or combinations thereof. In some embodiments, the dielectric fin layer 150 includes silicon oxynitride (SiON), silicon carbon nitride (SiCN), silicon oxygen carbon nitride (SiOCN), or metal oxides such as, for example, hafnium oxide ($HfO_2$), zirconium oxide ($ZrO_2$), aluminum oxide ($Al_2O_3$), other suitable metal oxides, and/or combinations thereof.

Reference is made to FIG. 7. A planarization process (such as a CMP process) is performed to remove excessive isolation layer 140, the dielectric fin layer 150, and the mask patterns 310a-310f (see FIG. 1A) until the semiconductor fins 122a-122c and 132a-132c are exposed, remaining the isolation layer 140' and the dielectric fin layers 155. The remaining portion of the dielectric fin layers 150 are referred to as self-aligned isolation fins 155.

Figure 8:
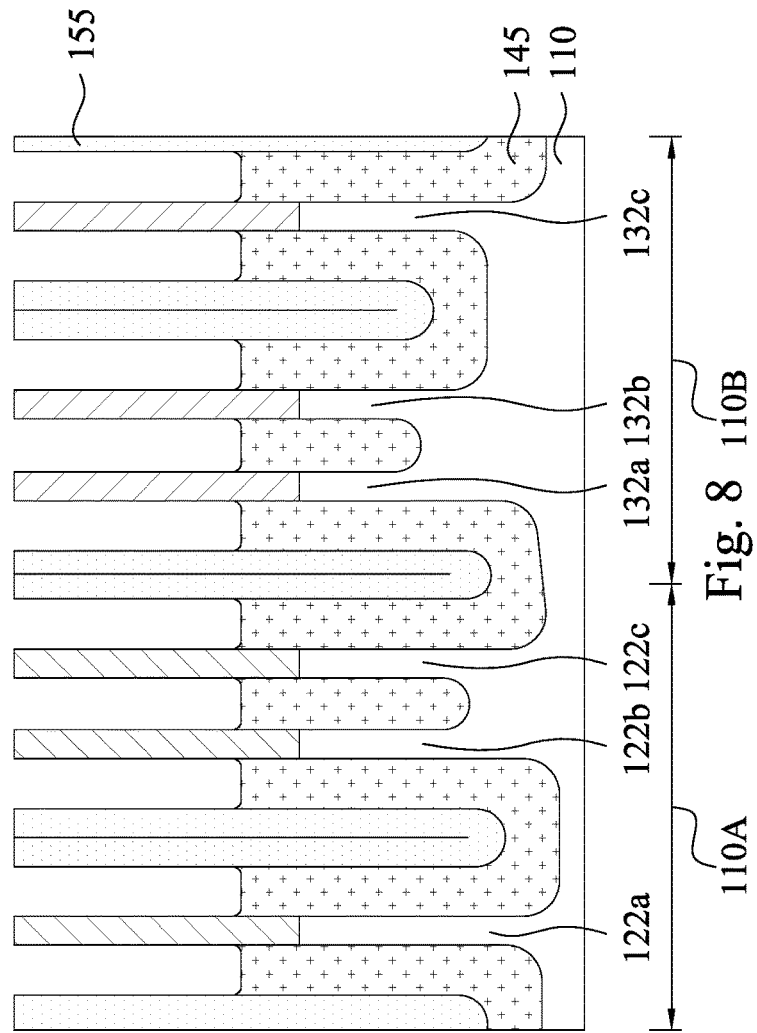
Figure 9C:
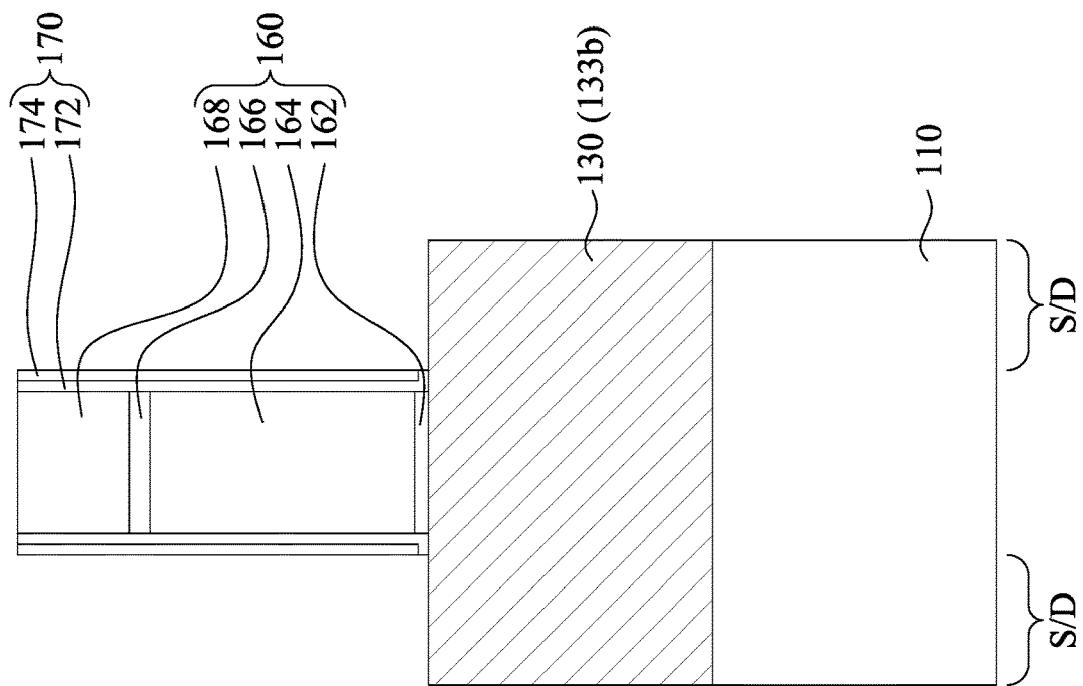
Figure 9B:
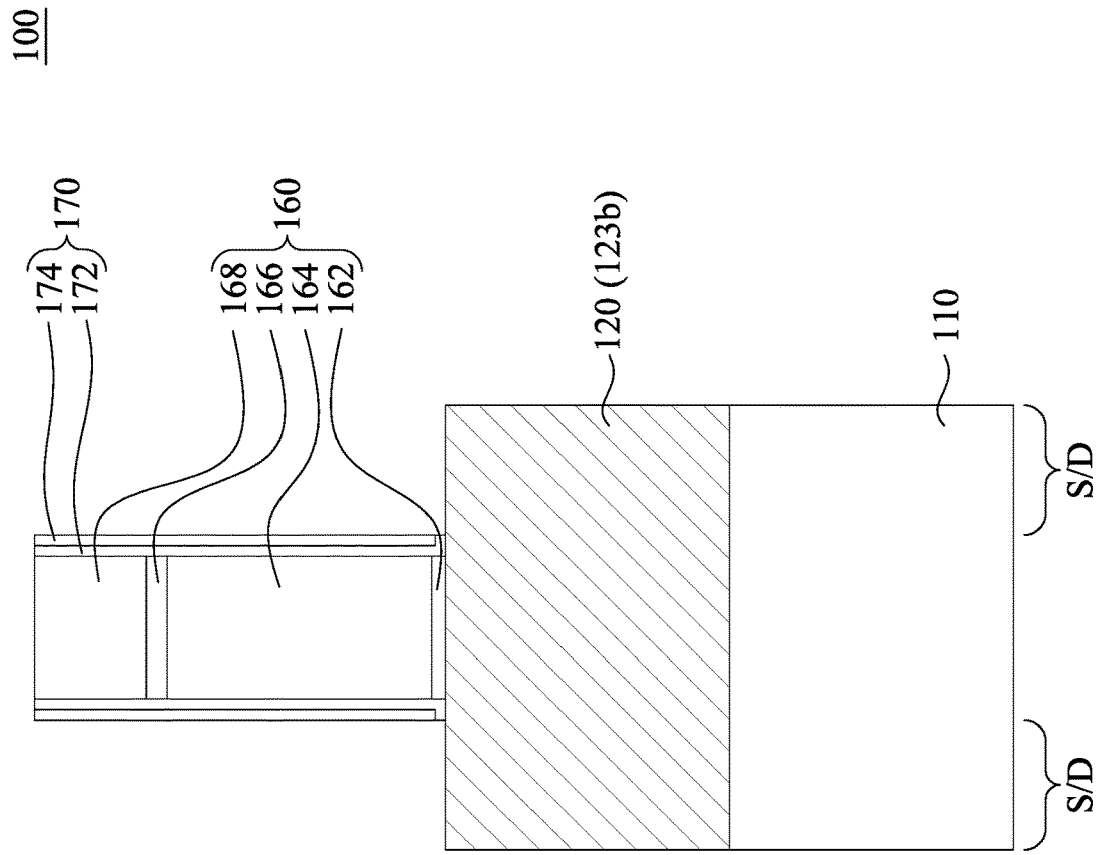
Figure 10D:
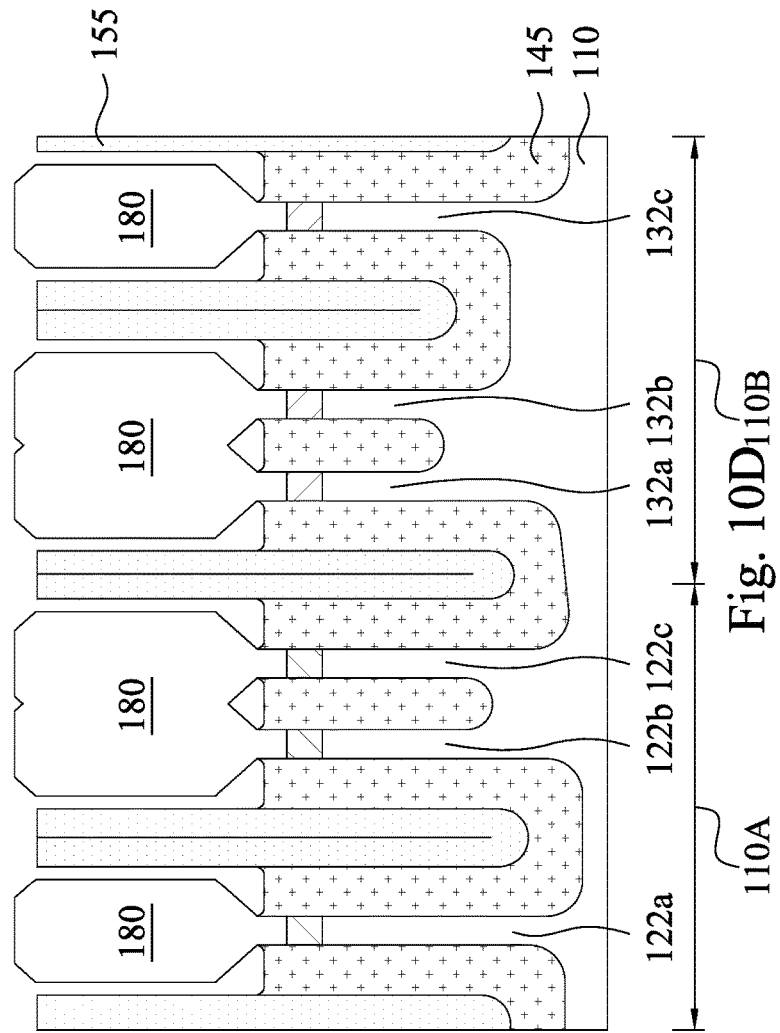
Figure 12A:
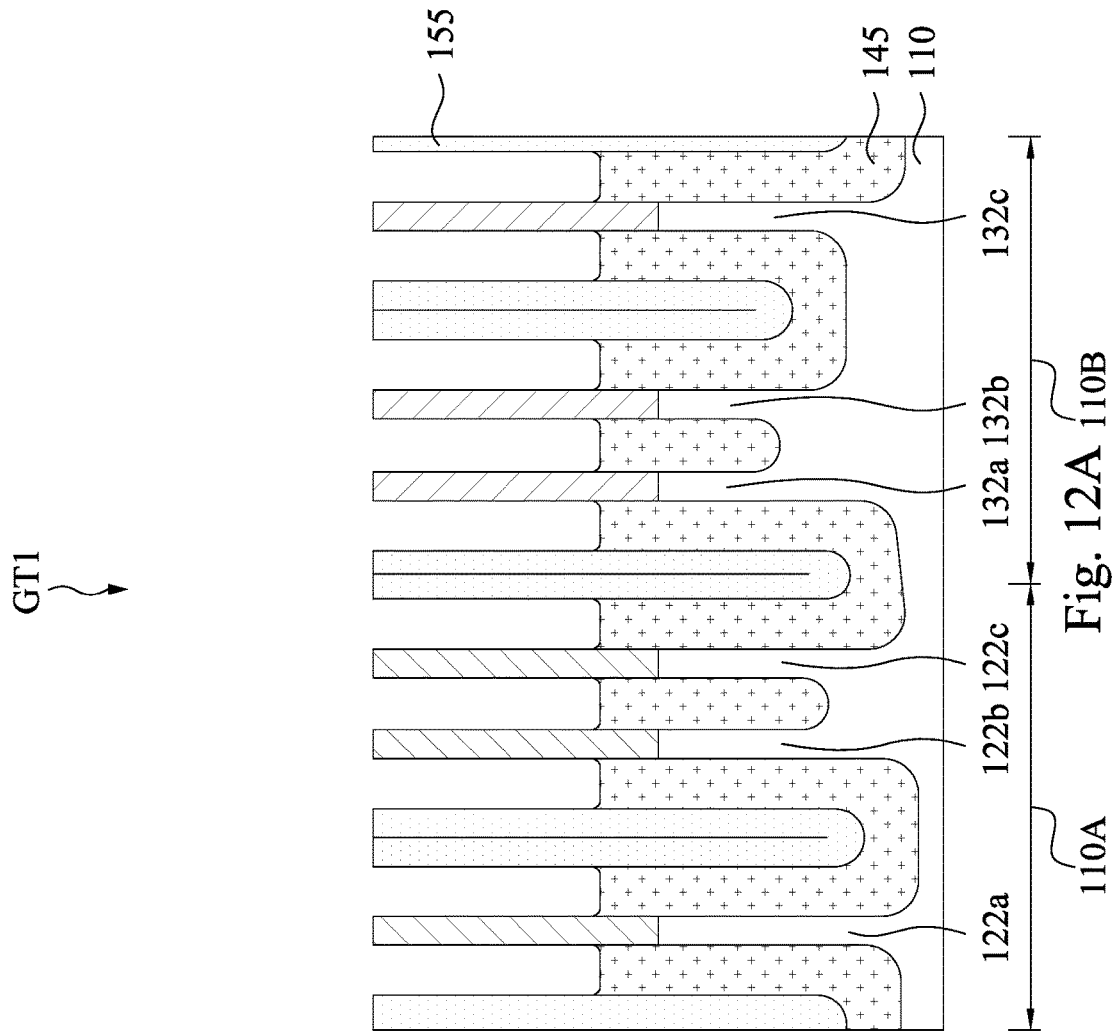
Figure 12D:
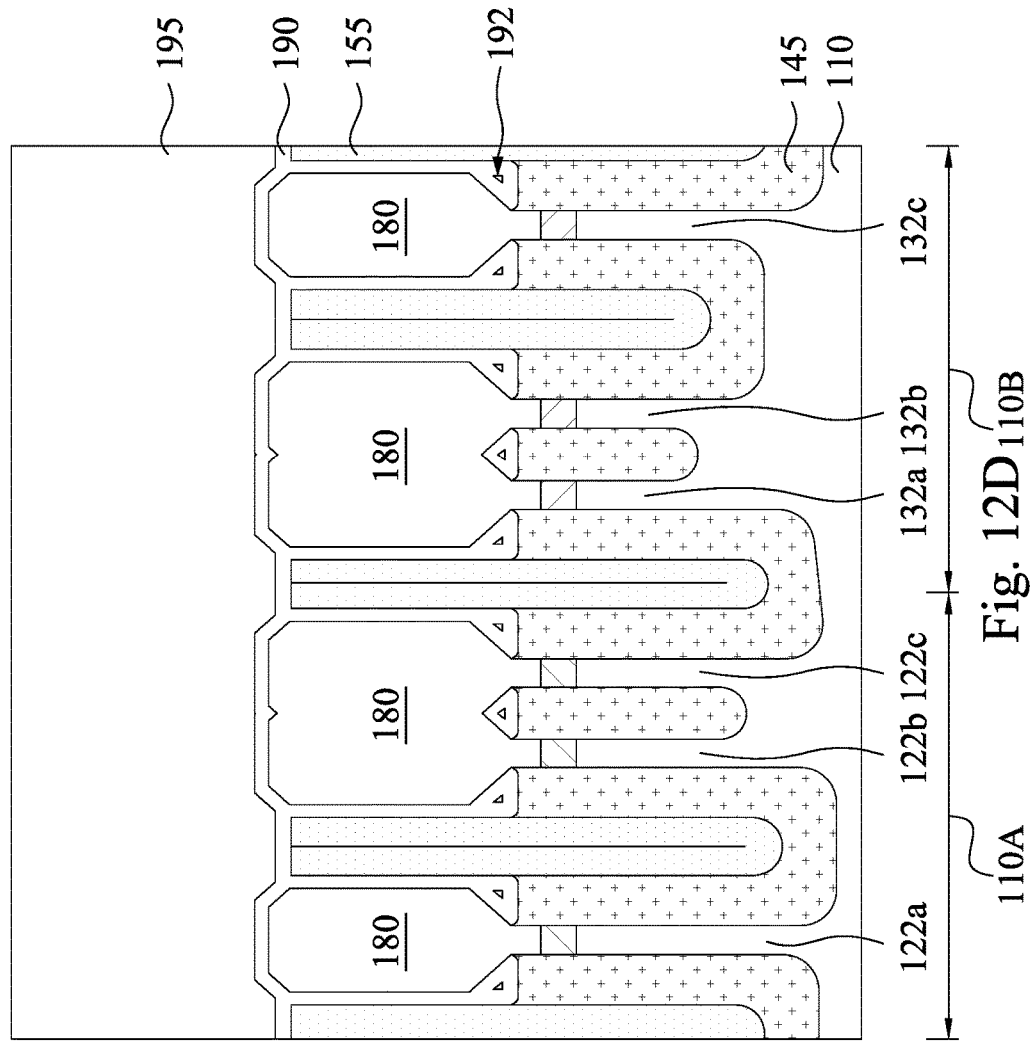
Figure 13B:
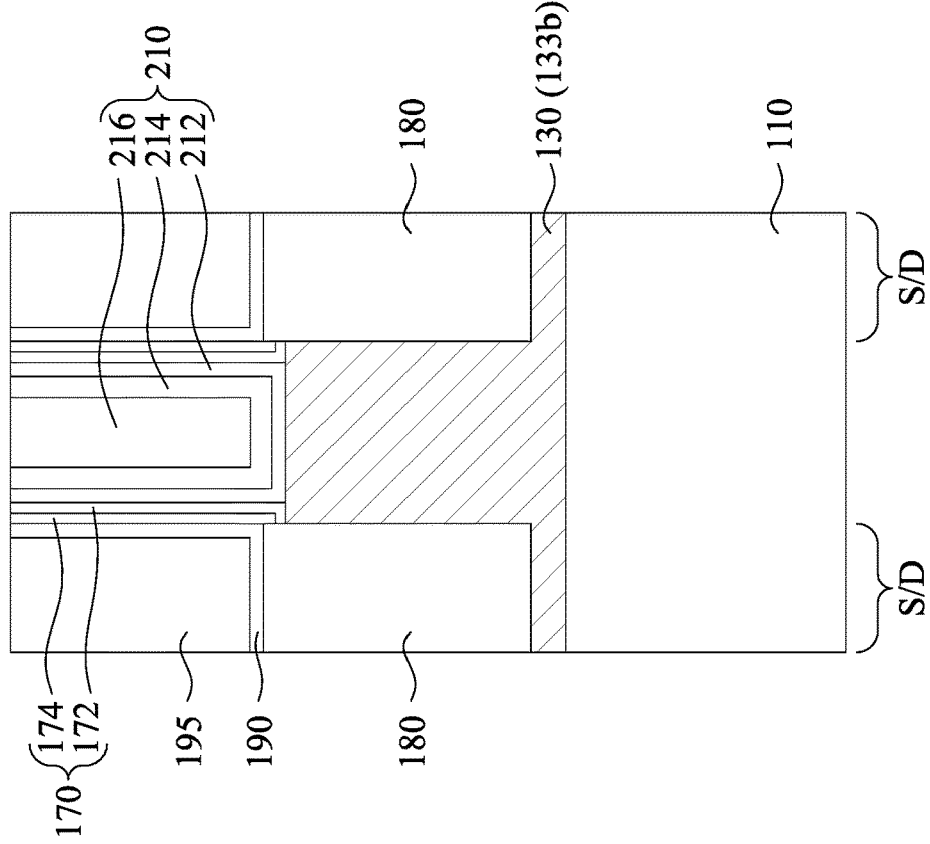
Figure 13C:
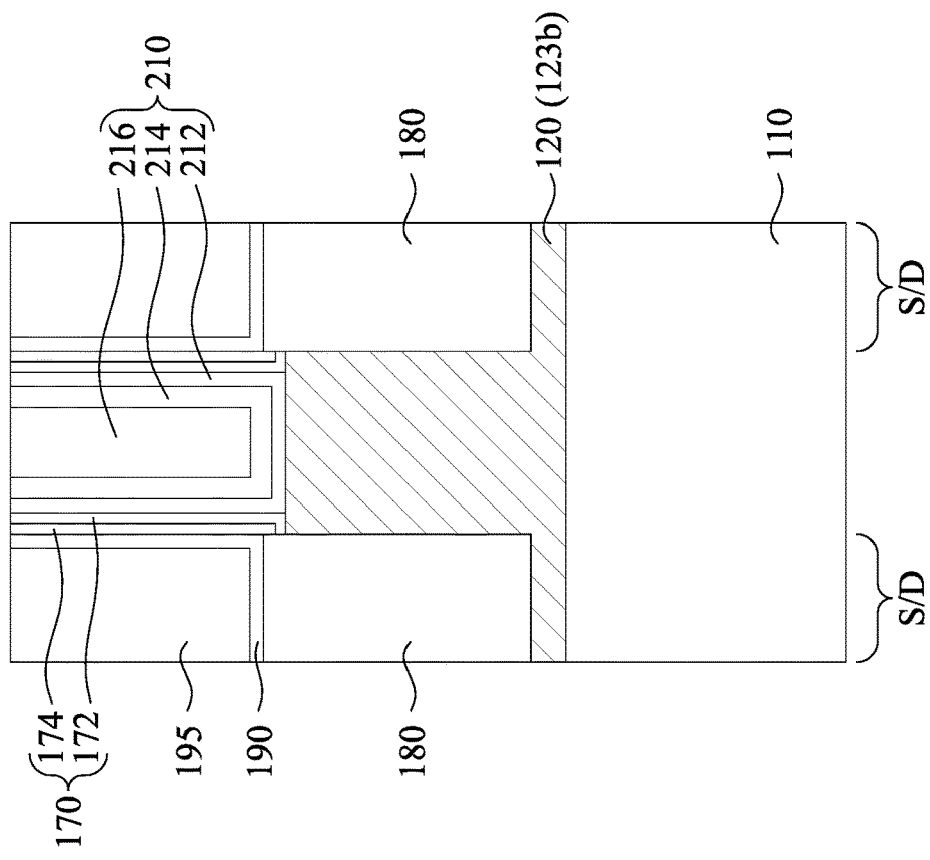
Figure 14C:
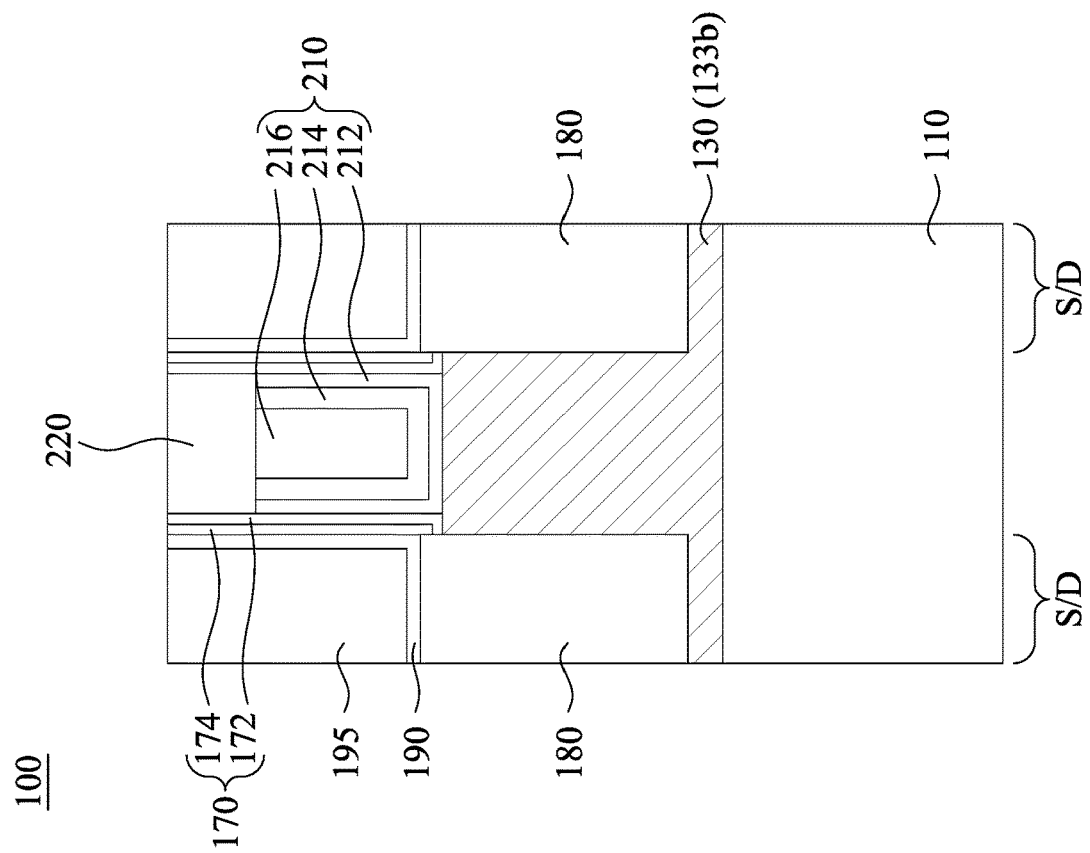
Figure 14B:
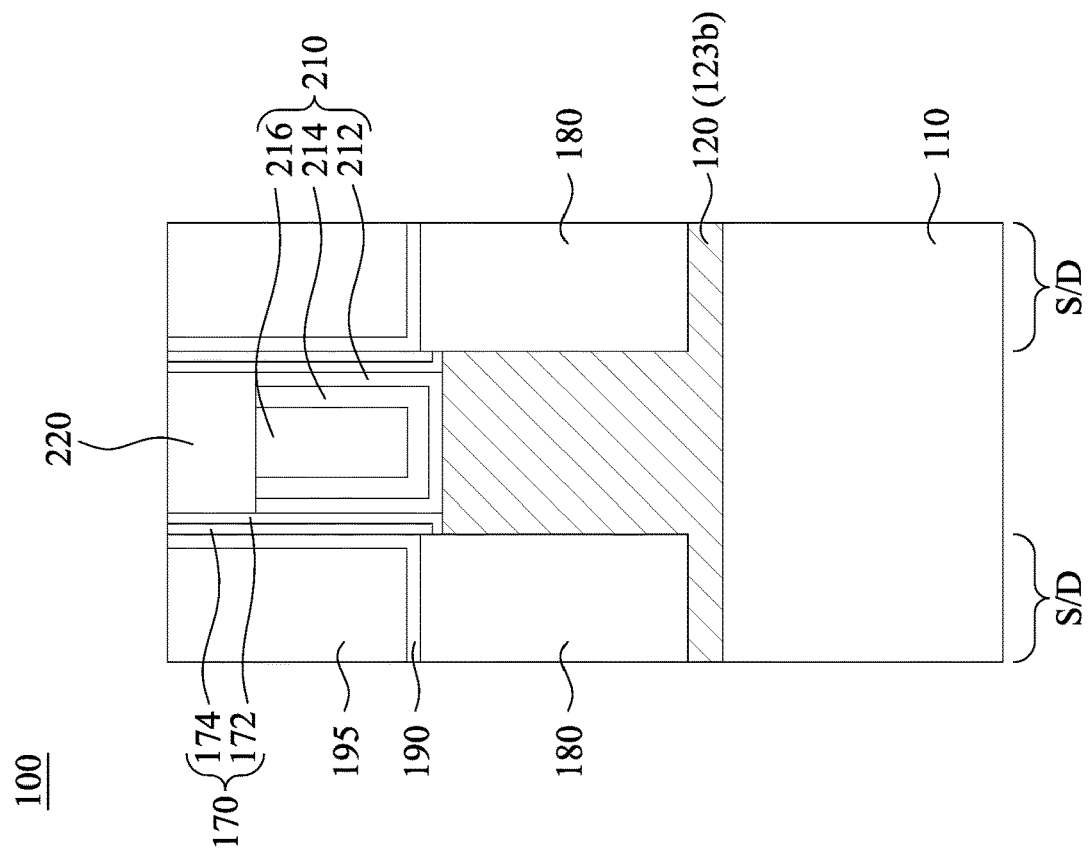

Reference is made to FIG. 8. Subsequently, the isolation layer 140' (see FIG. 7) is then etched back such that portions of the semiconductor fins 122a-122c and 132a-132c and the self-aligned isolation fins 155 protrude from the remaining portions of the isolation layer 140'. The remaining portions of isolation layer 140' form isolation structures 145. The isolation structures 145 can be achieved by suitable methods such as, for example, an etch process that has suitable etch selectivity between materials of the isolation layer 140', the semiconductor fins 122a-122c and 132a-132c, and the self-aligned isolation fin 155. For example, the etch process can have a higher etch rate of the isolation layer 140' than the etch rate of the semiconductor fins 122a-122c and 132a-132c and/or the self-aligned isolation fin 155. In some embodiments, etching rate difference be achieved by adjusting suitable parameters of the etch process such as, for example, etchant gas type, gas flow rate, etching temperature, plasma power, chamber pressure, other suitable parameters, and/or combinations thereof. In some embodiments, each of portions of the semiconductor fins 122a-122c and 132a-132c protruding from the isolation structures 145 has a height of about 90 nm to about 130 nm.

Reference is made to FIGS. 9A-9D. At least one dummy gate structure 160 is formed over the substrate 110 and at least partially disposed over the semiconductor fins 122a-122c and 132a-132c. The portions of the semiconductor fins 122a-122c and 132a-132c underlying the dummy gate structure 160 may be referred to as the channel regions. The dummy gate structure 160 may also define source/drain (S/D) regions of the semiconductor fins 122a-122c and 132a-132c, for example, the regions of the semiconductor fins 122a-122c and 132a-132c adjacent and on opposing sides of the channel regions.

Dummy gate formation operation first forms a dummy gate dielectric layer 162 over the semiconductor fins 122a-122c and 132a-132c. Subsequently, a dummy gate electrode layer and a hard mask which may include multiple layers (e.g., an oxide layer and a nitride layer) are formed over the dummy gate dielectric layer. The hard mask is then patterned to be nitride mask layers 168 and oxide mask layers 166, followed by patterning the dummy gate electrode layer to be dummy gate electrodes 164 by using the mask layers 168 and pad layers 166 as etch masks. In some embodiments, after patterning the dummy gate electrode layer, the dummy gate dielectric layer is removed from the S/D regions of the semiconductor fins 122a-122c and 132a-132c and to be dummy gate dielectric layers 162. The etch process may include a wet etch, a dry etch, and/or combinations thereof. The etch process is chosen to selectively etch the dummy gate dielectric layer without substantially etching the semiconductor fins 122a-122c and 132a-132c, the dummy gate electrode layers 164, the oxide mask layers 166 and the nitride mask layers 168.

After formation of the dummy gate structure 160 is completed, gate spacers 170 formed on sidewalls of the dummy gate structure 160. In some embodiments of the gate spacer formation operations, a spacer material layer is deposited on the substrate 110. The spacer material layer may be a conformal layer that is subsequently etched back to form gate spacers 170. In some embodiments, the spacer material layer includes multiple layers, such as a first spacer layer 172 and a second spacer layer 174 formed over the first spacer layer 172. The first and second spacer layers 172 and 174 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 172 and 174 may be formed by depositing in sequence two different dielectric materials over the dummy gate structure 160 using processes such as, CVD process, a subatmospheric CVD (SACVD) process, a flowable CVD process, an ALD process, a PVD process, or other suitable process. An anisotropic etching process is then performed on the deposited spacer layers 172 and 174 to expose portions of the semiconductor fins 122a-122c and 132a-132c not covered by the dummy gate structure 160 (e.g., in source/drain regions of the semiconductor fins 122a-122c and 132a-132c). Portions of the spacer layers 172 and 174 directly above the dummy gate structure 160 may be removed by this anisotropic etching process. Portions of the spacer layer 172 and 174 on sidewalls of the dummy gate structure 160 may remain, forming gate sidewall spacers, which are denoted as the gate spacers 170, for the sake of simplicity. In some embodiments, the first spacer layer 172 is formed of silicon oxide that has a lower dielectric constant than silicon nitride, and the second spacer layer 174 is formed of silicon nitride that has a higher etch resistance against subsequent etching processing (e.g., etching source/drain recesses in the semiconductor fins 122a-122c and 132a-132c) than silicon oxide. In some embodiments, the gate spacers 170 may be used to offset subsequently formed doped regions, such as source/drain regions. The gate spacers 170 may further be used for designing or modifying the source/drain region profile.

Reference is made to FIGS. 10A-10D. After formation of the gate spacers 170 is completed, source/drain epitaxial structures 180 are formed on source/drain regions of the semiconductor fins 122a-122c and 132a-132c that are not covered by the dummy gate structure 160 and the gate spacers 170. In some embodiments, formation of the source/drain epitaxial structures 180 includes recessing source/drain regions of the semiconductor fins 122a-122c and 132a-132c, followed by epitaxially growing semiconductor materials in the recessed source/drain regions of the semiconductor fins 122a-122c and 132a-132c.

The source/drain regions of the semiconductor fins 122a-122c and 132a-132c can be recessed using suitable selective etching processing that attacks the semiconductor fins 122a-122c and 132a-132c, but barely attacks the gate spacers 170 and the top masks 168 of the dummy gate structure 160. For example, recessing the semiconductor fins 122a-122c and 132a-132c may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 122a-122c and 132a-132c at a faster etch rate than it etches the gate spacers 170 and the top masks 168 of the dummy gate structure 160. In some other embodiments, recessing the semiconductor fins 122a-122c and 132a-132c may be performed by a wet chemical etch, such as ammonium peroxide mixture (APM), NH$_4$OH, tetramethylammonium hydroxide (TMAH), combinations thereof, or the like, which etches the semiconductor fins 122a-122c and 132a-132c at a faster etch rate than it etches the gate spacers 170 and the top masks 168 of the dummy gate structure 160. In some other embodiments, recessing the semiconductor fins 122a-122c and 132a-132c may be performed by a combination of a dry chemical etch and a wet chemical etch.

Once recesses are created in the source/drain regions of the semiconductor fins 122a-122c and 132a-132c, source/drain epitaxial structures 180 are formed in the source/drain recesses in the semiconductor fins 122a-122c and 132a-132c by using one or more epitaxy or epitaxial (epi) processes that provides one or more epitaxial materials on the semiconductor fins 122a-122c and 132a-132c. During the epitaxial growth process, the gate spacers 170 limit the one or more epitaxial materials to source/drain regions in the semiconductor fins 122a-122c and 132a-132c. In some embodiments, the lattice constants of the epitaxy structures 180 are different from the lattice constant of the semiconductor fins 122a-122c and 132a-132c, so that the channel region in the semiconductor fins 122a-122c and 132a-132c and between the epitaxy structures 180 can be strained or stressed by the epitaxy structures 180 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 122a-122c and 132a-132c.

In some embodiments, the source/drain epitaxial structures 180 may include Ge, Si, GaAs, AlGaAs, SiGe, GaAsP, SiP, or other suitable material. The source/drain epitaxial structures 180 may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 180 are not in-situ doped, an implantation process (i.e., a junction implant process) is performed to dope the source/drain epitaxial structures 180. In some exemplary embodiments, the source/drain epitaxial structures 180 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed semiconductor fins 122a-122c and 132a-132c in the p-type device regions. The mask may then be removed. Subsequently, a mask, such as a photoresist, may be formed over the p-type device region while exposing the n-type device regions, and n-type epitaxial structures may be formed on the exposed semiconductor fins 122a-122c and 132a-132c in the n-type device region. The mask may then be removed.

Once the source/drain epitaxial structures 180 are formed, an annealing process can be performed to activate the p-type dopants or n-type dopants in the source/drain epitaxial structures 180. The annealing process may be, for example, a rapid thermal anneal (RTA), a laser anneal, a millisecond thermal annealing (MSA) process or the like.

Reference is made to FIGS. 11A-11D. An interlayer dielectric (ILD) layer 195 is formed on the substrate 110. In some embodiments, a contact etch stop layer (CESL) 190 is also formed prior to forming the ILD layer 195. In some examples, the CESL 190 includes a silicon nitride layer, silicon oxide layer, a silicon oxynitride layer, and/or other suitable materials having a different etch selectivity than the ILD layer 195. The CESL 190 may be formed by plasma-enhanced chemical vapor deposition (PECVD) process and/or other suitable deposition or oxidation processes. In some embodiments, the ILD layer 195 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 195 may be deposited by a PECVD process or other suitable deposition technique. In some embodiments, after formation of the ILD layer 195, the wafer may be subject to a high thermal budget process to anneal the ILD layer 195. In some embodiments, at least one air gap 192 is defined by the CESL 190 and is formed under the source/drain epitaxial structures 180.

In some examples, after forming the ILD layer 195, a planarization process may be performed to remove excessive materials of the ILD layer 195. For example, a planarization process includes a chemical mechanical planarization (CMP) process which removes portions of the ILD layer 195 (and the CESL 190, if present) overlying the dummy gate structure 160. In some embodiments, the CMP process also removes the oxide mask layer 166 and the nitride mask layer 168 (as shown in FIG. 10A) and exposes the dummy gate electrodes 164.

Reference is made to FIGS. 12A-12D. The dummy gate electrodes 164 and the dummy gate dielectric layer 162 (see FIG. 11A) are removed, resulting in a gate trench GT1 between the gate spacers 170. The dummy gate electrodes 164 and the dummy gate dielectric layer 162 are removed using a selective etching process (e.g., selective dry etching, selective wet etching, or combinations thereof) that etches materials in the dummy gate electrodes 164 at a faster etch rate than it etches other materials (e.g., the gate spacers 170, the CESL 190, and/or the ILD layer 195).

Reference is made to FIGS. 13A-13D. A replacement gate structure 210 is formed in the gate trench GT1. The gate structure 210 may be the final gates of FinFETs. The final gate structure may be a high-k/metal gate stack, however other compositions are possible. In some embodiments, the gate structure 210 forms the gate associated with the three-sides of the channel region provided by the semiconductor fins 122a-122c and 132a-132c. Stated another way, the gate structure 210 wraps around the semiconductor fins 122a-122c and 132a-132c on three sides. In various embodiments, the gate structure 210 includes a gate dielectric layer 212 lining the gate trench GT1, a work function metal layer 214 formed over the gate dielectric layer 212, and a fill metal 216 formed over the work function metal layer 214 and filling a remainder of the gate trench GT1. The gate dielectric layer 212 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 214 and/or fill metal 216 used within the gate structure 210 may include a metal, metal alloy, or metal silicide. Formation of the gate structure 210 may include multiple deposition processes to form various gate materials, one or more liner layers, and one or more CMP processes to remove excessive gate materials.

Reference is made to FIGS. 14A-14D. Optionally, an etching back process is performed to etch back the replacement gate structure 210, resulting in a recess over the etched-back gate structure 210. In some embodiments, because the materials of the replacement gate structure 210 have a different etch selectivity than the gate spacers 170, the top surfaces of the replacement gate structure 210 may be at a lower level than the top surfaces of the gate spacers 170.

A dielectric cap 220 is optionally formed over the etched-back gate structures 210. For example, a dielectric cap layer, including $SiN_x$, $Al_xO_y$, AlON, $SiO_xC_y$, $SiC_xN_y$, combinations thereof or the like, is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the dielectric cap layer outside the recess, leaving portions of the dielectric cap layer in the recess to serve as the dielectric cap 220.

Reference is made to FIGS. 15A-15D. Source/drain contacts 240 are formed extending through the ILD layer 195 (and the CESL 190, if present). Formation of the source/drain contacts 240 includes, by way of example and not limitation, performing one or more etching processes to form contact openings extending though the ILD layer 195 to expose the source/drain epitaxial structures 180, depositing one or more metal materials overfilling the contact openings, and then performing a CMP process to remove excessive metal materials outside the contact openings. In some embodiments, the one or more etching processes are selective etching that etches the ILD layer 195 at a faster etch rate than etching the dielectric caps 220 and the gate spacers 170. As a result, the selective etching is performed using the dielectric caps 220 and the gate spacers 170 as an etch mask, such that the contact openings and hence the source/drain contacts 240 are formed self-aligned to the source/drain epitaxial structures 180 without using an additional photolithography process. In that case, the dielectric caps 220 allowing for forming the source/drain contacts 240 can be called SAC caps 220. In some embodiments, metal alloy layers 230 are formed over the source/drain epitaxial structures 180 prior to form the source/drain contacts 240. The metal alloy layers 230 may be silicide when the source/drain epitaxial structures 180 include silicon.

Figure 15A:
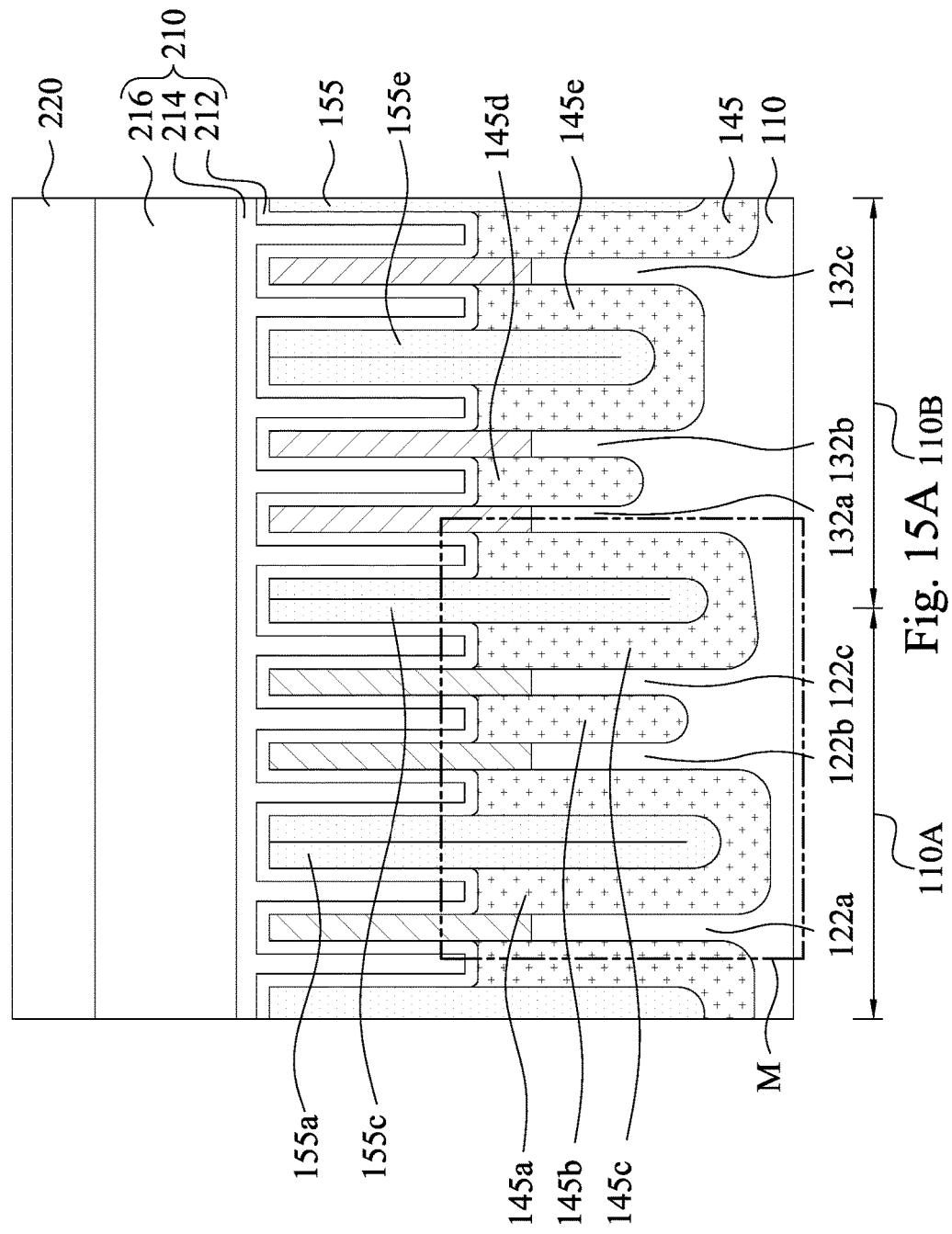
Figure 15D:
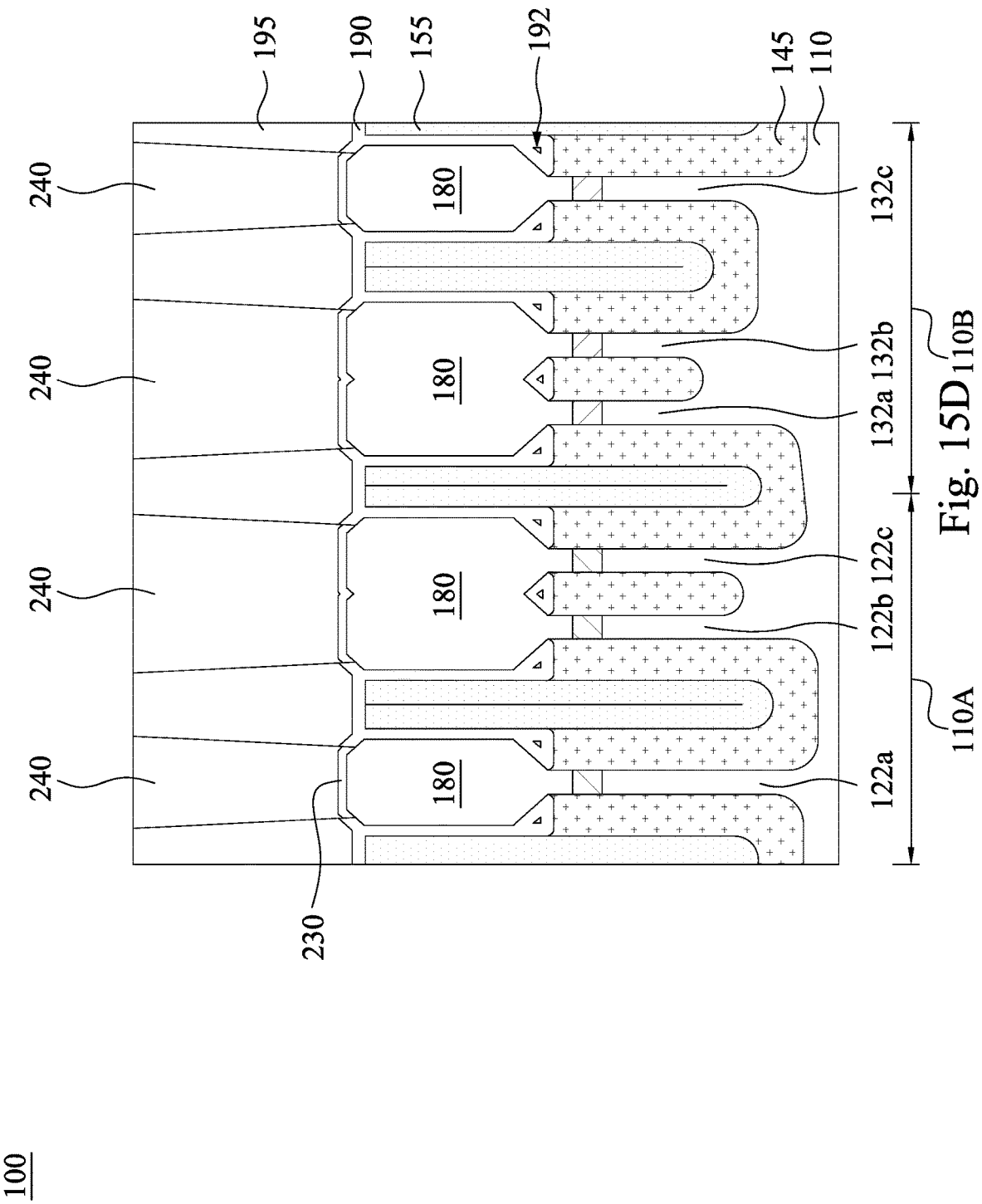

In FIGS. 15A and 15D, the integrated circuit structure 100 includes the isolation structures 145 embedded in the substrate 110 and in contact with the semiconductor fins 122a-122c and 132a-132c. For clarity, some of the isolation structures 145 in FIG. 15A are denoted as 145a, 145b, 145c, 145d, and 145e. The isolation structures 145a and 145e have similar shapes, and the isolation structures 145b and 145d have similar shapes.

Figure 15E:
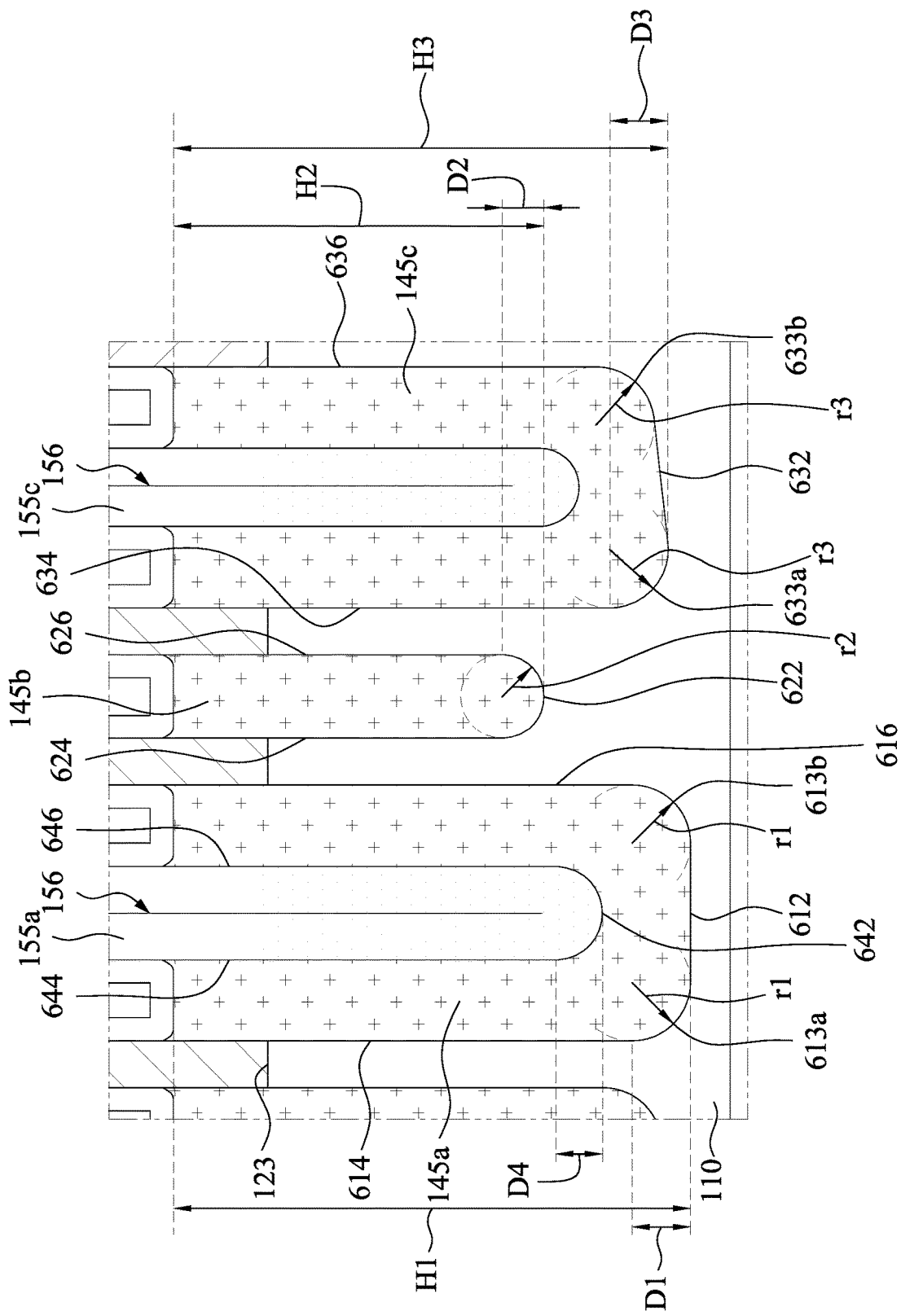
FIG. 15E is an enlarged view of area M in FIG. 15A.

FIG. 15E is an enlarged view of area M in FIG. 15A. Reference is made to FIGS. 15A and 15E. The isolation structure 145a has a bottom surface 612 and opposite sidewalls 614 and 616. The sidewalls 614 and 616 are substantially straight. In some embodiments, the sidewalls 614 and 616 are substantially perpendicular to the top surface 123 of the substrate 110. In some embodiments, the top surface 123 is a top surface of the base portions 12a-12c and 13a-13c (see FIG. 5B). In some embodiments, the sidewalls 614 and 616 are substantially parallel to each other. The sidewall 614 and the bottom surface 612 form a round corner 613a therebetween, and the sidewall 616 and the bottom surface 612 form a round corner 613b therebetween. That is, the round corner 613a is at a bottom of the sidewall 614, and the round corner 613b is at a bottom of the sidewall 616. In some embodiments, each of the round corners 613a and 613b has a radius curvature r1 in a range of about 5 nm to about 20 nm. A distance D1 from a bottom of the round corners 613a and 613b to a top of the round corners 613a and 613b is in a range of about 1 nm to about 3 nm. The isolation structure 145a has a height H1. In some embodiments, a ratio of the distance D1 to the height H1 is about 0.06 to about 0.15. The isolation structure 145e has a similar profile to the isolation structure 145a, and, therefore, a description in this regard will not be repeated hereinafter.

The isolation structure 145b has a bottom surface 622 and opposite sidewalls 624 and 626. The sidewalls 624 and 626 are substantially straight. In some embodiments, the sidewalls 624 and 626 are substantially perpendicular to the top surface 123 of the substrate 110. The bottom surface 622 is convex, and the round bottom surface 622 has a radius curvature r2 in a range of about 5 nm to about 20 nm. In some embodiments, the radius curvature r1 is greater than the radius curvature r2. A distance D2 from a bottom of the bottom surface 622 to a top of the bottom surface 622 is in a range of about 1 nm to about 3 nm. The isolation structure 145b has a height H2. In some embodiments, a ratio of the distance D2 to the height H2 is about 0.06 to about 0.15. The isolation structure 145d has a similar profile to the isolation structure 145b, and, therefore, a description in this regard will not be repeated hereinafter. In some embodiments, the sidewall 624 is substantially parallel to the sidewall 616.

The isolation structure 145c has a bottom surface 632 and opposite sidewalls 634 and 636. The bottom surface 632 is inclined with respect to the bottom surface 612. The sidewalls 634 and 636 are substantially straight. In some embodiments, the sidewalls 634 and 636 are substantially perpendicular to the top surface 123 of the substrate 110. In some embodiments, the sidewalls 634 and 636 are substantially parallel to each other. The sidewall 634 and the bottom surface 632 form a round corner 633a therebetween, and the sidewall 636 and the bottom surface 632 form a round corner 633b therebetween. That is, the round corner 633a is at a bottom of the sidewall 634, and the round corner 633b is at a bottom of the sidewall 636. In some embodiments, each of the round corners 633a and 633b has a radius curvature r3 in a range of about 5 nm to about 20 nm. A distance D3 from a bottom of the round corner 633a to a top of the round corner 633a is in a range of about 1 nm to about 3 nm. The isolation structure 145c has a height H3. In some embodiments, a ratio of the distance D3 to the height H3 is about 0.06 to about 0.15. The bottom surface 632 is inclined to the top surface 123 of the substrate 110.

In FIGS. 15A and 15D, the integrated circuit structure 100 further includes the dielectric fin layers 155 partially embedded in the isolation structures 145. That is, the bottom portions of the dielectric fin layers 155 are surrounded by the isolation structures 145, respectively. For clarity, some of the dielectric fin layers 155 in FIG. 15A are denoted as 155a, 155c, and 155e. In FIG. 15E, the dielectric fin layer 155a has a bottom surface 642 and opposite sidewalls 644 and 646 connected to the bottom surface 642. The bottom surface 642 is curved (or round or convex). The sidewalls 644 and 646 are substantially parallel to each other. A distance D4 from a bottom of the bottom surface 642 to a top of the bottom surface 642 is in a range of about 5 nm to about 20 nm. In some embodiments, the dielectric fin layer 155a has a seam 156 therein. The dielectric fin layers 155c and 155e have similar profiles to the dielectric fin layer 155a, and, therefore, a description in this regard will not be repeated hereinafter.

Figure 16A:
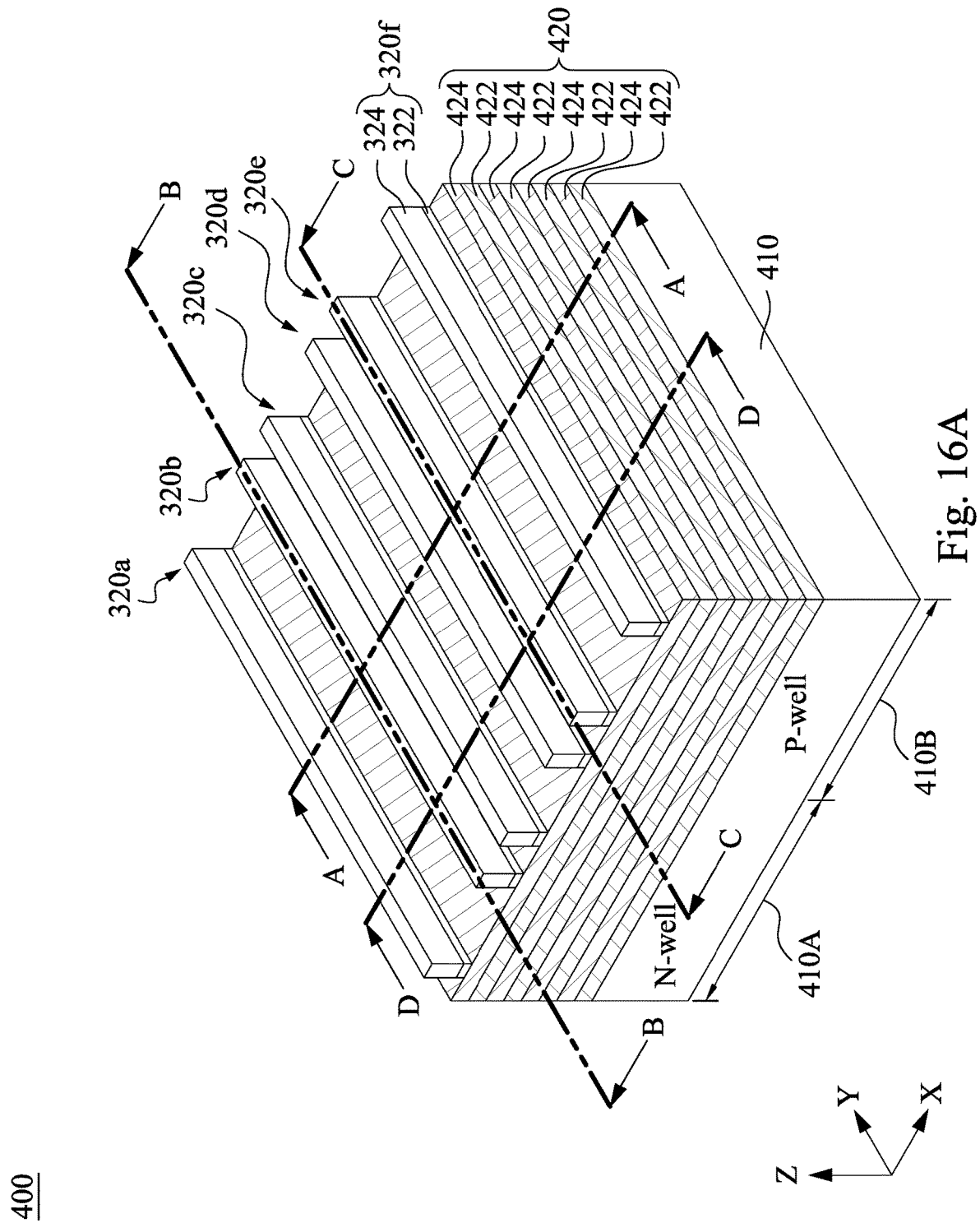

FIGS. 16A-31D illustrate perspective views and cross-sectional views of intermediate stages in the formation of an integrated circuit structure (or a semiconductor device) 400 in accordance with some embodiments of the present disclosure. In addition to the integrated circuit structure, FIG. 16A depicts X-axis, Y-axis, and Z-axis directions. The formed transistors (integrated circuit structure) may include a p-type transistor (such as a p-type GAA FET) and/or an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 16A-31D, and some of the operations described below can be replaced or eliminated, for additional embodiments of the method. The order of the operations/processes may be interchangeable.

FIG. 16A is a perspective view of some embodiments of the integrated circuit structure 400 at intermediate stages in accordance with some embodiments of the present disclosure. FIGS. 16B, 17-24A, 25A, 26A, 27A, 28B, 29A, 30A, and 31A are cross-sectional views of some embodiments of the integrated circuit structure 400 at intermediate stages along a first cut (e.g., cut A-A in FIG. 16A). FIGS. 24B, 25B, 26B, 27B, 28B, 29B, 30B, and 31B are cross-sectional views of some embodiments of the integrated circuit structure 400 at intermediate stages along a second cut (e.g., cut B-B in FIG. 16A). FIGS. 24C, 25C, 26C, 27C, 28C, 29C, 30C, and 31C are cross-sectional views of some embodiments of the integrated circuit structure 400 at intermediate stages along a second cut (e.g., cut C-C in FIG. 16A). FIGS. 24D, 25D, 26D, 27D, 28D, 29D, 30D, and 31D are cross-sectional views of some embodiments of the integrated circuit structure 400 at intermediate stages along a second cut (e.g., cut D-D in FIG. 16A).

Figure 16B:
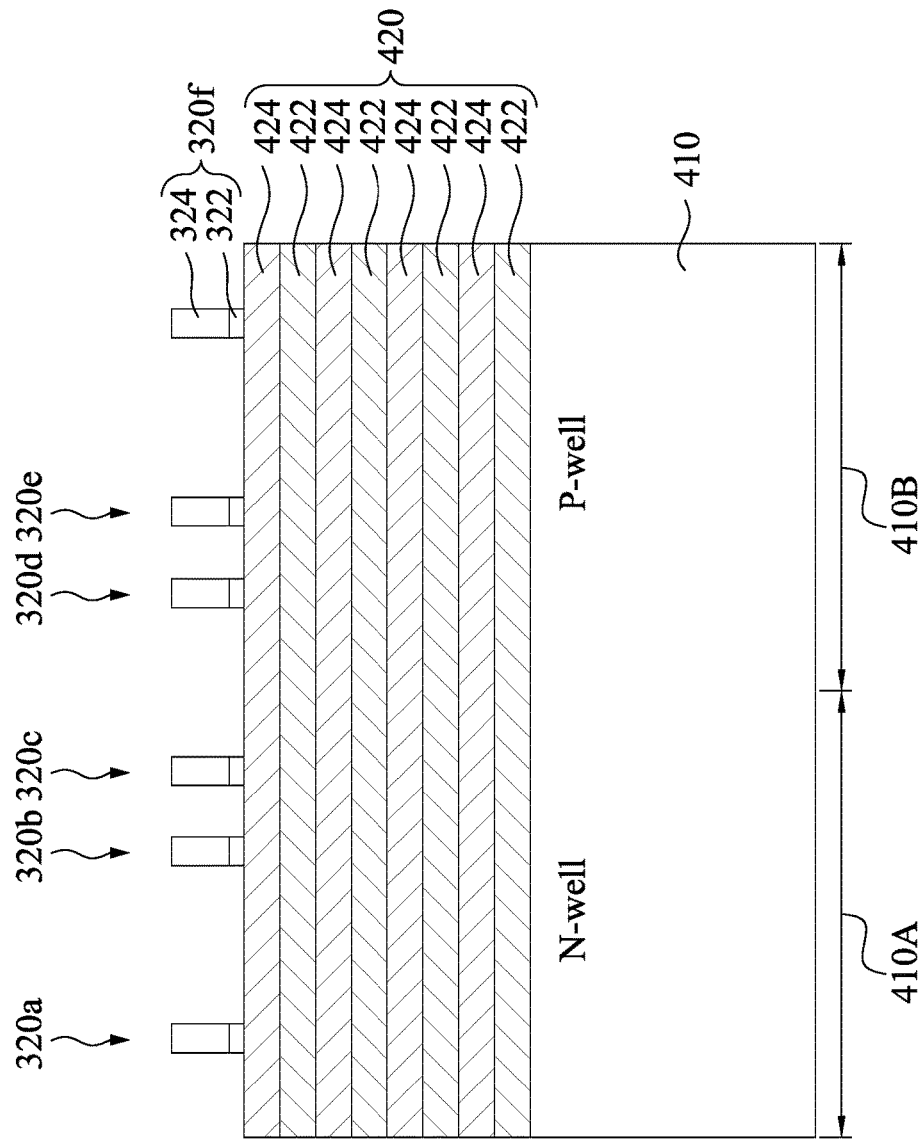

Reference is made to FIGS. 16A and 16B. An epitaxial stack 420 is formed over a substrate 410. In some embodiments, the substrate 410 may include silicon (Si). Alternatively, the substrate 410 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or combinations thereof) or other appropriate semiconductor materials. In some embodiments, the substrate 410 may include a semiconductor-on-insulator (SOI) structure such as a buried dielectric layer. Also alternatively, the substrate 410 may include a buried dielectric layer such as a buried oxide (BOX) layer, such as that formed by a method referred to as separation by implantation of oxygen (SIMOX) technology, wafer bonding, SEG, or another appropriate method. The substrate 410 includes a P-type device region 410A and an N-type device region 410B.

The epitaxial stack 420 includes epitaxial layers 422 of a first composition interposed by epitaxial layers 424 of a second composition. The first and second compositions can be different. In some embodiments, the epitaxial layers 422 are SiGe and the epitaxial layers 424 are silicon (Si). However, other embodiments are possible including those that provide for a first composition and a second composition having different oxidation rates and/or etch selectivity. In some embodiments, the epitaxial layers 422 include SiGe and where the epitaxial layers 424 include Si, the Si oxidation rate of the epitaxial layers 424 is less than the SiGe oxidation rate of the epitaxial layers 422.

The epitaxial layers 424 or portions thereof may form nanostructure channel(s) of an N-type nanostructure transistor, and the epitaxial layers 422 or portions thereof may form nanostructure channel(s) of a P-type nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry.

It is noted that four layers of the epitaxial layers 422 and four layers of the epitaxial layers 424 are alternately arranged as illustrated in FIG. 16A, which is for illustrative purposes only and not intended to be limiting beyond what is specifically recited in the claims. It can be appreciated that any number of epitaxial layers can be formed in the epitaxial stack 420; the number of layers depending on the desired number of channels regions for the transistor. In some embodiments, each of the numbers of the epitaxial layers 422 and 424 is between 2 and 10.

As described in more detail below, the epitaxial layers 424 may serve as channel region(s) for a subsequently-formed N-type semiconductor device, and the epitaxial layers 422 may serve as channel region(s) for a subsequently-formed P-type semiconductor device. The epitaxial layers 422 (for the N-type semiconductor device) and the epitaxial layers 424 (for the P-type semiconductor device) in channel regions(s) may eventually be removed and serve to define vertical distances between adjacent channel region(s) for a subsequently-formed multi-gate device and the thickness is chosen based on device performance considerations. Accordingly, for the N-type semiconductor device, the epitaxial layers 422 may also be referred to as sacrificial layers, and epitaxial layers 424 may also be referred to as channel layers; for the P-type semiconductor device, the epitaxial layers 424 may also be referred to as sacrificial layers, and epitaxial layers 422 may also be referred to as channel layers.

By way of example, epitaxial growth of the layers of the stack 420 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 424 include the same material as the substrate 410. In some embodiments, the epitaxial layers 422 and 424 include a different material than the substrate 410. As stated above, in at least some examples, the epitaxial layers 422 include an epitaxially grown silicon germanium (SiGe) layer and the epitaxial layers 424 include an epitaxially grown silicon (Si) layer. Alternatively, in some embodiments, either of the epitaxial layers 422 and 424 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 422 and 424 may be chosen based on providing differing oxidation and/or etching selectivity properties. In some embodiments, the epitaxial layers 422 and 424 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Mask patterns 320a-320f are formed over the epitaxial stack 420. Each of the mask patterns 320a-320f includes a mask layer 324 and a pad layer 322 between the mask layer 324 and the substrate 410. In some embodiments, the mask layer 324 is a nitride layer, and the pad layer 322 is an oxide layer. In some embodiments, the mask patterns 320a-320f have different pitches according to different layout designs. For example, a pitch between the mask patterns 320a and 320b is greater than a pitch between the mask patterns 320b and 320c, and/or a pitch between the mask patterns 320e and 320f is greater than a pitch between the mask patterns 320d and 320e. The pitch between the mask patterns 320a and 320b may be substantially the same as the pitch between the mask patterns 320e and 320f, and/or the pitch between the mask patterns 320b and 320c may be substantially the same as the pitch between the mask patterns 320d and 320e. Further, a pitch between the mask patterns 320c and 320d may be different from the pitch between the mask patterns 320a and 320b and the pitch between the mask patterns 320b and 320c. For example, the pitch between the mask patterns 320c and 320d is less than the pitch between the mask patterns 320a and 320b and greater than the pitch between the mask patterns 320b and 320c.

Figure 17:
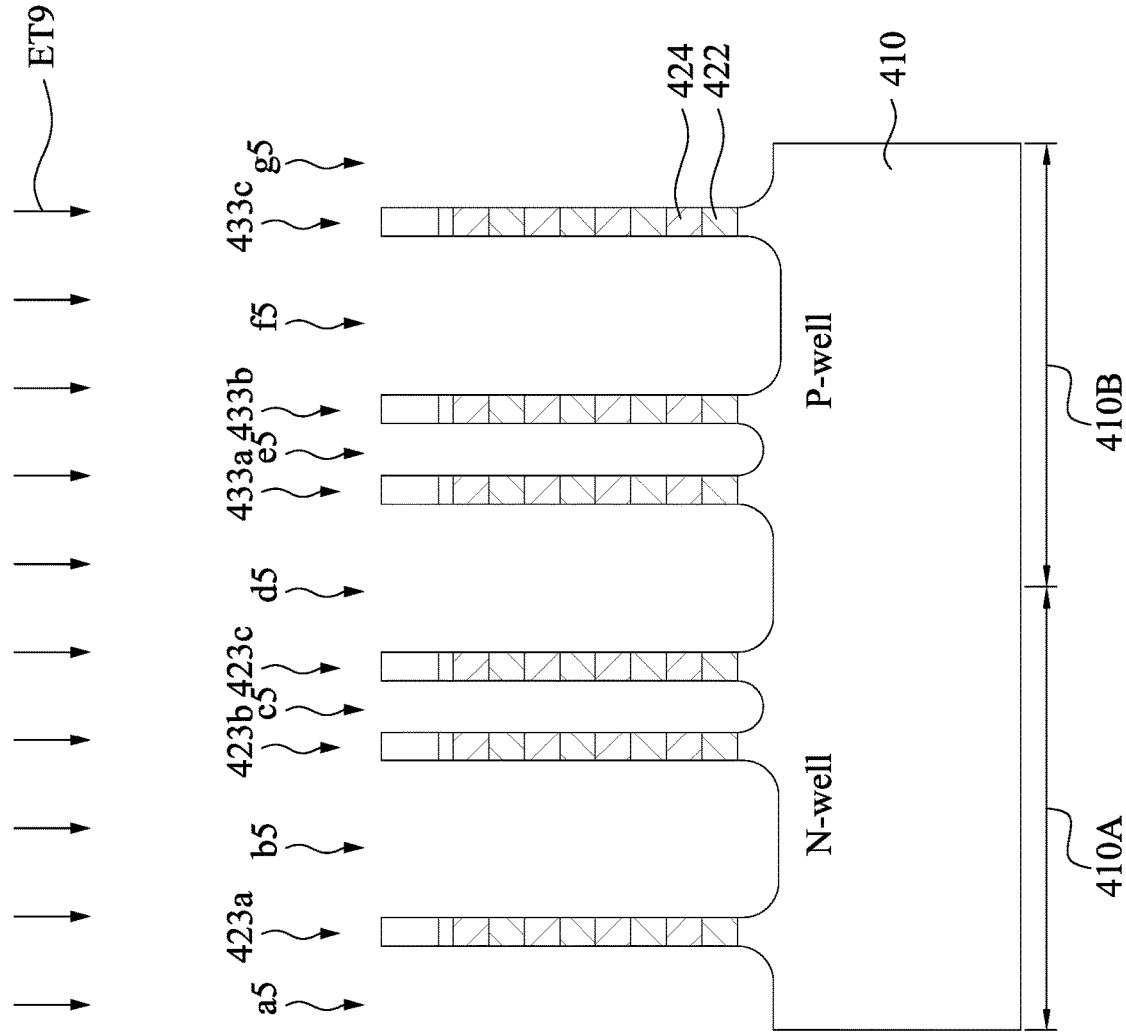

Reference is made to FIG. 17. A ninth etching process ET9 is performed on the structure in FIGS. 16A and 16B. The epitaxial stack 420 (see FIGS. 16A and 16B) is patterned by using the mask patterns 320a-320f as etch masks, such that the epitaxial stack 420 is patterned into channel structures 423a, 423b, 423c, 433a, 433b, and 433c and trenches a5, b5, c5, d5, e5, f5, and g5 extending in the Y direction. In FIG. 17, six channel structures 423a, 423b, 423c, 433a, 433b, and 433c are arranged in the X direction. But the number of the channel structures is not limited to, and may be as small as one or more.

In some embodiments, the ninth etching process ET9 is an anisotropic etching process that uses the mask patterns 320a-320f as etch masks. After the anisotropic etching, the top surface of the substrate 410 is exposed by the trenches a5-g5. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 18A:
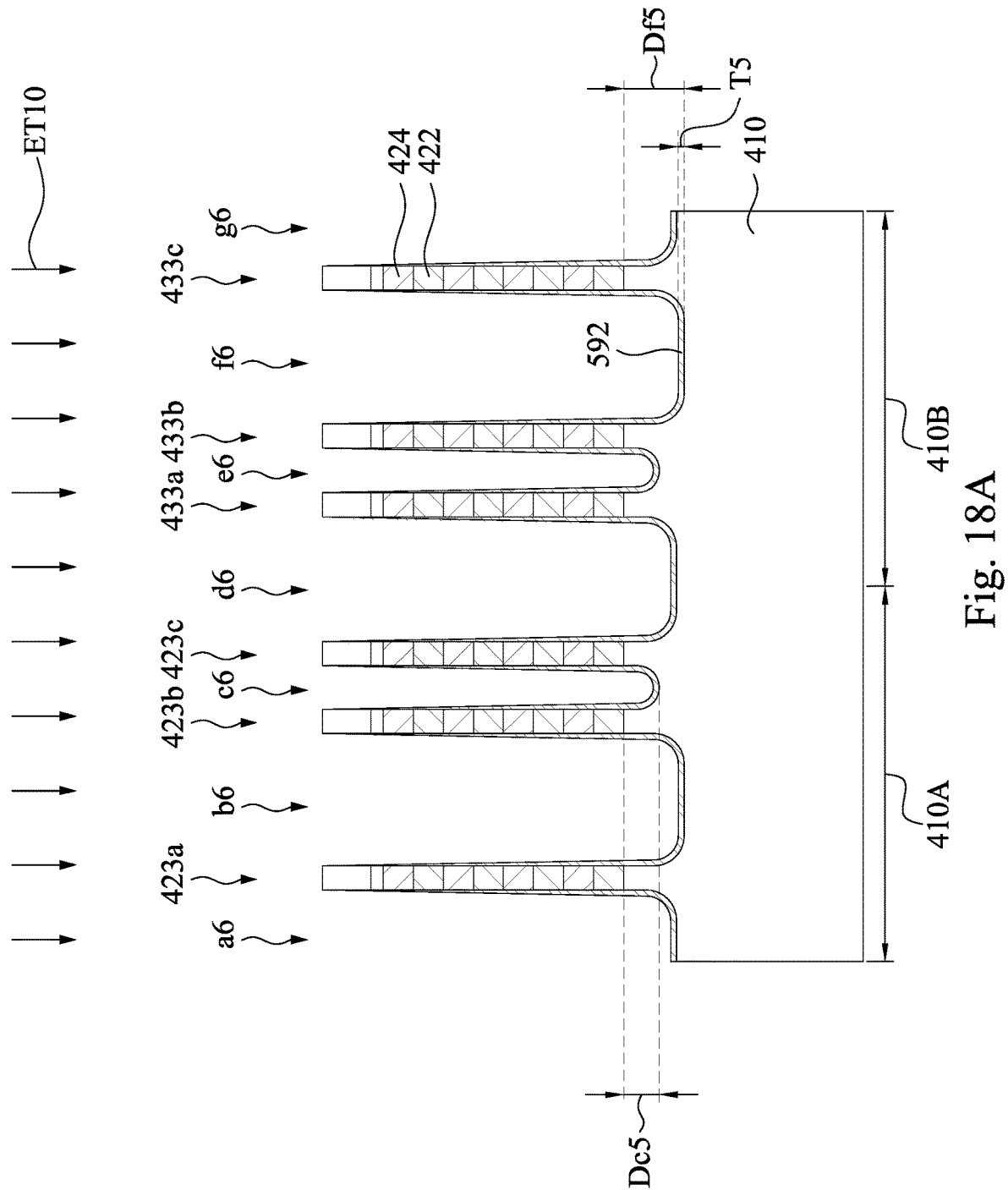

Reference is made to FIG. 18A. A tenth etching process ET10 is performed on the structure in FIG. 17. In some embodiments, the tenth etching process ET10 is at least one of a plasma etching process, a reactive ion etching (RIE) process, a wet etching process, or other applicable techniques. In some embodiments, the tenth etching process ET10 utilizes at least one of $CF_4$, $Cl_2$, $CHF_3$, or other applicable materials. For example, the tenth etching process ET10 uses a carbon-poor fluorine-based etchant gas (such as $CF_4$, $NF_3$, etc.) or another etchant gas, and can use a carbon-rich polymer-passivating gas (such as $CHF_3$, $CH_2F_2$, $CH_3F$, $C_4F_6$, $C_4F_8$, etc.) or another polymer gas, and a ratio of the etchant gas to the polymer-passivating gas is tuned to implement the tenth etching process ET10 and the following etching processes.

The tenth etching process ET10 etches the substrate by using the channel structures 423a, 423b, 423c, 433a, 433b, and 433c as etching masks. The tenth etching process ET10 forms trenches a6, b6, c6, d6, e6, f6, and g6 in the substrate 410. In some embodiments, since the pitch between the mask patterns 320b and 320c is smaller than the pitch between the mask patterns 320a and 320b, the trench c6 is shallower than the trench b6. Similarly, the trench e6 is shallower than the trench f6. The depth of the trench a6 is determined by a pitch between the mask pattern 320a and another mask pattern next to the mask pattern 320a, and the depth of the trench g6 is determined by a pitch between the mask pattern 320f and another mask pattern next to the mask pattern 320f.

In some embodiments, the carbon-rich polymer-passivating gas is polymerized during the tenth etching process ET10 and form polymer layers 592 on surfaces of the trenches a6, b6, c6, d6, e6, f6, and g6. In some embodiments, since the substrate 410 and the epitaxial stack 420 include silicon (and germanium), the polymer layers 592 include silicon (and germanium), or other applicable materials from the substrate 410 being etched by the tenth etching process ET10. In some embodiments, the polymer layers 592 include elements from a gas used in the tenth etching process ET10, such as carbon or other applicable materials. In some embodiments, the polymer layers 592 have a thickness T5.

Figure 18B:
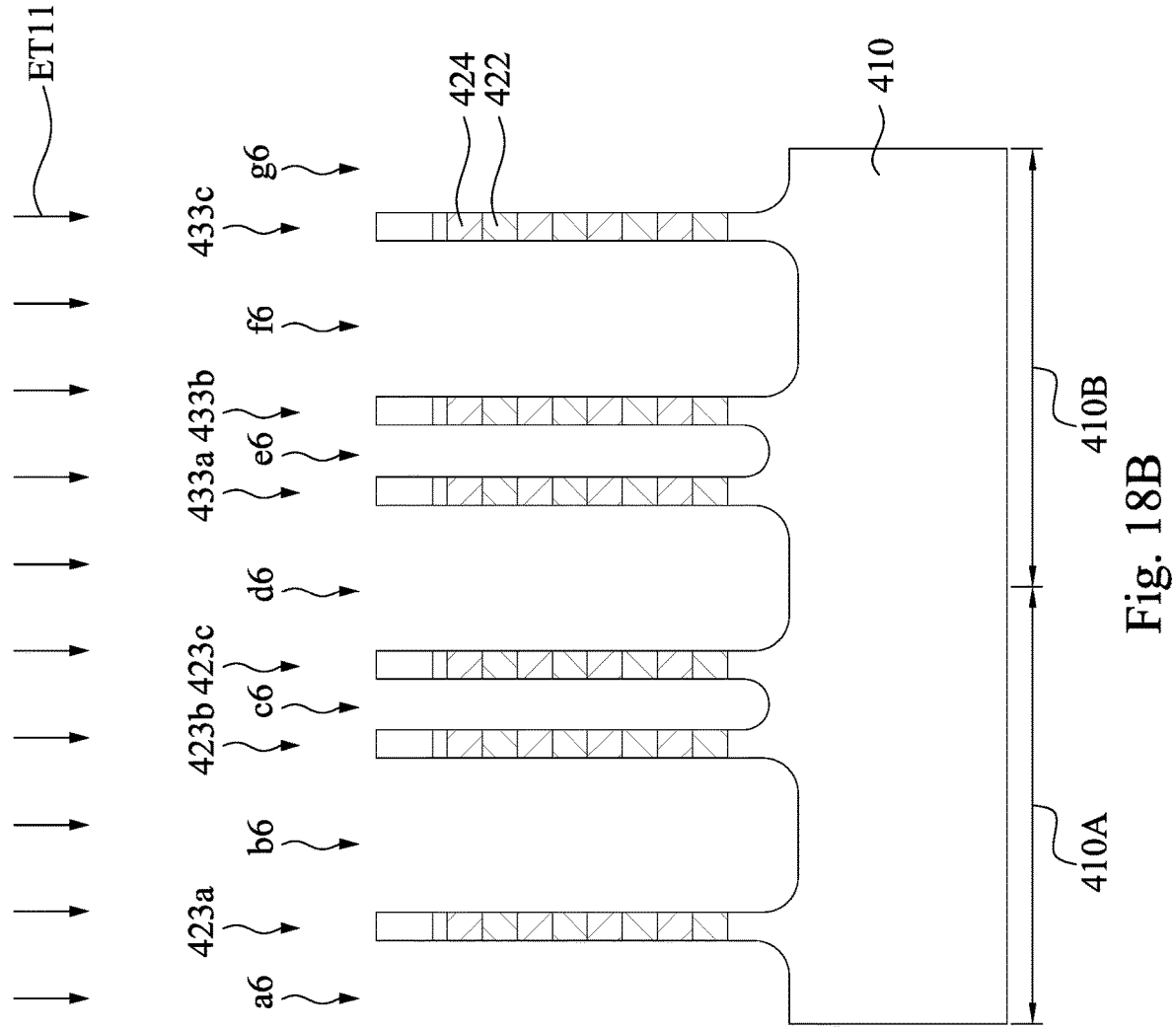

Reference is made to FIG. 18B. The polymer layers 592 (see FIG. 18A) are removed by an eleventh etching process ET11, in accordance with some embodiments. In some embodiments, the eleventh etching process ET11 is at least one of a plasma etching process, a reactive ion etching (RIE) process, a wet etching process, or other applicable techniques. According to some embodiments, the eleventh etching process ET11 utilizes fluorine. According to some embodiments, the eleventh etching process ET11 utilizes at least one of $CF_4$, $SF_6$, $NF_3$, $CHF_3$, or other applicable materials. In some embodiments, one or more of the materials utilized in the eleventh etching process ET11 are gaseous. According to some embodiments, the eleventh etching process ET11 is different than the tenth etching process ET10 at least in terms of at least one of pressure, temperature, etchants, or other applicable parameters such that the polymer layers 592 formed by the tenth etching process ET10 is removed by the eleventh etching process ET11.

Figure 19A:
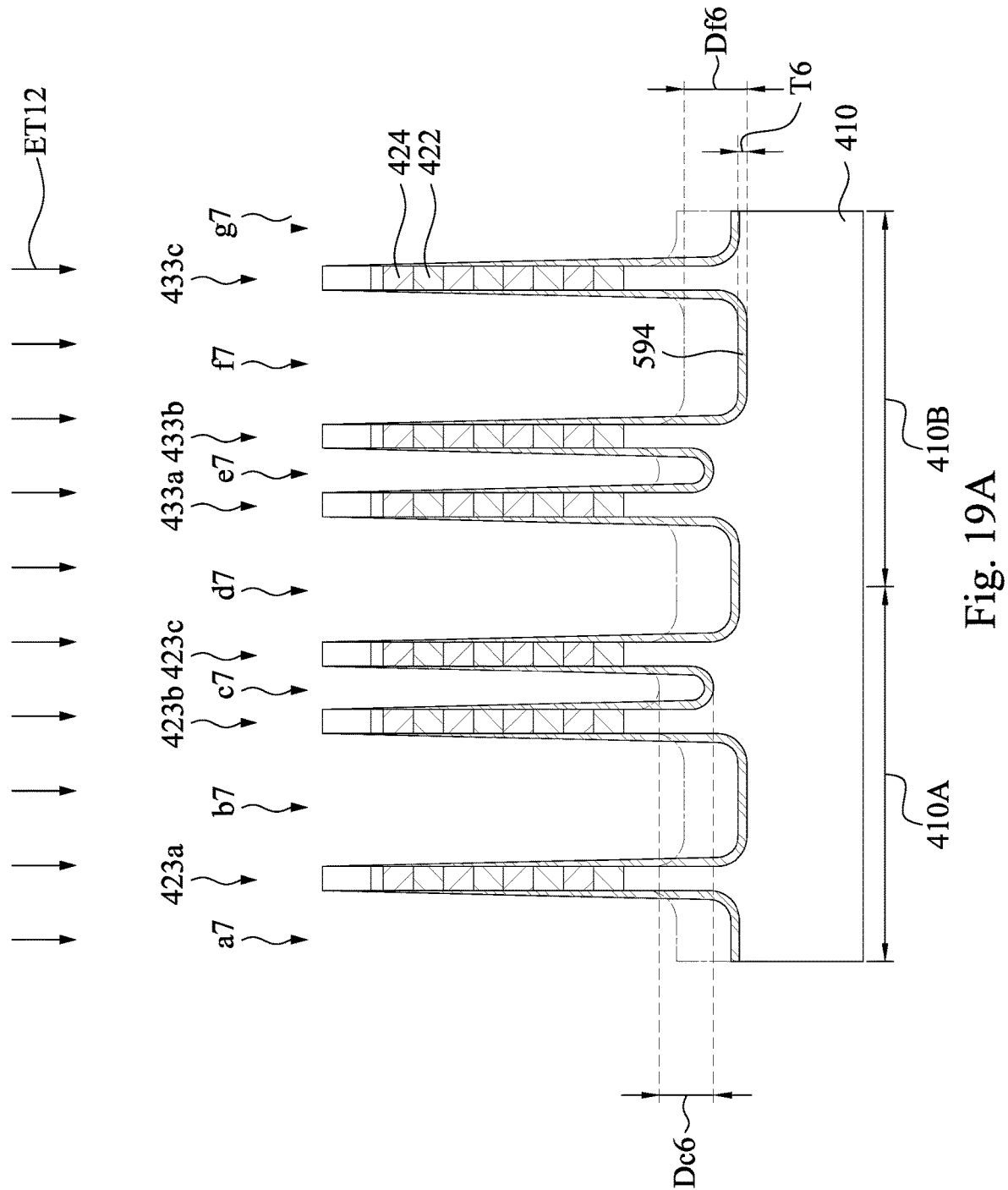

Reference is made to FIG. 19A. A twelfth etching process ET12 is performed on the structure in FIG. 18B. The twelfth etching process ET12 deepens the trenches a6, b6, c6, d6, e6, f6, and g6 of FIG. 18B to form trenches a7, b7, c7, d7, e7, f7, and g7 in the substrate 410. In some embodiments, the twelfth etching process ET12 is substantially the same as the tenth etching process ET10 expect the flow rate of the etchant gas and the polymer-passivating gas and/or the ratio of the etchant gas to the polymer-passivating gas.

In some embodiments, the flow rate of the etchant gas and the polymer-passivating gas of the twelfth etching process ET12 is higher than the flow rate of the etchant gas and the polymer-passivating gas of the tenth etching process ET10. As such, the etching depths of the twelfth etching process ET12 is greater than the etching depths of the tenth etching process ET10. For example, the etching depth Df6 in the twelfth etching process ET12 is greater than the etching depth Df5 in the tenth etching process ET10 (see FIG. 18A), and/or the etching depth Dc6 in the twelfth etching process ET12 is greater than the etching depth Dc5 in the tenth etching process ET10 (see FIG. 18A). For clarity, the profiles of the trenches a6, b6, c6, d6, e6, f6, and g6 in FIG. 18B is illustrated in FIG. 19A with dash-dotted lines.

In some embodiments, the carbon-rich polymer-passivating gas is polymerized during the twelfth etching process ET12 and form polymer layers 594 on surfaces of the trenches a7, b7, c7, d7, e7, f7, and g7. In some embodiments, the ratio of the etchant gas to the polymer-passivating gas of the twelfth etching process ET12 is different from that of the tenth etching process ET10. For example, the amount of the fluorine-based etchant gas (e.g., $CF_4$) of the twelfth etching process ET12 is greater than the amount of the polymer-passivating gas of the tenth etching process ET10. With more fluorine, the lateral etching rate of the plasma etching is increased, and the bottoms of the trenches a7, b7, c7, d7, e7, f7, and g7 are enlarged. Further, since the etching depth in the twelfth etching process ET12 is greater than that in the tenth etching process ET10, more polymer-passivating gas are deposited in the trenches a7, b7, c7, d7, e7, f7, and g7, such that the thickness T6 of the polymer layers 594 is greater than the thickness T5 of the polymer layers 592 (see FIG. 18A).

Figure 19B:
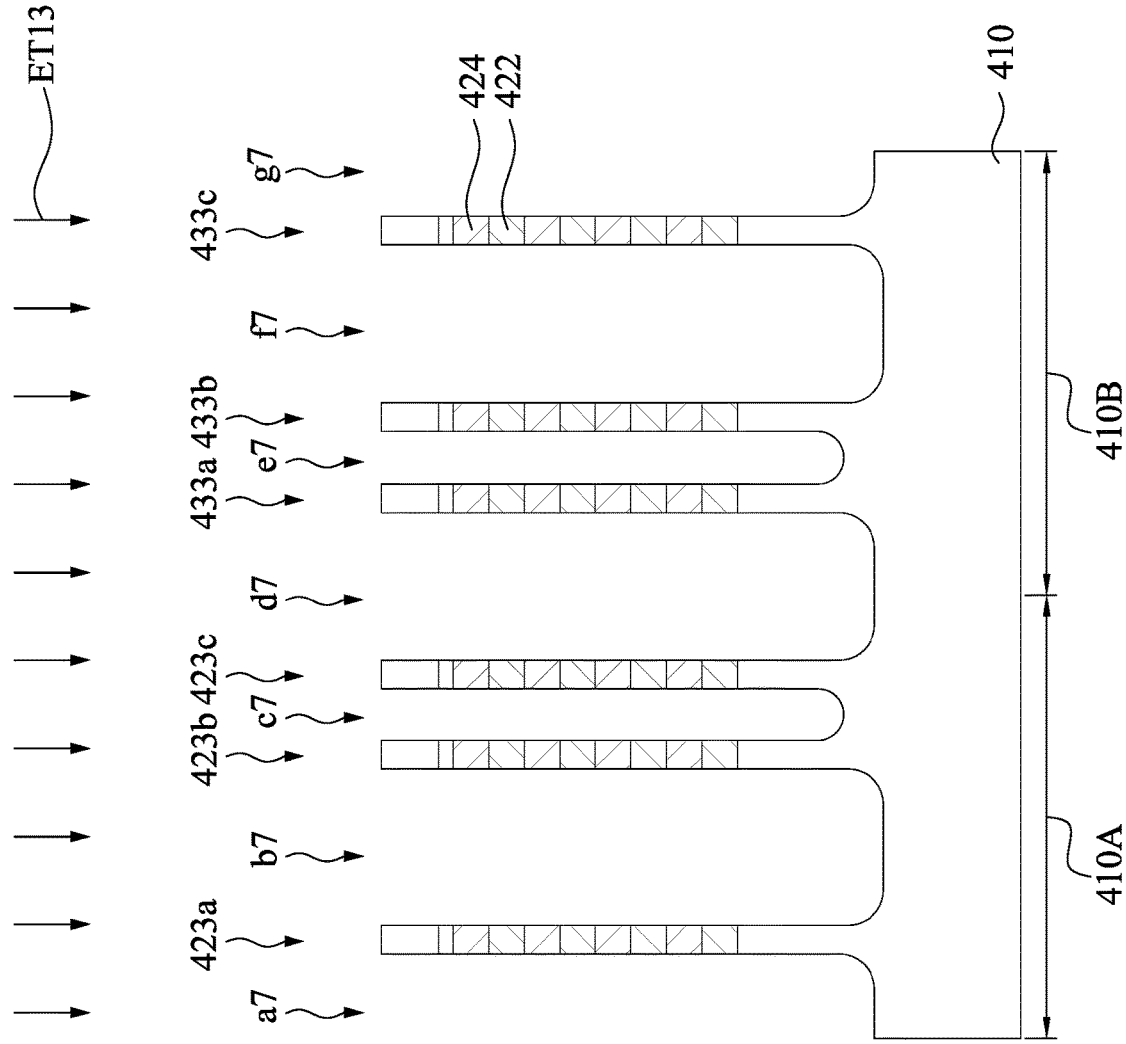

Reference is made to FIG. 19B. The polymer layers 594 (see FIG. 19A) are removed by a thirteenth etching process ET13, in accordance with some embodiments. In some embodiments, the thirteenth etching process ET13 is at least one of a plasma etching process, a reactive ion etching (RIE) process, a wet etching process, or other applicable techniques. According to some embodiments, the thirteenth etching process ET13 utilizes fluorine. According to some embodiments, the thirteenth etching process ET13 utilizes at least one of $CF_4$, $SF_6$, $NF_3$, $CHF_3$, or other applicable materials. In some embodiments, one or more of the materials utilized in the thirteenth etching process ET13 are gaseous. According to some embodiments, the thirteenth etching process ET13 is different than the twelfth etching process ET12 at least in terms of at least one of pressure, temperature, etchants, or other applicable parameters such that the polymer layers 594 formed by the twelfth etching process ET12 is removed by the thirteenth etching process ET13.

Figure 20A:
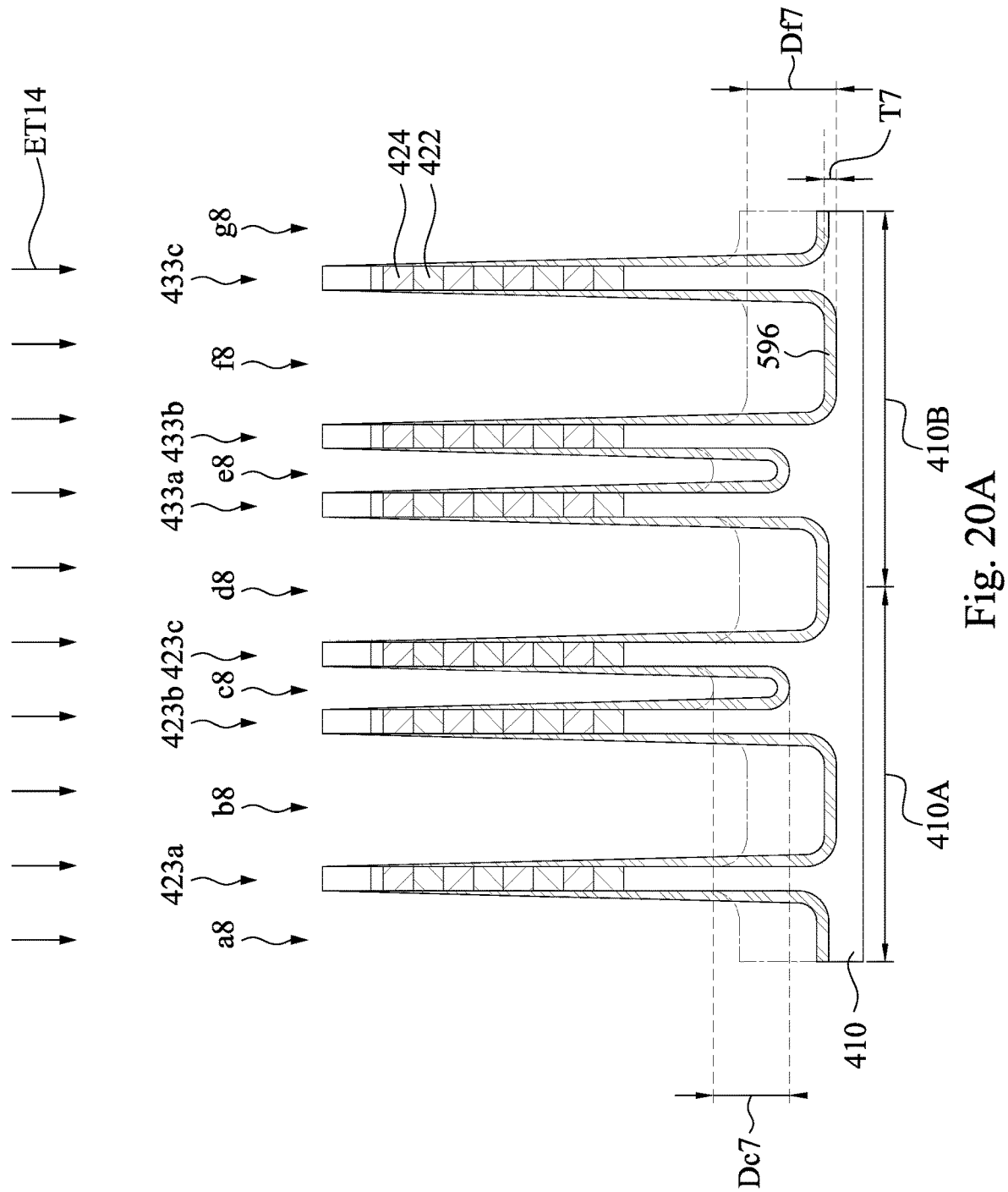

Reference is made to FIG. 20A. A fourteenth etching process ET14 is performed on the structure in FIG. 19B. The fourteenth etching process ET14 deepens the trenches a7, b7, c7, d7, e7, f7, and g7 of FIG. 19B to form trenches a8, b8, c8, d8, e8, f8, and g8 in the substrate 410. In some embodiments, the fourteenth etching process ET14 is substantially the same as the twelfth etching process ET12 expect the flow rate of the etchant gas and the polymer-passivating gas and/or the ratio of the etchant gas to the polymer-passivating gas.

In some embodiments, the flow rate of the etchant gas and the polymer-passivating gas of the fourteenth etching process ET14 is higher than the flow rate of the etchant gas and the polymer-passivating gas of the twelfth etching process ET12. As such, the etching depths of the fourteenth etching process ET14 is greater than the etching depths of the twelfth etching process ET12. For example, the etching depth Df7 in the fourteenth etching process ET14 is greater than the etching depth Df6 in the twelfth etching process ET12 (see FIG. 19A), and/or the etching depth Dc7 in the fourteenth etching process ET14 is greater than the etching depth Dc6 in the twelfth etching process ET12 (see FIG. 19A). For clarity, the profiles of the trenches a7, b7, c7, d7, e7, f7, and g7 in FIG. 19B is illustrated in FIG. 20A with dash-dotted lines.

In some embodiments, the carbon-rich polymer-passivating gas is polymerized during the fourteenth etching process ET14 and form polymer layers 596 on surfaces of the trenches a8, b8, c8, d8, e8, f8, and g8. In some embodiments, the ratio of the etchant gas to the polymer-passivating gas of the fourteenth etching process ET14 is different from that of the twelfth etching process ET12. For example, the amount of the fluorine-based etchant gas (e.g., $CF_4$) of the fourteenth etching process ET14 is greater than the amount of the polymer-passivating gas of the twelfth etching process ET12. With more fluorine, the lateral etching rate of the plasma etching is increased, and the bottoms of the trenches a8, b8, c8, d8, e8, f8, and g8 are enlarged. Further, since the etching depth in the fourteenth etching process ET14 is greater than that in the twelfth etching process ET12, more polymer-passivating gas are deposited in the trenches a8, b8, c8, d8, e8, f8, and g8, such that the thickness T7 of the polymer layers 596 is greater than the thickness T6 of the polymer layers 594 (see FIG. 19A).

Figure 20B:
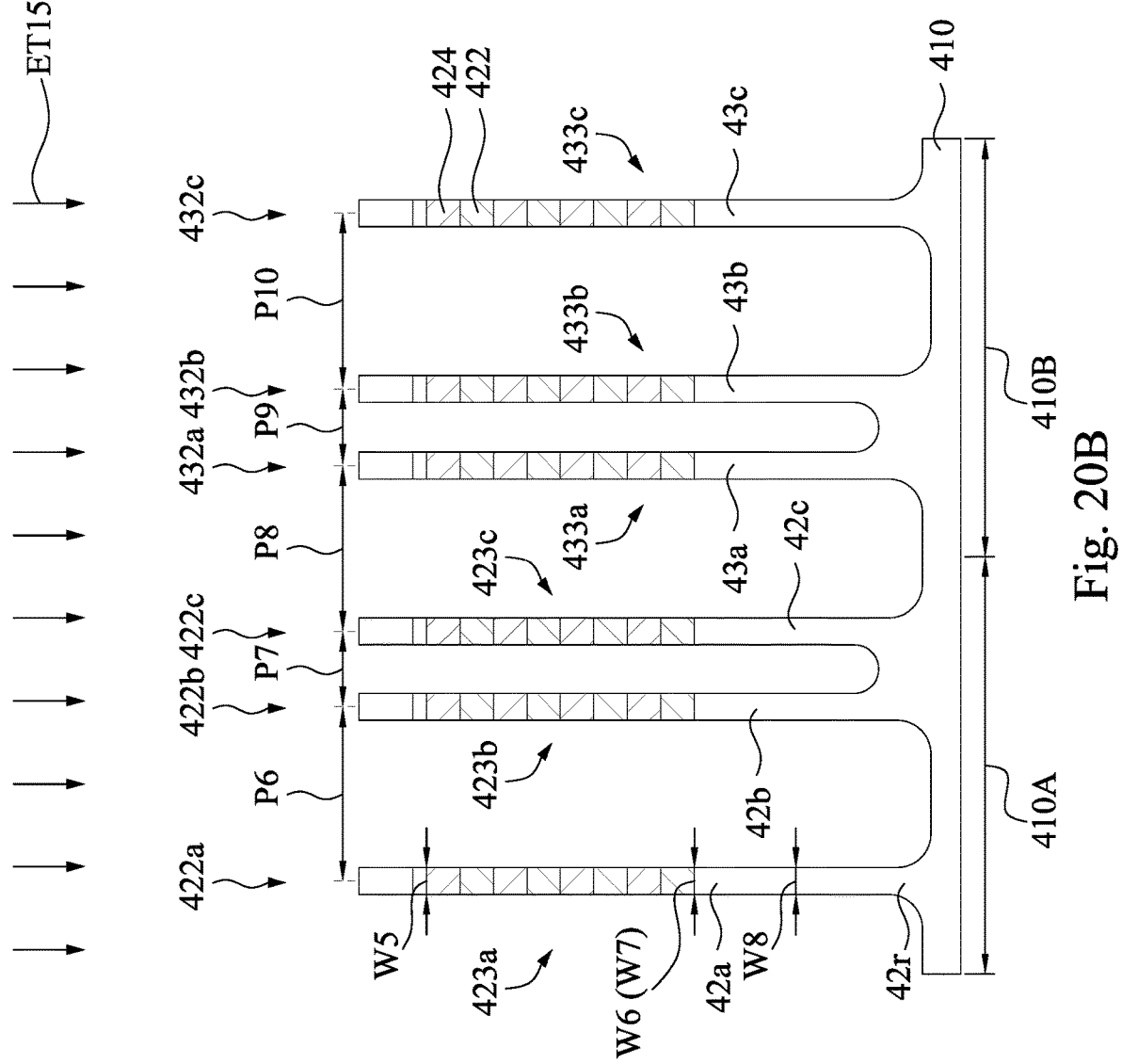

Reference is made to FIG. 20B. The polymer layers 596 (see FIG. 20A) are removed by a fifteenth etching process ET15, in accordance with some embodiments. In some embodiments, the fifteenth etching process ET15 is at least one of a plasma etching process, a reactive ion etching (RIE) process, a wet etching process, or other applicable techniques. According to some embodiments, the fifteenth etching process ET15 utilizes fluorine. According to some embodiments, the fifteenth etching process ET15 utilizes at least one of $CF_4$, $SF_6$, $NF_3$, $CHF_3$, or other applicable materials. In some embodiments, one or more of the materials utilized in the fifteenth etching process ET15 are gaseous. According to some embodiments, the fifteenth etching process ET15 is different than the fourteenth etching process ET14 at least in terms of at least one of pressure, temperature, etchants, or other applicable parameters such that the polymer layers 596 formed by the fourteenth etching process ET14 is removed by the fifteenth etching process ET15.

In some embodiments, one etching cycle includes a polymer deposition process (e.g., the tenth etching process ET10, the twelfth etching process ET12, and the fourteenth etching process ET14) and a polymer removal process (e.g., the eleventh etching process ET11, the thirteenth etching process ET13, and the fifteenth etching process ET15). It is noted that although 3 cycles are illustrated, less or more than 3 cycles can be performed to form the trenches a8, b8, c8, d8, e8, f8, and g8 in other embodiments.

In FIG. 20B, fin structures 422a, 422b, 422c, 432a, 432b, and 432c are formed. The fin structure 422a includes a base portion 42a and the channel structure 423a, the fin structure 422b includes a base portion 42b and the channel structure 423b, the fin structure 422c includes a base portion 42c and the channel structure 423c, the fin structure 432a includes a base portion 43a and the channel structure 433a, the fin structure 432b includes a base portion 43b and the channel structure 433b, and the fin structure 432c includes a base portion 43c and the channel structure 433c.

Each of the sidewalls of the channel structures 423a, 423b, 423c, 433a, 433b, and 433c are substantially straight. That is, a width of each of the channel structures 423a, 423b, 423c, 433a, 433b, and 433c at the top thereof is substantially the same as a width of each of the channel structures 423a, 423b, 423c, 433a, 433b, and 433c at the bottom thereof. Take the channel structure 423a as an example, a top width W5 of the channel structure 423a is substantially the same as a bottom width W6 of the channel structure 423a. Stated another way, a difference between the top width W5 and the bottom width W6 is less than about 1 nm.

Each of the sidewalls of the base portions 42a, 42b, 42c, 43a, 43b, and 43c are substantially straight. That is, a width of each of the base portions 42a, 42b, 42c, 43a, 43b, and 43c at the top thereof is substantially the same as a width of each of the base portions 42a, 42b, 42c, 43a, 43b, and 43c at the bottom thereof. Take the base portion 42a as an example, a top width W7 of the base portion 42a is substantially the same as a middle width W8 of the base portion 42a. Stated another way, a difference between the top width W7 and the middle width W8 is less than about 1 nm. It is noted that the middle width W8 is a width of the base portion 42a at a middle position of the top surface of the base portion 42a and a root 42r of the base portion 42a.

In some embodiments, each of the fin structures 422a, 422b, 422c, 432a, 432b, and 432c has a height in a range of about 90 nm to about 300 nm. If the height is greater than about 300 nm, the fin structures 422a, 422b, 422c, 432a, 432b, and 432c may collapse; if the height is less than about 90 nm, the channel structures 423a, 423b, 423c, 433a, 433b, and 433c may not be well controlled.

The fin structures 422a and 422b have a pitch P6 therebetween, the fin structures 422b and 422c have a pitch P7 therebetween, the fin structures 422c and 432a have a pitch P8 therebetween, the fin structures 432a and 432b have a pitch P9 therebetween, and the fin structures 432b and 432c have a pitch P10 therebetween. As mentioned above, the pitch P6 is substantially the same as the pitch P10, and the pitch P7 is substantially the same as the pitch P9. In some embodiments, the pitch P8 is greater than the pitch P7 (P9) and smaller than the pitch P6 (P10). In some embodiments, each of the pitches P6-P10 is in a range of about 15 nm to about 100 nm. If each of the pitches P6-P10 is less than about 15 nm, the loading effect of the integrated circuit structure 400 may be worse; if each of the pitches P6-P10 is greater than about 100 nm, the layout area of the integrated circuit structure 400 may be large.

Reference is made to FIG. 21. An isolation layer 440 is formed over the substrate 410 and in the trenches a8, b8, c8, d8, e8, f8, and g8. In some embodiments, the isolation layer 440 is formed to conformally cover the fin structures 422a-422c and 432a-432c by suitable deposition process, such as atomic layer deposition (ALD). Thus, plural trenches 442 are formed in the isolation layer 440 and between the fin structures 422a-422c or between the fin structures 432a-432c.

In some embodiments, if two adjacent fins are too close, the isolation layer 440 may be filled in the space between the fins. For example, in FIG. 21, since the fin structures 422b and 422c (or 432a and 432b) are close enough, the isolation layer 440 is filled in the space between the adjacent fin structures 422b and 422c (or 432a and 432b). That is, no trench is formed between the fin structures 422b and 422c (or 432a and 432b).

Subsequently, a dielectric fin layer 450 is formed over the substrate 410 and covers the isolation layer 440. The dielectric fin layer 450 is filled in the trenches 442 in the isolation layer 440. In some embodiments, filling of the trenches 442 may be performed by an ALD process. In some embodiments, the trenches 442 may be filled by suitable processes such as, for example, ALD, CVD, FCVD, PVD, MBE, HDPCVD, MOCVD, RPCVD, PECVD, other suitable methods, and/or combinations thereof. In some embodiments, the dielectric fin layer 450 includes silicon oxynitride (SiON), silicon carbon nitride (SiCN), silicon oxygen carbon nitride (SiOCN), or metal oxides such as, for example, hafnium oxide ($HfO_2$), zirconium oxide ($ZrO_2$), aluminum oxide ($Al_2O_3$), other suitable metal oxides, and/or combinations thereof.

Figure 22:
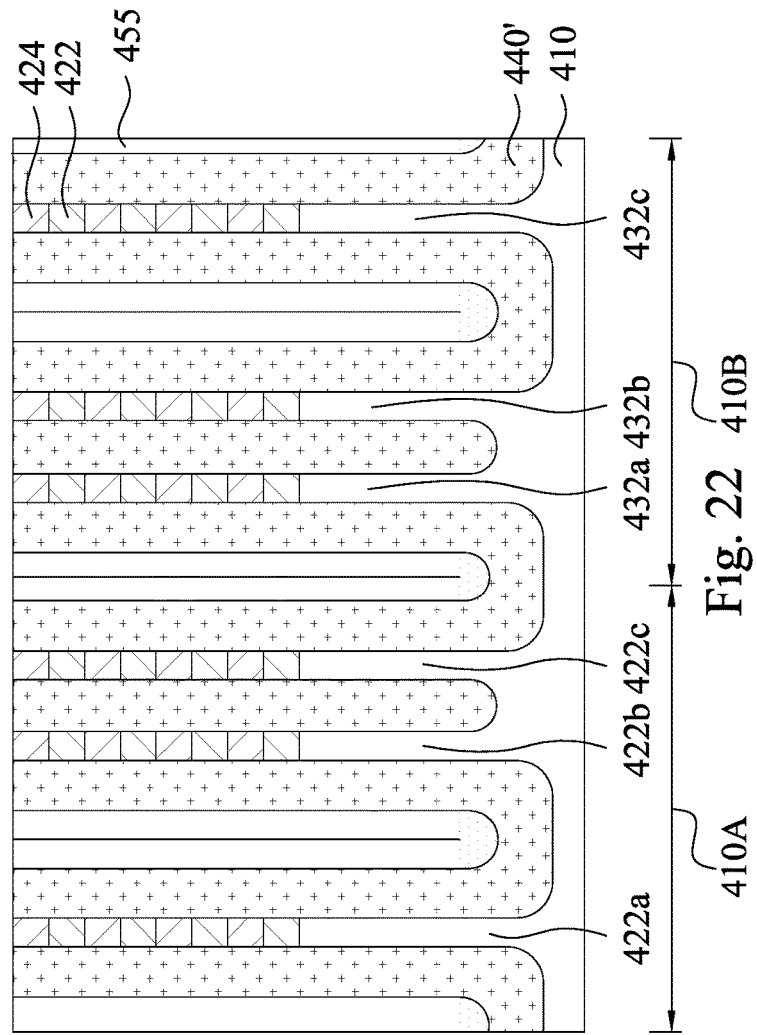
Figure 24C:
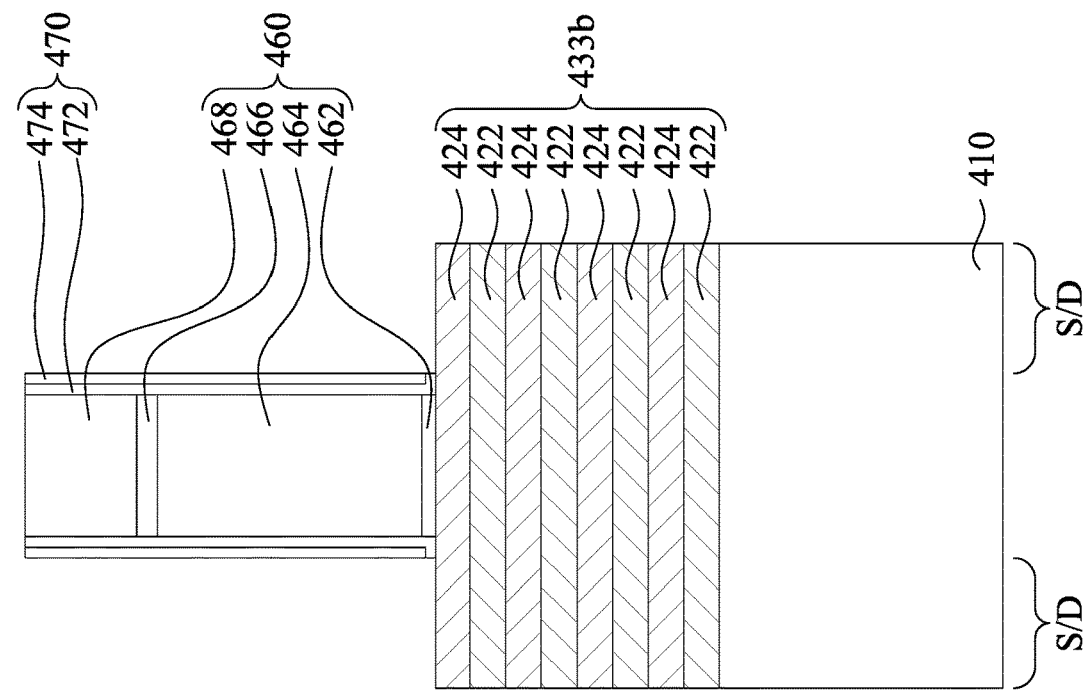
Figure 24B:
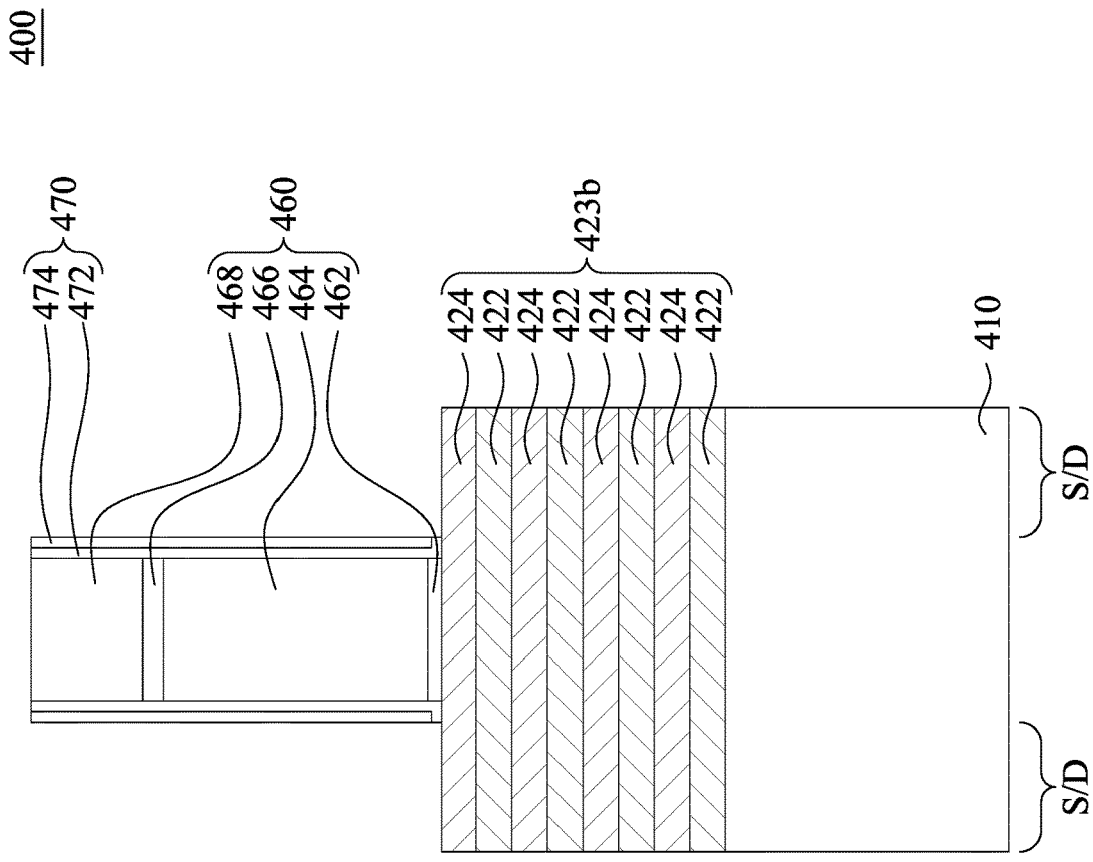
Figure 25A:
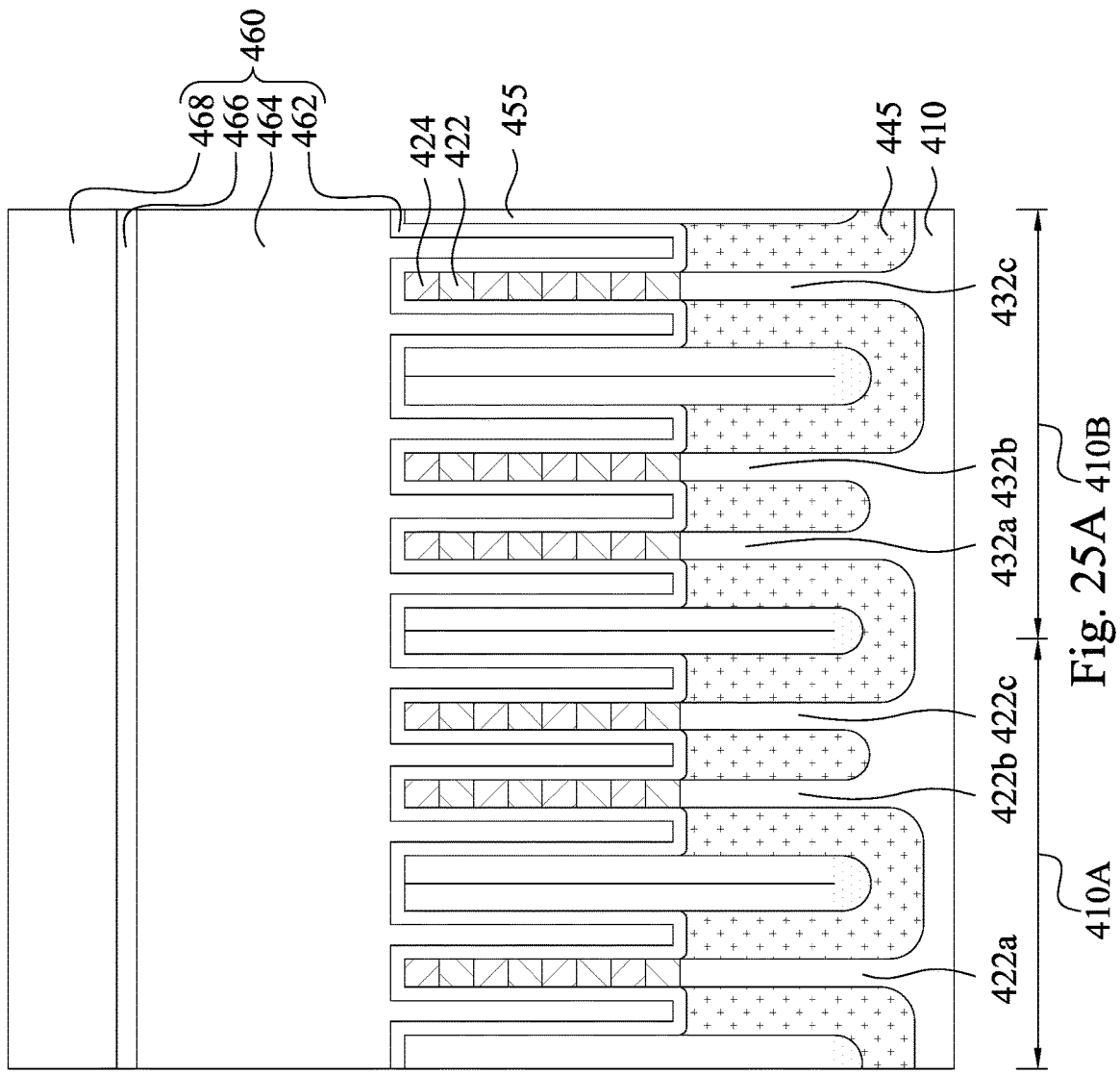
Figure 25C:
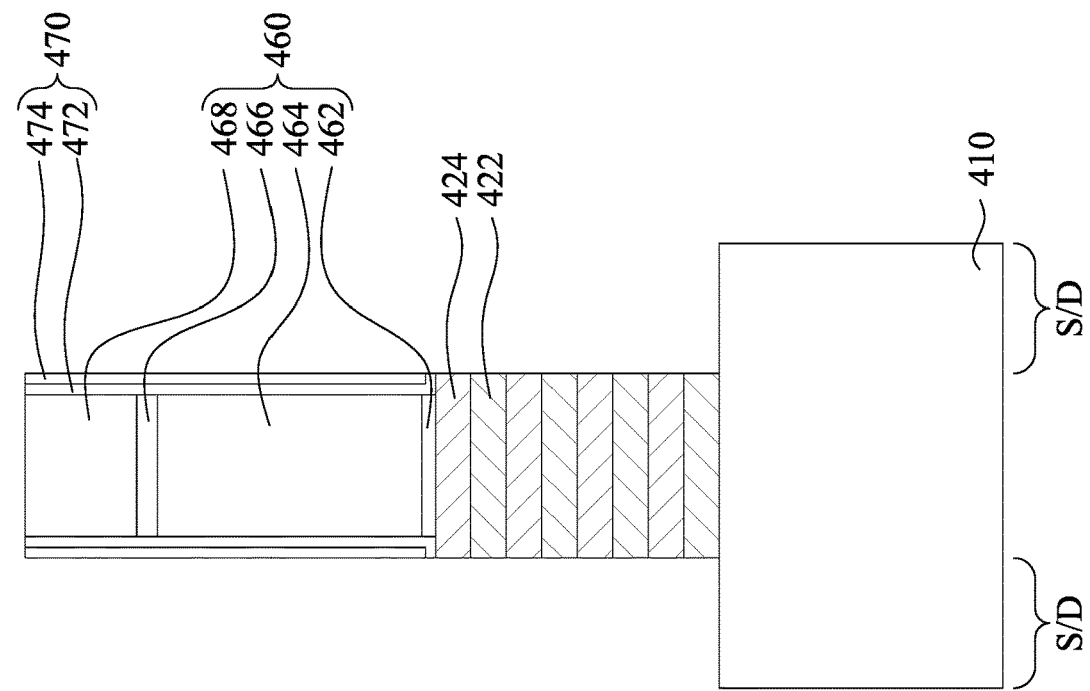
Figure 25B:
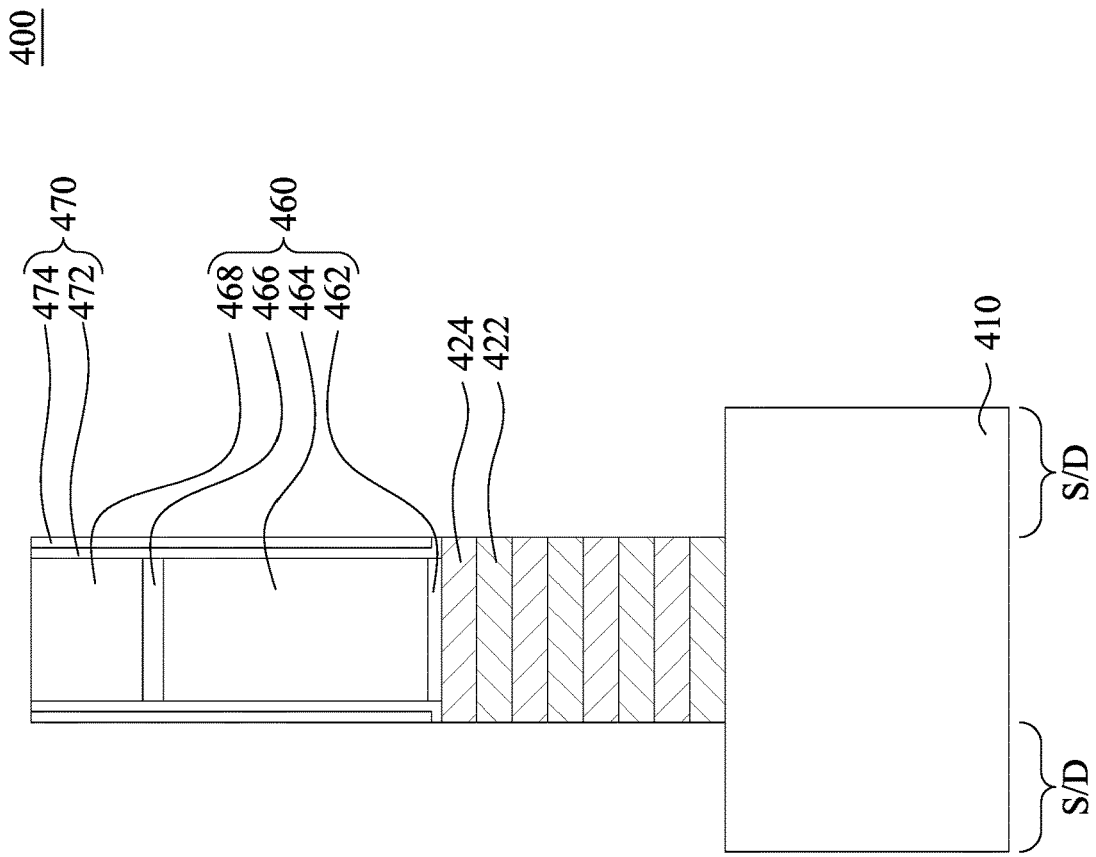
Figure 26A:
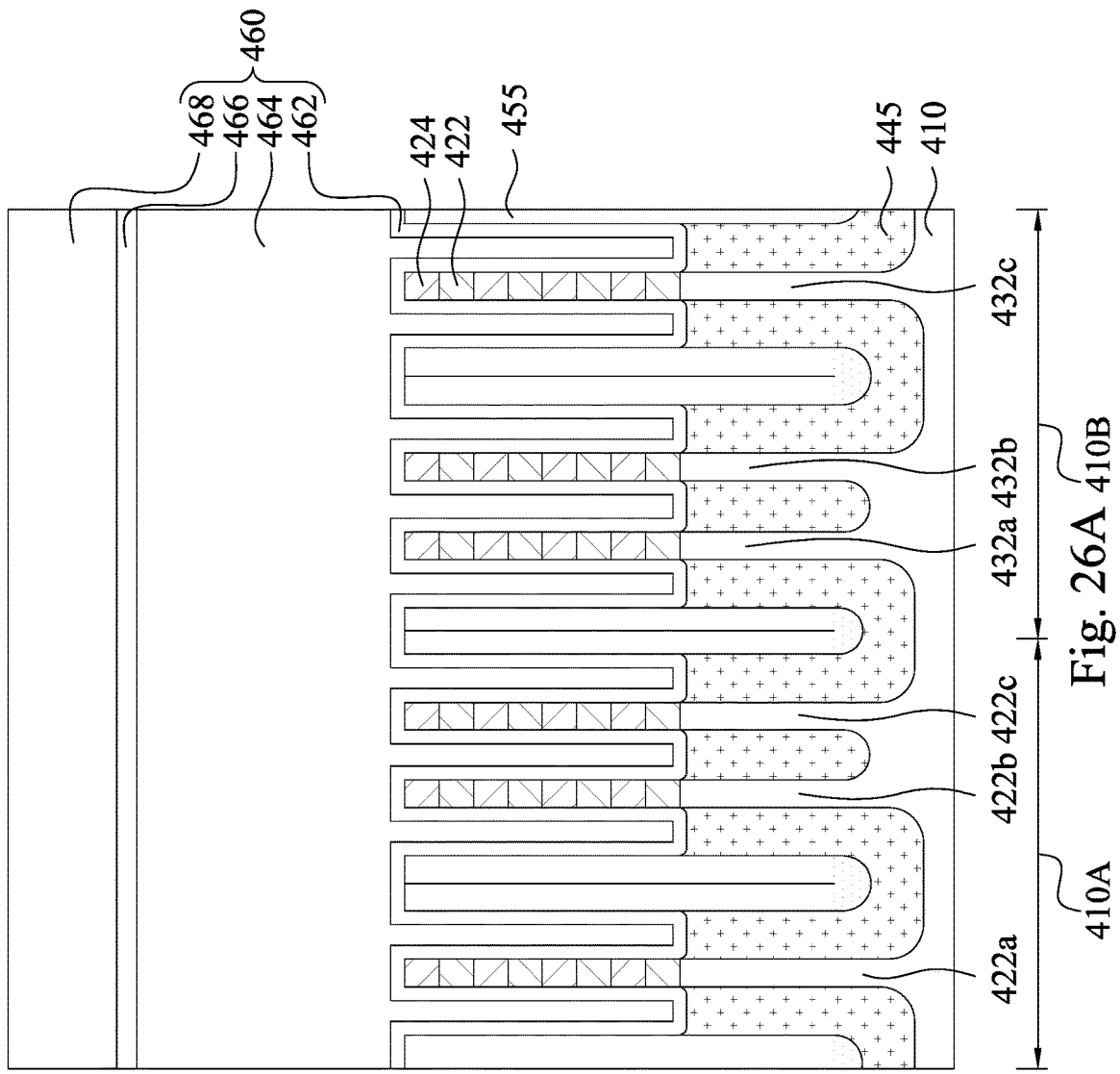
Figure 26C:
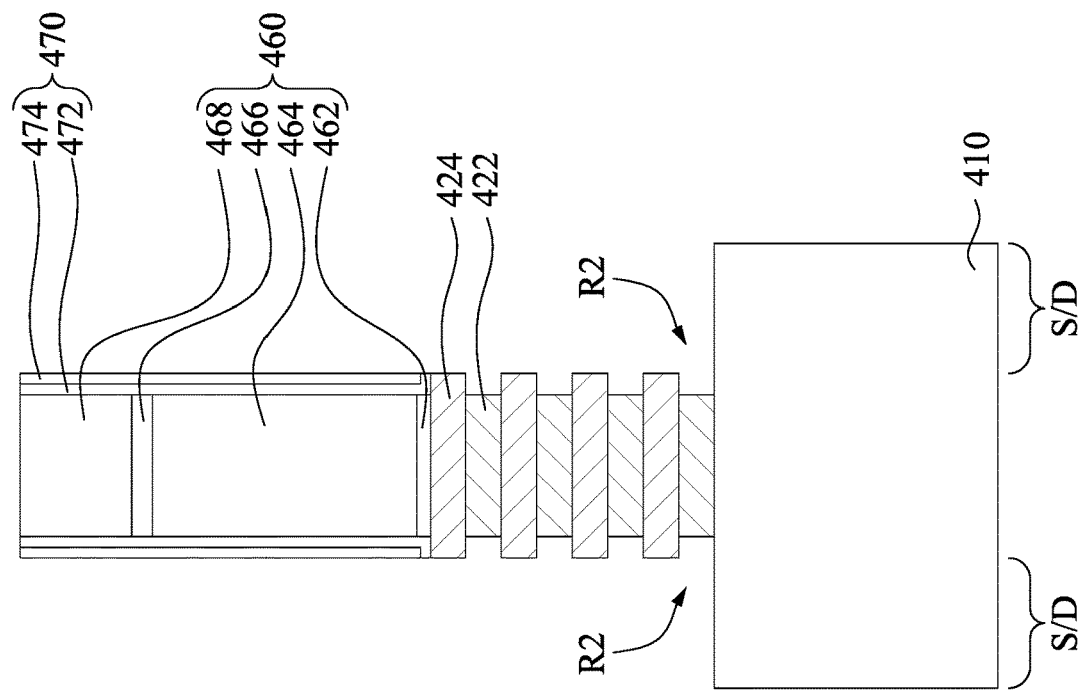
Figure 26B:
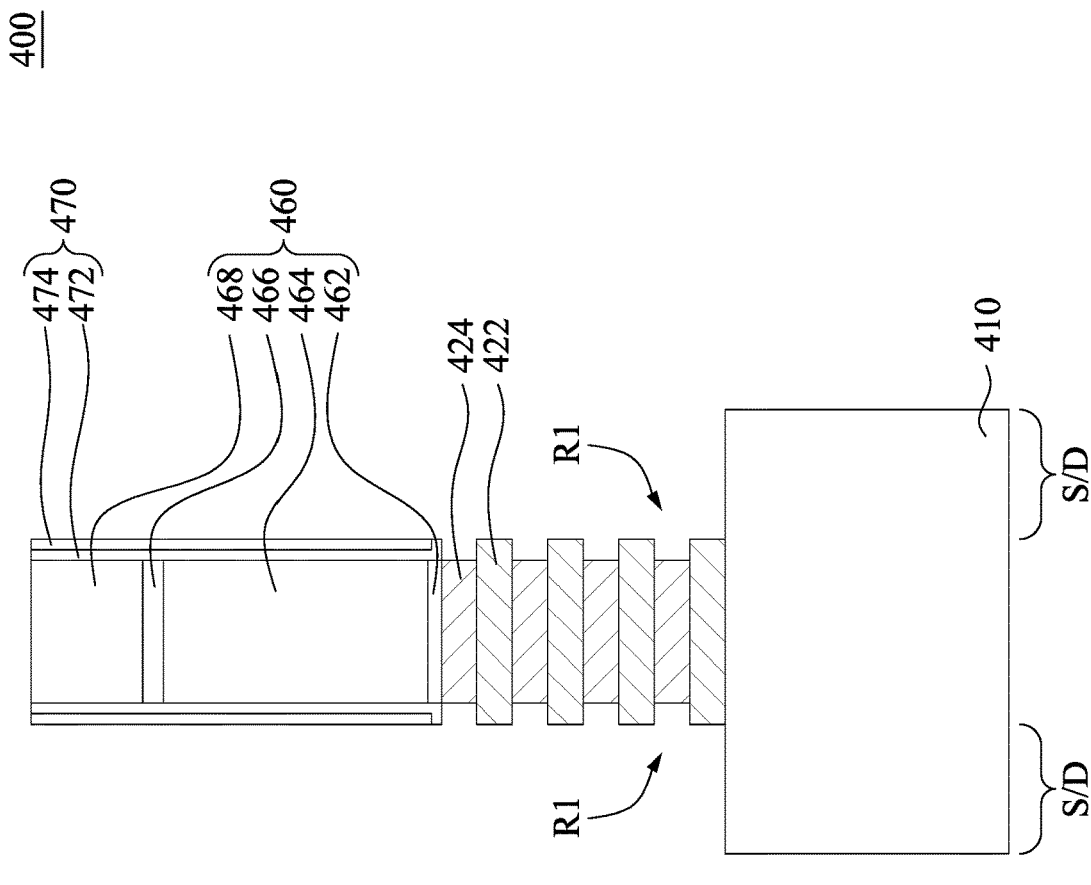

Reference is made to FIG. 22. A planarization process (such as a CMP process) is performed to remove excessive isolation layer 440, the dielectric fin layer 450, and the mask patterns 320a-320f (see FIG. 16A) until the fin structures 422a-422c and 432a-432c are exposed, remaining the isolation layer 440' and the dielectric fin layers 455. The remaining dielectric fin layers 455 are referred to as self-aligned isolation fins 455.

Reference is made to FIG. 23. Subsequently, the isolation layer 440' (see FIG. 22) is then etched back such that portions of the fin structures 422a-422c and 432a-432c and the self-aligned isolation fins 455 protrude from the remaining portions of the isolation layer 440'. The remaining portions of isolation layer 440' form isolation structures 445. The isolation structures 445 can be achieved by suitable methods such as, for example, an etch process that has suitable etch selectivity between materials of the isolation layer 440', the fin structures 422a-422c and 432a-432c, and the self-aligned isolation fin 455. For example, the etch process can have a higher etch rate of the isolation layer 440' than the etch rate of the fin structures 422a-422c and 432a-432c and/or the self-aligned isolation fin 455. In some embodiments, etching rate difference be achieved by adjusting suitable parameters of the etch process such as, for example, etchant gas type, gas flow rate, etching temperature, plasma power, chamber pressure, other suitable parameters, and/or combinations thereof. In some embodiments, each of portions of the fin structures 422a-422c and 432a-432c protruding from the isolation structures 445 has a height of about 90 nm to about 130 nm.

Reference is made to FIGS. 24A-24D. At least one dummy gate structure 460 is formed over the substrate 410 and are at least partially disposed over the fin structures 422a-422c and 432a-432c. The portions of the fin structures 422a-422c and 432a-432c underlying the dummy gate structure 460 may be referred to as the channel regions. The dummy gate structure 460 may also define source/drain (S/D) regions of the fin structures 422a-422c and 432a-432c, for example, the regions of the fin structures 422a-422c and 432a-432c adjacent and on opposing sides of the channel regions.

Dummy gate formation operation first forms a dummy gate dielectric layer 462 over the fin structures 422a-422c and 432a-432c. Subsequently, a dummy gate electrode layer 464 and a hard mask which may include multiple layers 466 and 468 (e.g., an oxide layer 466 and a nitride layer 468) are formed over the dummy gate dielectric layer 462. The hard mask is then patterned, followed by patterning the dummy gate electrode layer 462 by using the patterned hard mask as an etch mask. In some embodiments, after patterning the dummy gate electrode layer 464, the dummy gate dielectric layer 462 is removed from the S/D regions of the fin structures 422a-422c and 432a-432c. The etch process may include a wet etch, a dry etch, and/or combinations thereof. The etch process is chosen to selectively etch the dummy gate dielectric layer 462 without substantially etching the fin structures 422a-422c and 432a-432c, the dummy gate electrode layer 464, the oxide mask layer 466 and the nitride mask layer 468.

After formation of the dummy gate structure 460 is completed, gate spacers 470 formed on sidewalls of the dummy gate structure 460. In some embodiments of the gate spacer formation operations, a spacer material layer is deposited on the substrate 410. The spacer material layer may be a conformal layer that is subsequently etched back to form gate spacers 470. In some embodiments, the spacer material layer includes multiple layers, such as a first spacer layer 472 and a second spacer layer 474 formed over the first spacer layer 472. The first and second spacer layers 472 and 474 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 472 and 474 may be formed by depositing in sequence two different dielectric materials over the dummy gate structure 460 using processes such as, CVD process, a subatmospheric CVD (SACVD) process, a flowable CVD process, an ALD process, a PVD process, or other suitable process. An anisotropic etching process is then performed on the deposited spacer layers 472 and 474 to expose portions of the fin structures 422a-422c and 432a-432c not covered by the dummy gate structure 460 (e.g., in source/drain regions of the fin structures 422a-422c and 432a-432c). Portions of the spacer layers 472 and 474 directly above the dummy gate structure 460 may be removed by this anisotropic etching process. Portions of the spacer layer 472 and 474 on sidewalls of the dummy gate structure 460 may remain, forming gate sidewall spacers, which are denoted as the gate spacers 470, for the sake of simplicity. In some embodiments, the first spacer layer 472 is formed of silicon oxide that has a lower dielectric constant than silicon nitride, and the second spacer layer 474 is formed of silicon nitride that has a higher etch resistance against subsequent etching processing (e.g., etching source/drain recesses in the fin structures 422a-422c and 432a-432c) than silicon oxide. In some embodiments, the gate spacers 470 may be used to offset subsequently formed doped regions, such as source/drain regions. The gate spacers 470 may further be used for designing or modifying the source/drain region profile.

Reference is made to FIGS. 25A-25D. The exposed portions of the fin structures 422a-422c and 432a-432c are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch.

Reference is made to FIGS. 26A-26D. The epitaxial layers 424 over the P-type device region 410A and the epitaxial layers 422 over the N-type device region 410B are horizontally recessed (etched). For example, a first mask is formed to cover the N-type device region 410B and expose the P-type device region 410A, the epitaxial layers 424 over the P-type device region 410A are then horizontally recessed to form recesses R1. After the formation of the recesses R1, the first mask is removed. Subsequently, a second mask is formed to cover the P-type device region 410A and expose the N-type device region 410B, the epitaxial layers 422 over the N-type device region 410B are then horizontally recessed to form recesses R2. After the formation of the recesses R2, the second mask is removed.

Figure 27A:
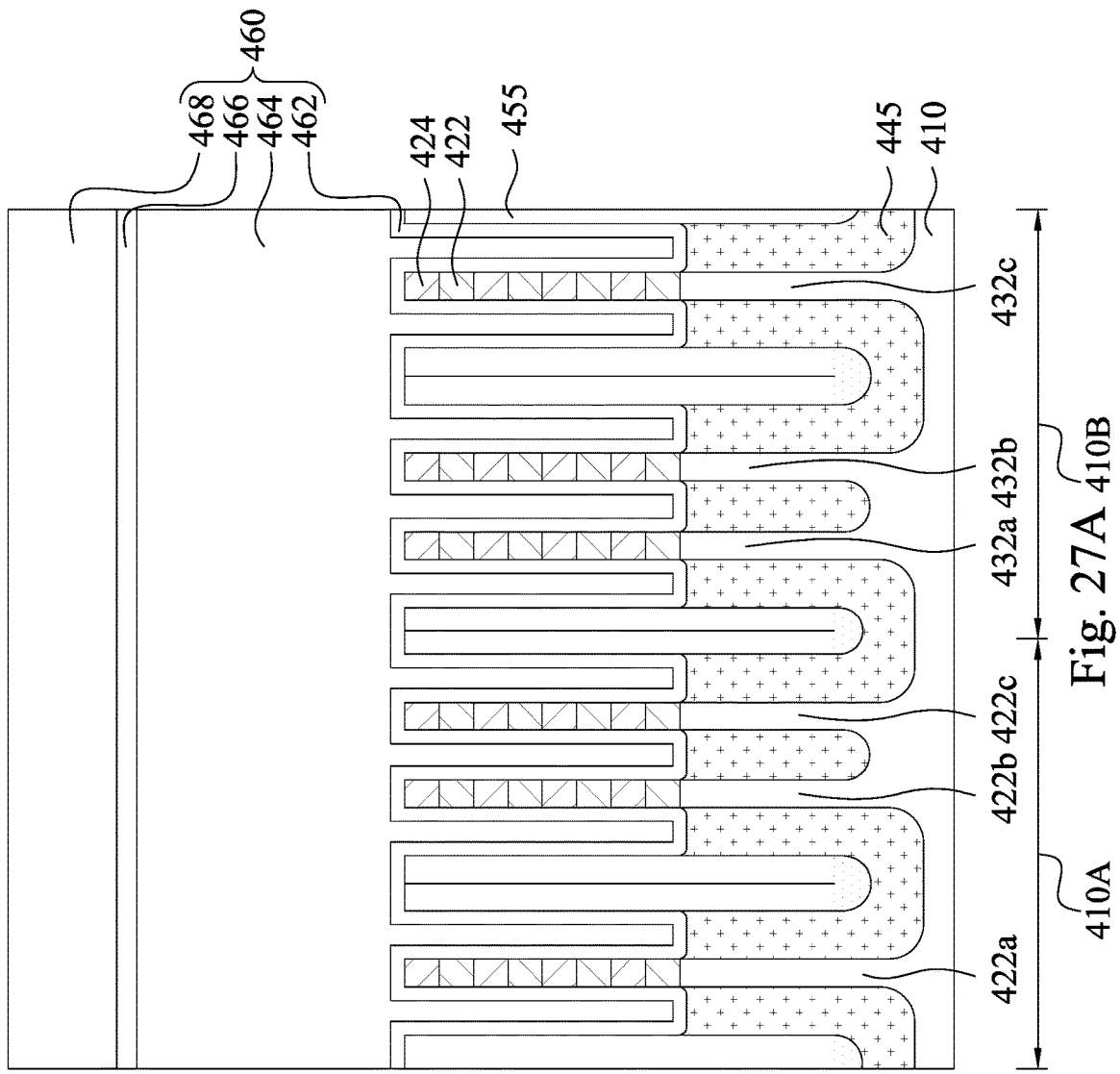
Figure 27C:
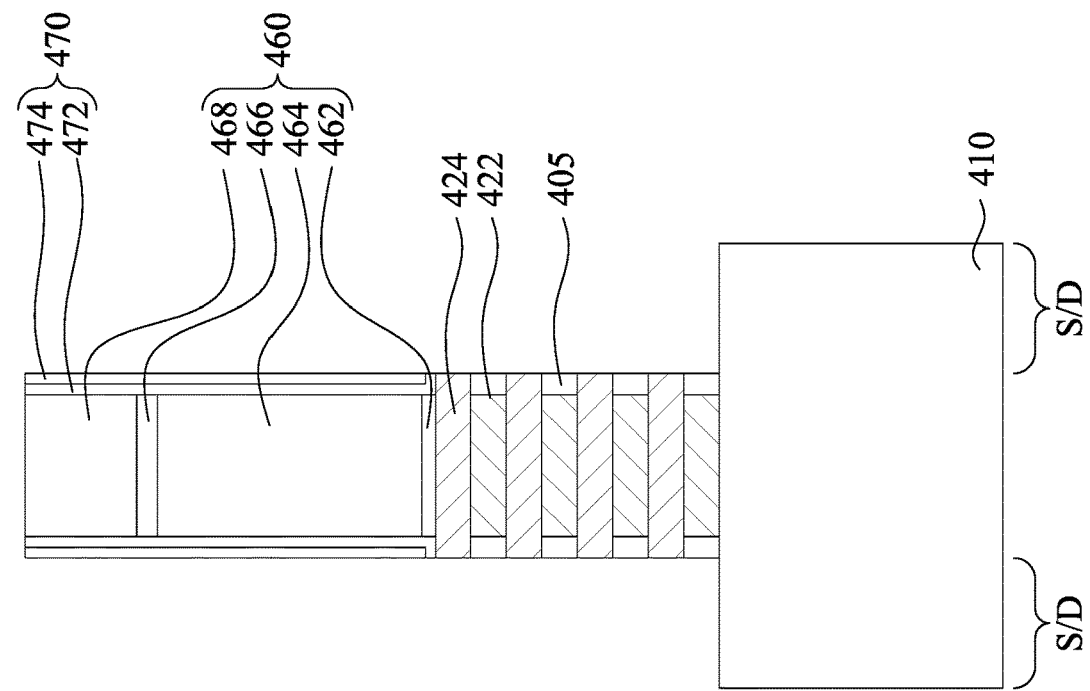
Figure 27B:
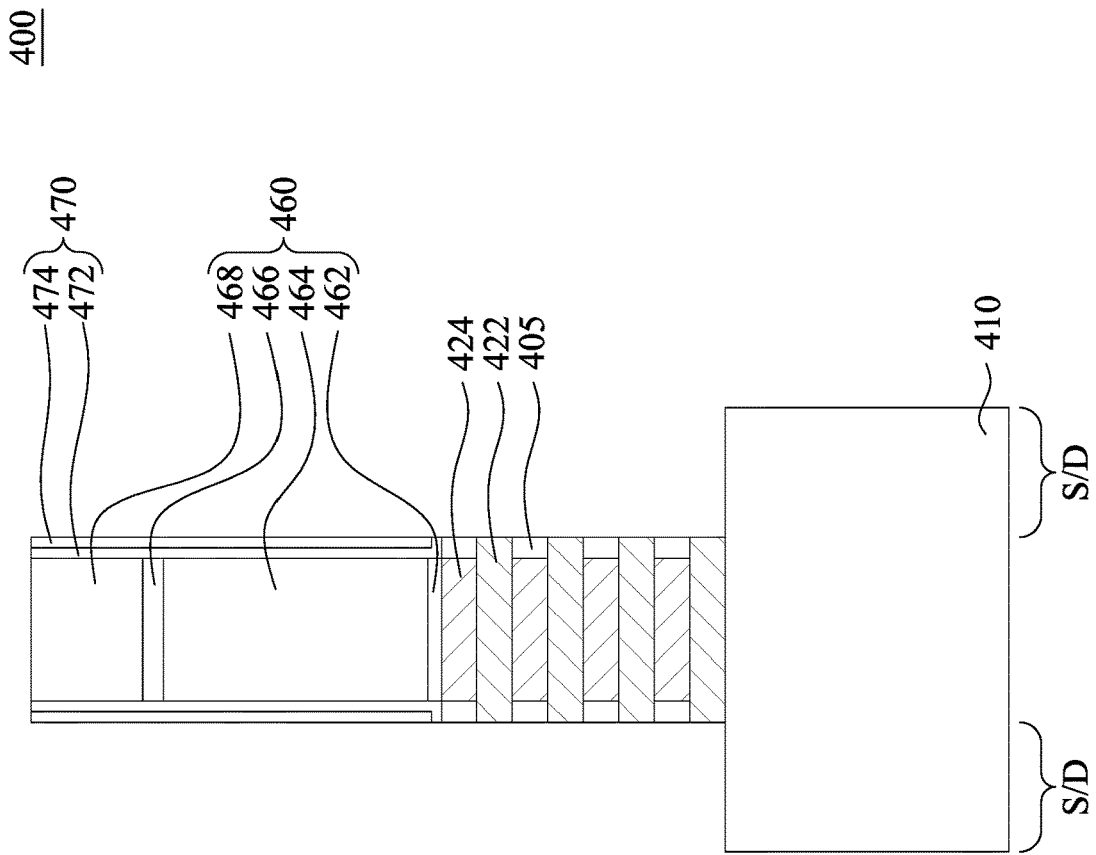
Figure 27D:
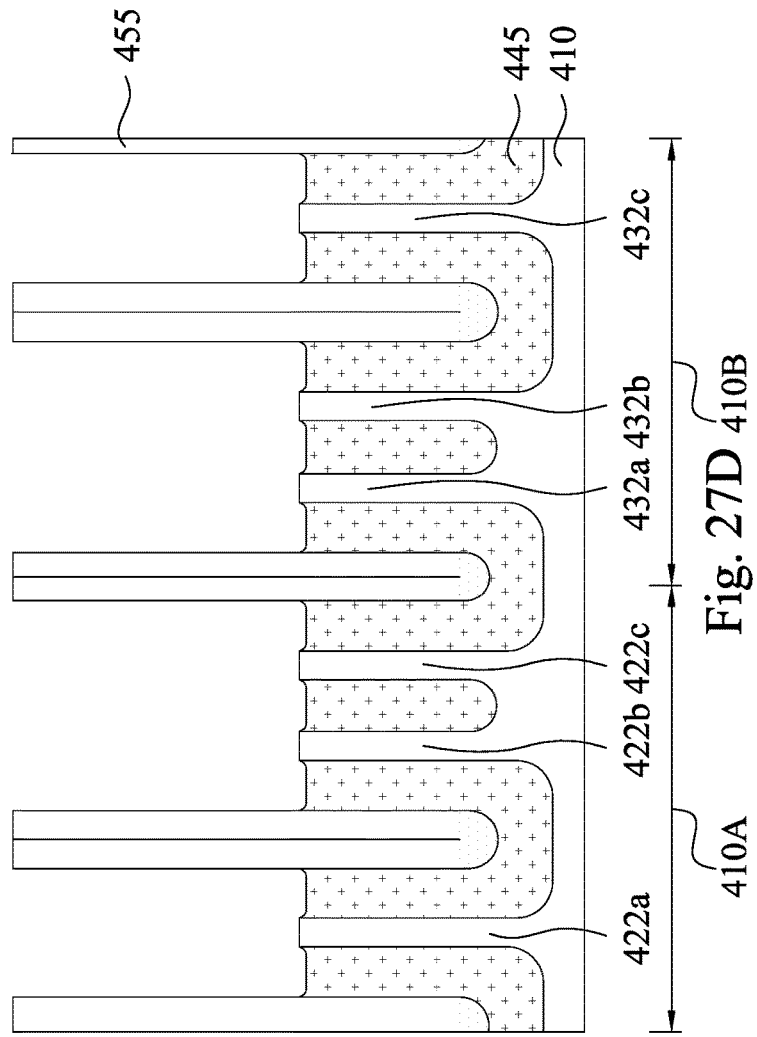

Reference is made to FIGS. 27A-27D. Inner spacers 405 are respectively formed to fill the recesses R1 and R2 (see FIGS. 26B and 26C). For example, a dielectric material layer is formed over the structure of FIGS. 26A-26D, and one or more etching operations are performed to form the inner spacers 405. In some embodiments, the inner spacers 405 includes a silicon nitride-based material, such as SiN, SiON, SiOCN or SiCN and combinations thereof and is different from the material of the gate spacers 470. In some embodiments, the inner spacers 405 are silicon nitride. The inner spacers 405 may fully fill the recesses as shown in FIGS. 27B and 27C. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments.

Reference is made to FIGS. 28A-28D. Source/drain epitaxial structures 480 are formed over the source/drain regions S/D of the fin structures 422a-422c and 432a-432c. The source/drain epitaxial structures 480 may be formed by performing an epitaxial growth process that provides an epitaxial material on the fin structures 422a-422c and 432a-432c. During the epitaxial growth process, the dummy gate structures 460, the gate spacers 470, and the inner spacers 405 limit the source/drain epitaxial structures 480 to the source/drain regions S/D. Materials and process details about the source/drain epitaxial structures 480 are similar to that of the source/drain epitaxial structures 480 of FinFETs discussed previously, and thus they are not repeated for the sake of brevity.

An interlayer dielectric (ILD) layer 495 is formed on the substrate 410. In some embodiments, a contact etch stop layer (CESL) 490 is also formed prior to forming the ILD layer 495. Materials and process details about the CESL 490 and the ILD layer 495 is similar to that of the CESL 490 and the ILD layer 495, and thus they are not repeated for the sake of brevity. In some examples, after depositing the ILD layer 495, a planarization process may be performed to remove excessive materials of the ILD layer 495. For example, a planarization process includes a chemical mechanical planarization (CMP) process which removes portions of the ILD layer 495 (and CESL 490, if present) overlying the dummy gate structures 460 and planarizes a top surface of the integrated circuit structure 400. In some embodiments, the CMP process also removes hard mask layers 466, 468 (as shown in FIGS. 27A-27C) and exposes the dummy gate electrode layer 464. In some embodiments, at least one air gap 492 is defined by the CESL 490 and is formed under the source/drain epitaxial structures 480.

Figure 28B:
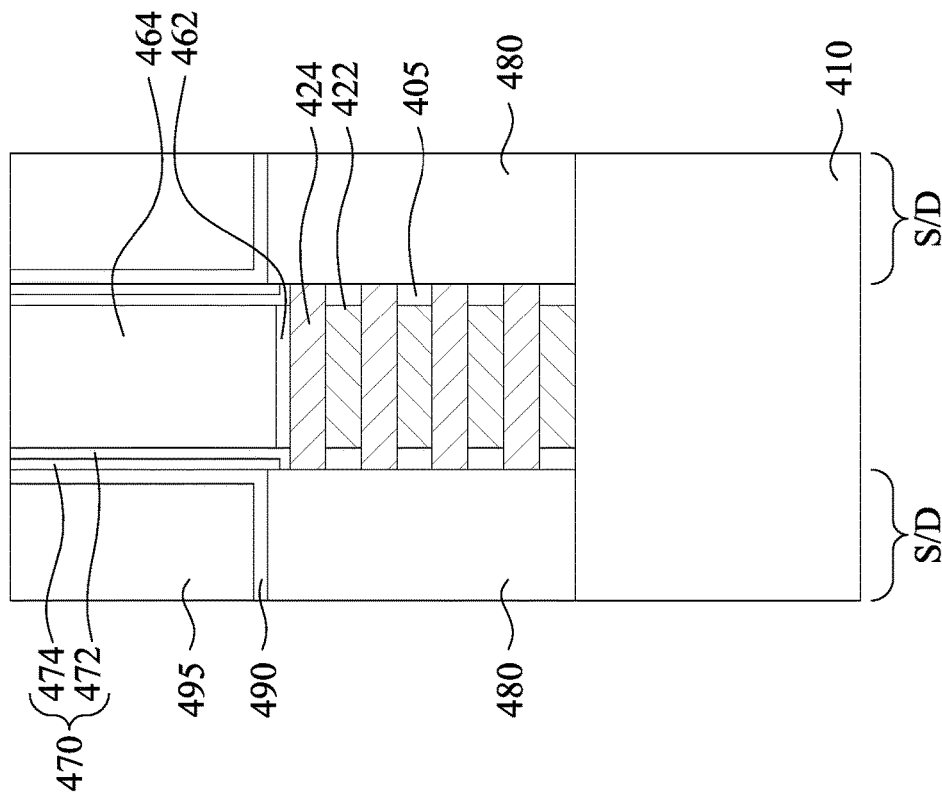
Figure 28C:
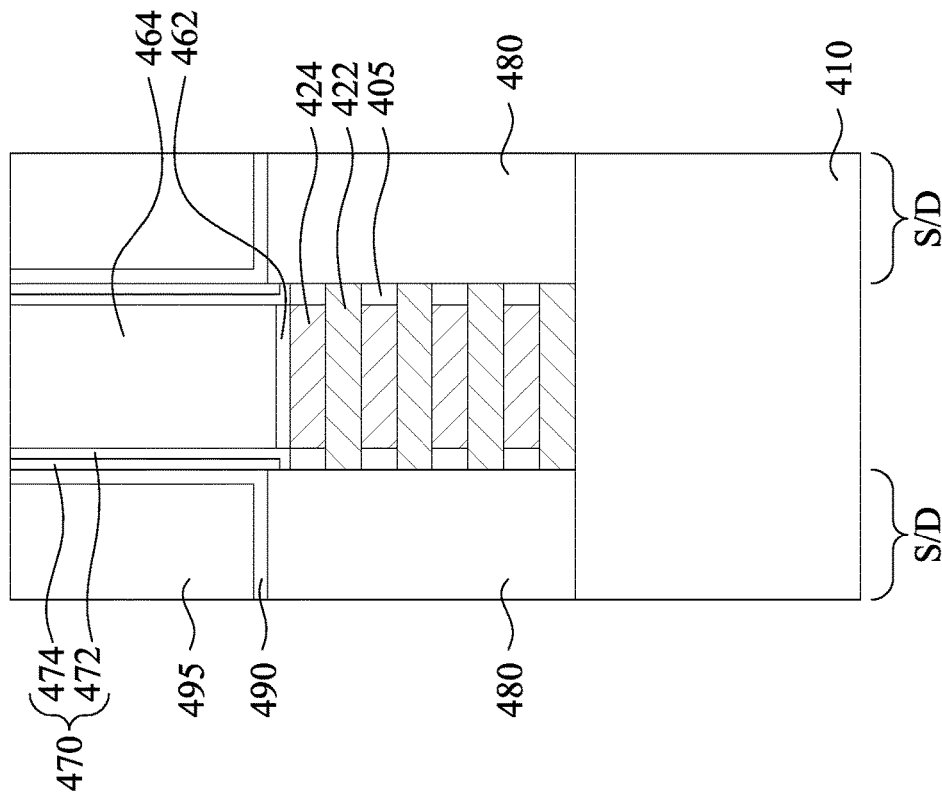
Figure 29C:
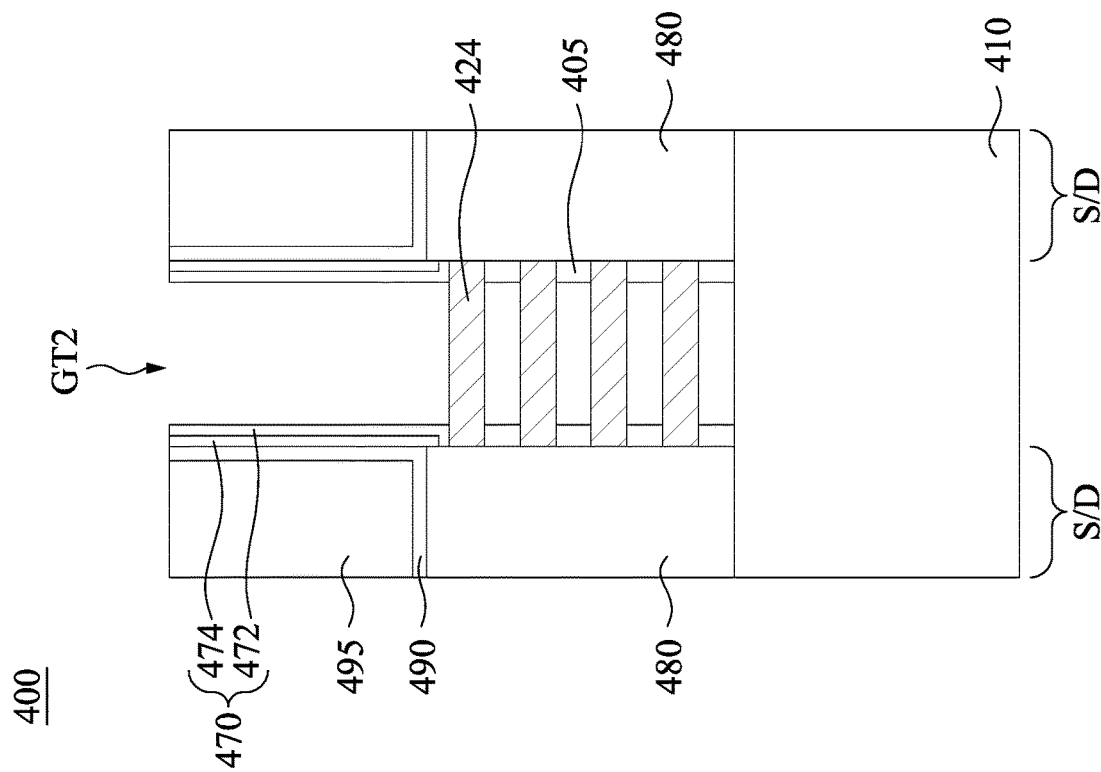
Figure 29B:
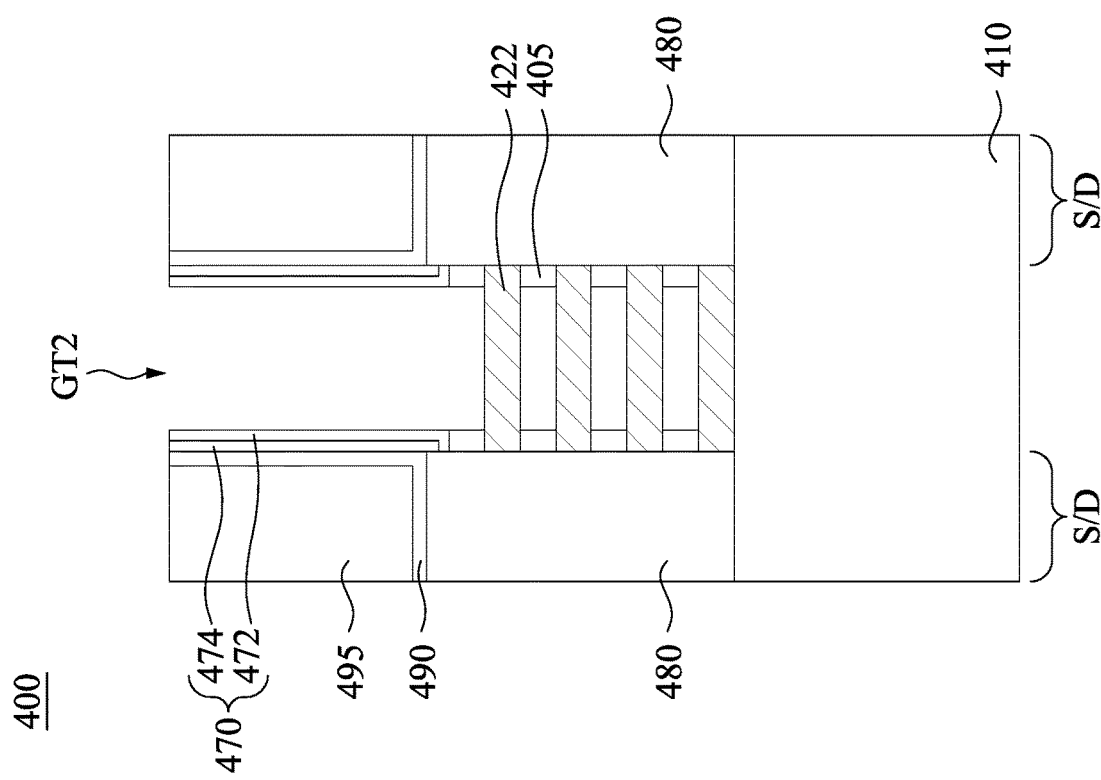
Figure 29D:
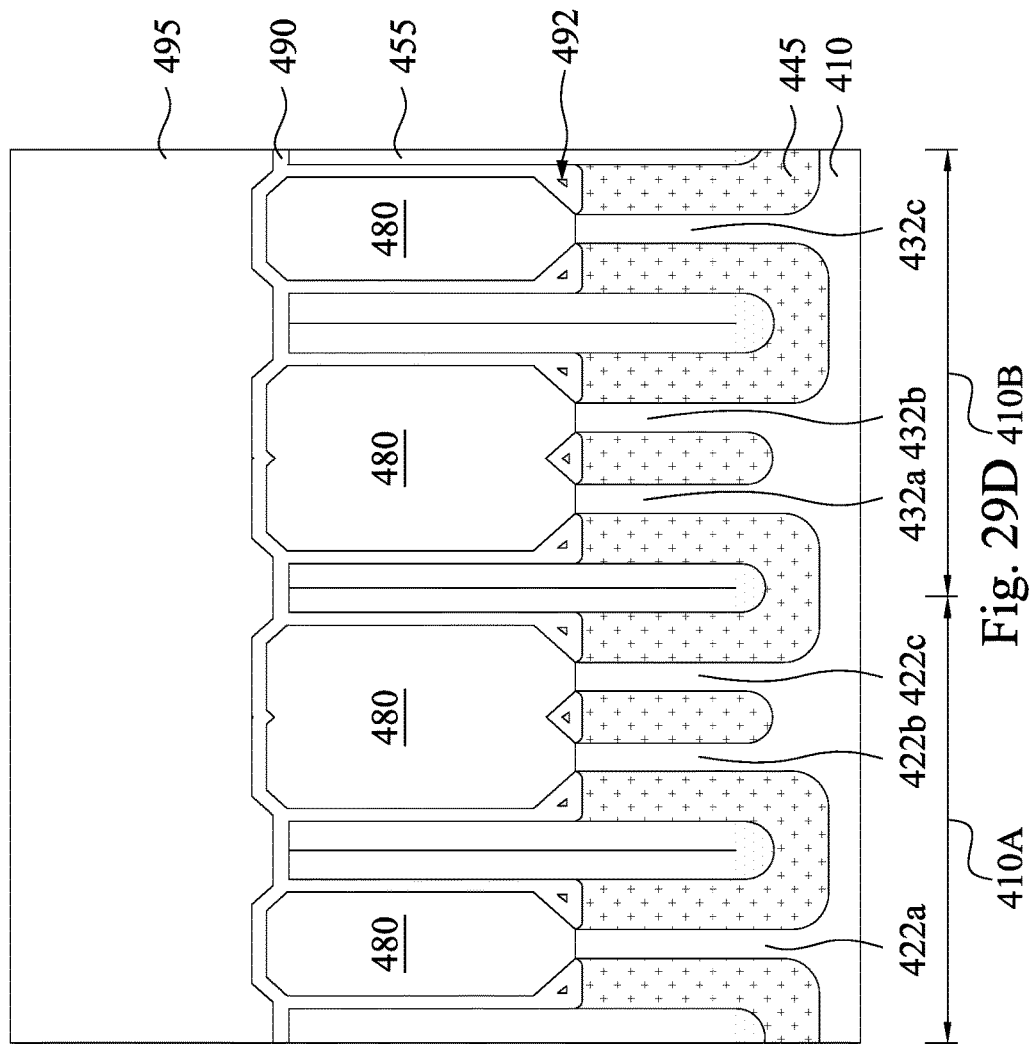
Figure 30C:
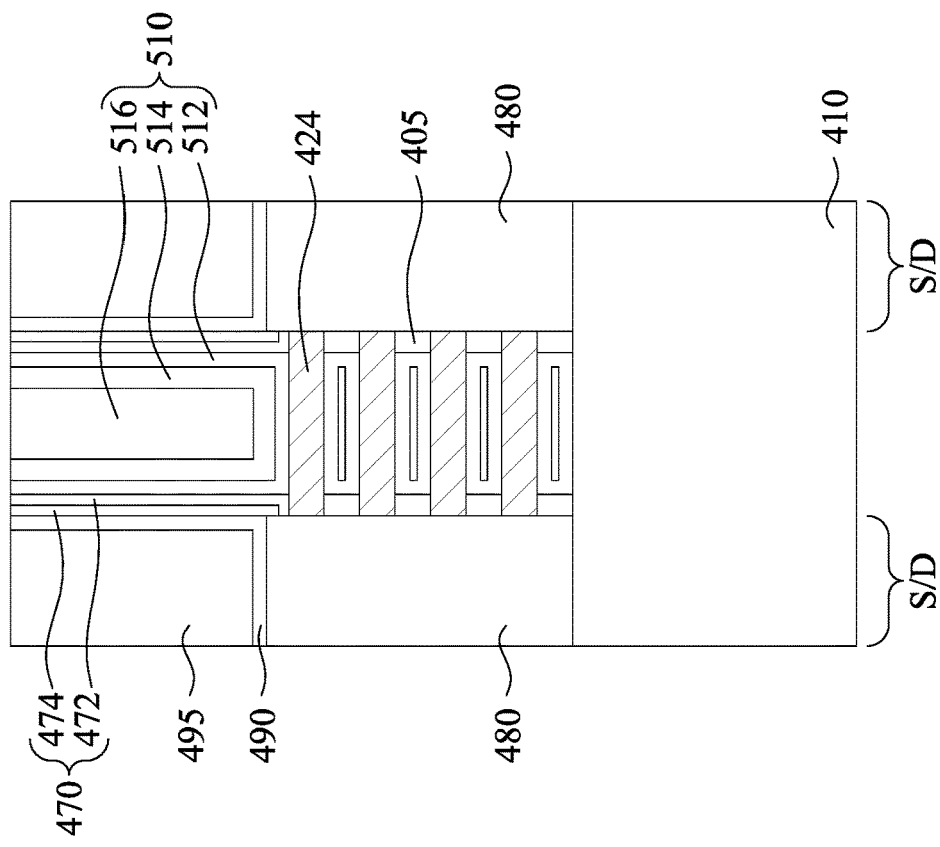
Figure 30B:
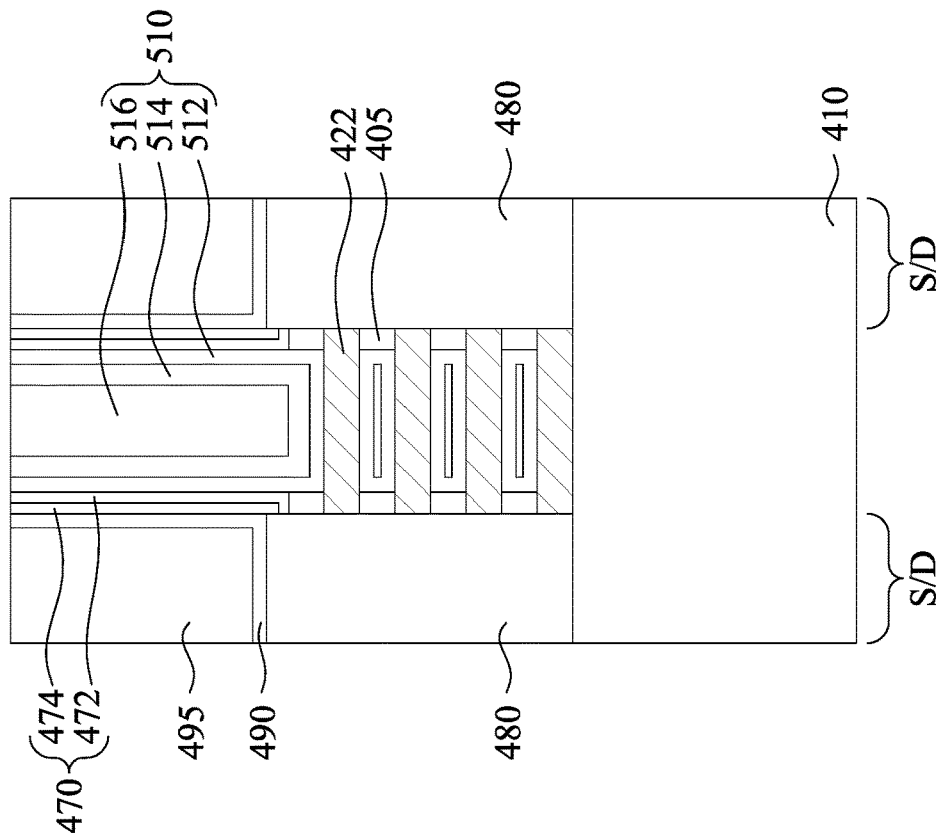
Figure 30D:
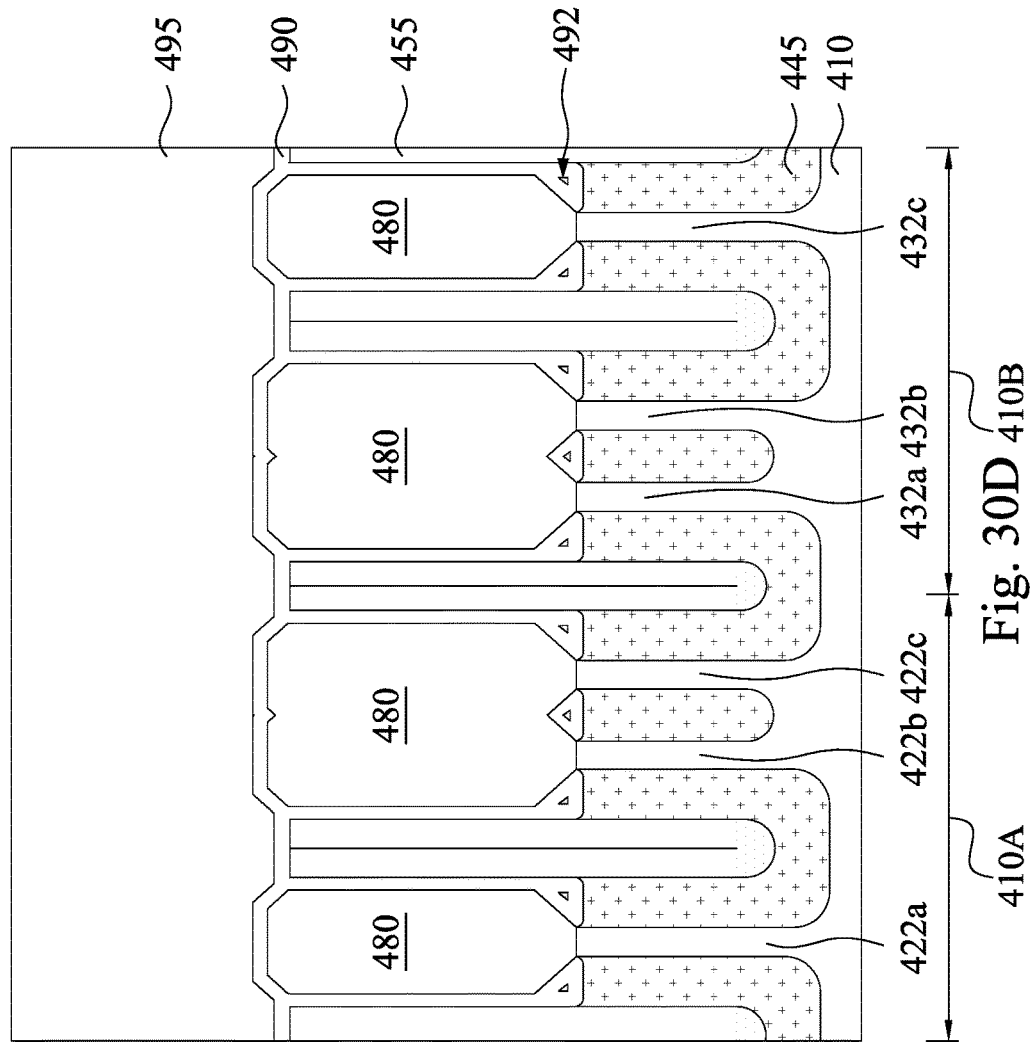

Reference is made to FIGS. 29A-29D. The dummy gate electrode layer 464 and the dummy gate electrode layer 462 (as shown in FIGS. 28A-28C) are removed first, and then the sacrificial layers are removed. For example, a third mask is formed to cover the N-type device region 410B and expose the P-type device region 410A, and the epitaxial layers 424 over the P-type device region 410A are then removed. After the removal of the epitaxial layers 424, the first mask is removed. Subsequently, a second mask is formed to cover the P-type device region 410A and expose the N-type device region 410B, and the epitaxial layers 422 over the N-type device region 410B are then removed. After the removal of the epitaxial layers 422, the second mask is removed.

In some embodiments, the dummy gate electrode layer 464 is removed by using a selective etching process (e.g., selective dry etching, selective wet etching, or combinations thereof) that etches the materials in dummy gate electrode layer 464 at a faster etch rate than it etches other materials (e.g., the gate spacers 470, the ILD layer 495, and/or the CESL 490), thus resulting in gate trenches GT2 between corresponding gate spacers 470. Subsequently, the sacrificial layers in the gate trenches GT2 are removed by using another selective etching process that etches the sacrificial layers at a faster etch rate than it etches the channel layers. In this way, in P-type devices, the epitaxial layers 422 become nanosheets suspended over the substrate 410 and between the source/drain epitaxial structures 480, and in N-type devices, the epitaxial layers 424 become nanosheets suspended over the substrate 410 and between the source/drain epitaxial structures 480. This operation is also called a channel release process. In some embodiments, the channel layers can be interchangeably referred to as nanowires, nanoslabs and nanorings, depending on their geometry. For example, in some other embodiments the channel layers may be trimmed to have a substantial rounded shape (i.e., cylindrical) due to the selective etching process for completely removing the sacrificial layers. In that case, the channel layers can be called nanowires.

Reference is made to FIGS. 30A-30D. A replacement gate structure 510 is formed in the gate trench GT2 to surround each of the channel layers suspended in the gate trench GT2. The gate structure 510 may be the final gate of a GAA FET. The final gate structure 510 may be a high-k/metal gate stack, however other compositions are possible. In some embodiments, the gate structures 510 forms the gate associated with the multi-channels provided by the plurality of channel layers. In various embodiments, the gate structure 510 includes a gate dielectric layer 512 formed around the channel layers, a work function metal layer 514 formed around the gate dielectric layer 512, and a fill metal 516 formed around the work function metal layer 514 and filling a remainder of gate trench GT2. The gate dielectric layer 512 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 514 and/or fill metal layer 516 used within the gate structures 510 may include a metal, metal alloy, or metal silicide. Formation of the gate structures 510 may include depositions to form various gate materials, one or more liner layers, and one or more CMP processes to remove excessive gate materials. As illustrated in a cross-sectional view of FIG. 30A, the gate structure 510 surrounds each of the channel layers, and thus is referred to as a gate of a GAA FET. Materials and process details about the gate structures 510 of GAA FETs are similar to the gate structures 210 of FinFETs, and thus they are not repeated for the sake of brevity.

Reference is made to FIGS. 31A-31D. A dielectric cap 520 is optionally formed over the etched-back gate structures 510. For example, a dielectric cap layer, including $SiN_x$, $Al_xO_y$, AlON, $SiO_xC_y$, $SiC_xN_y$, combinations thereof or the like, is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the dielectric cap layer outside the recess, leaving portions of the dielectric cap layer in the recess to serve as the dielectric cap 520.

Reference is made to FIGS. 31A-31D. Source/drain contacts 540 are formed extending through the ILD layer 495 (and the CESL 490, if present). Formation of the source/drain contacts 540 includes, by way of example and not limitation, performing one or more etching processes to form contact openings extending though the ILD layer 495 to expose the source/drain epitaxial structures 480, depositing one or more metal materials overfilling the contact openings, and then performing a CMP process to remove excessive metal materials outside the contact openings. In some embodiments, the one or more etching processes are selective etching that etches the ILD layer 495 at a faster etch rate than etching the dielectric caps 520 and the gate spacers 470. As a result, the selective etching is performed using the dielectric caps 520 and the gate spacers 470 as an etch mask, such that the contact openings and hence the source/drain contacts 540 are formed self-aligned to the source/drain epitaxial structures 480 without using an additional photolithography process. In that case, the dielectric caps 520 allowing for forming the source/drain contacts 540 can be called SAC caps 520. In some embodiments, metal alloy layers 530 are formed over the source/drain epitaxial structures 480 prior to form the source/drain contacts 540. The metal alloy layers 530 may be silicide when the source/drain epitaxial structures 480 include silicon.

Figure 31C:
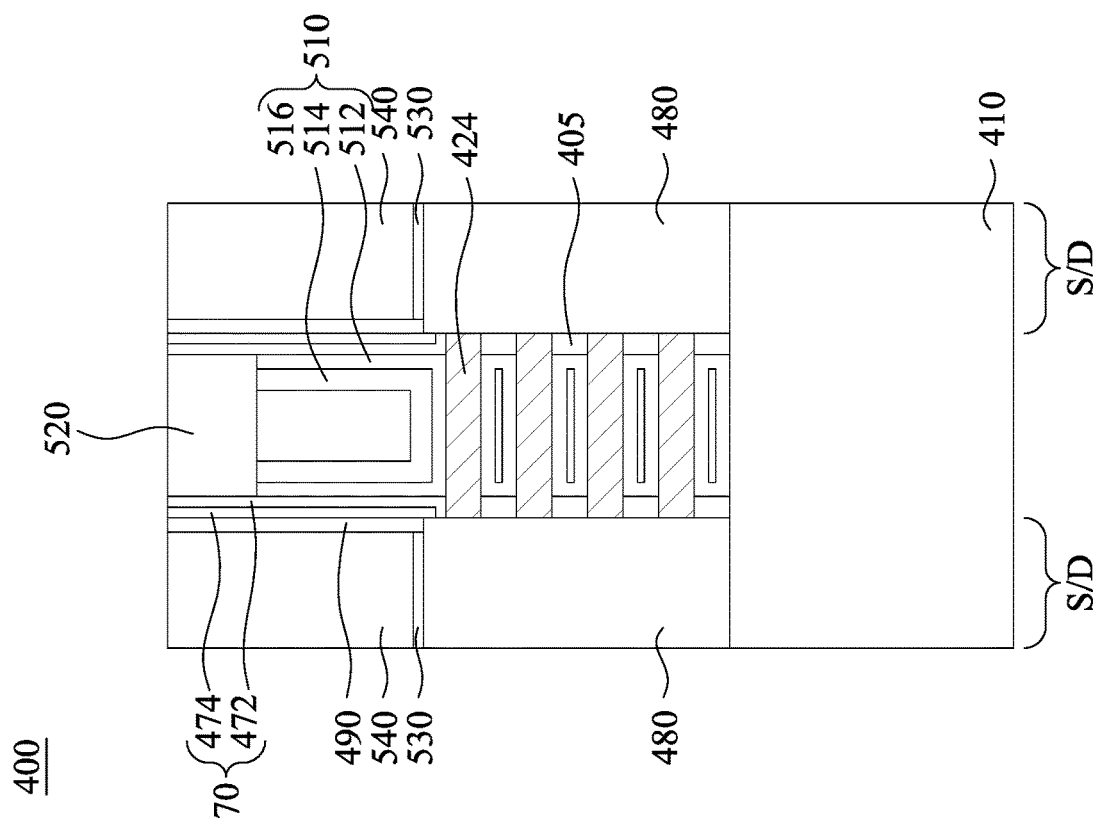
Figure 31B:
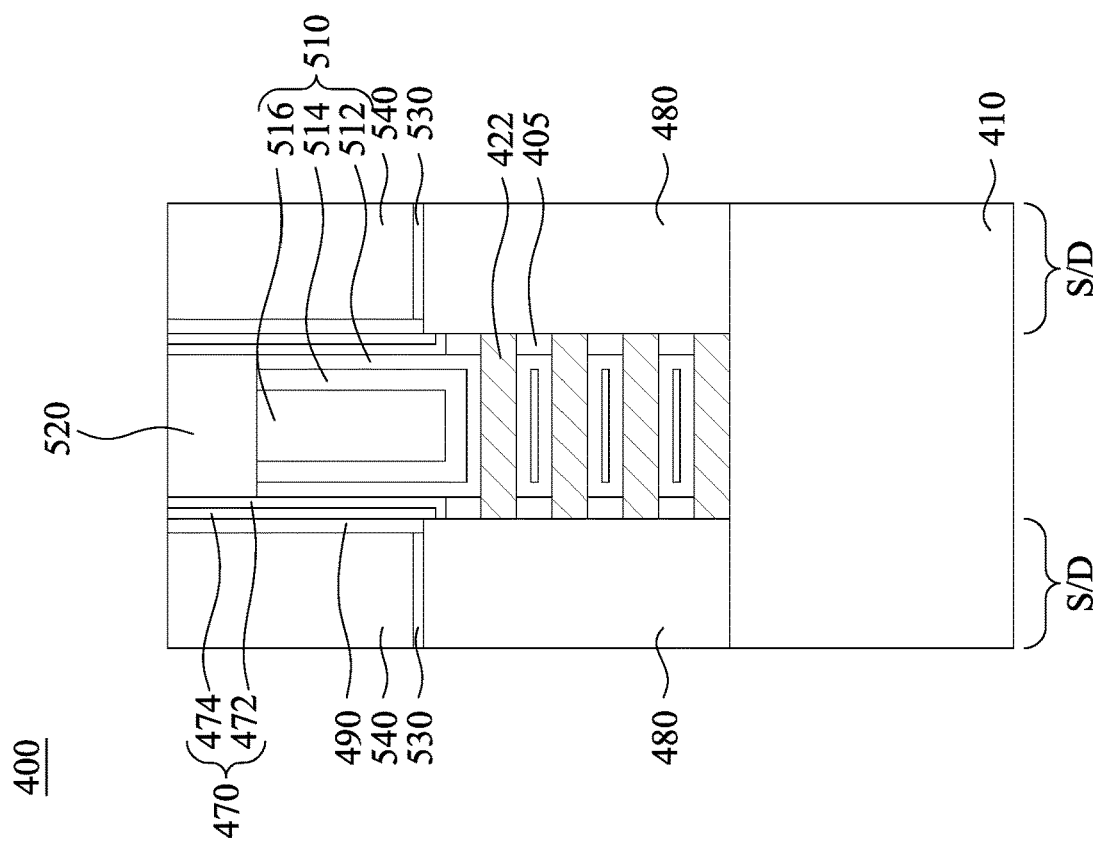
Figure 31D:
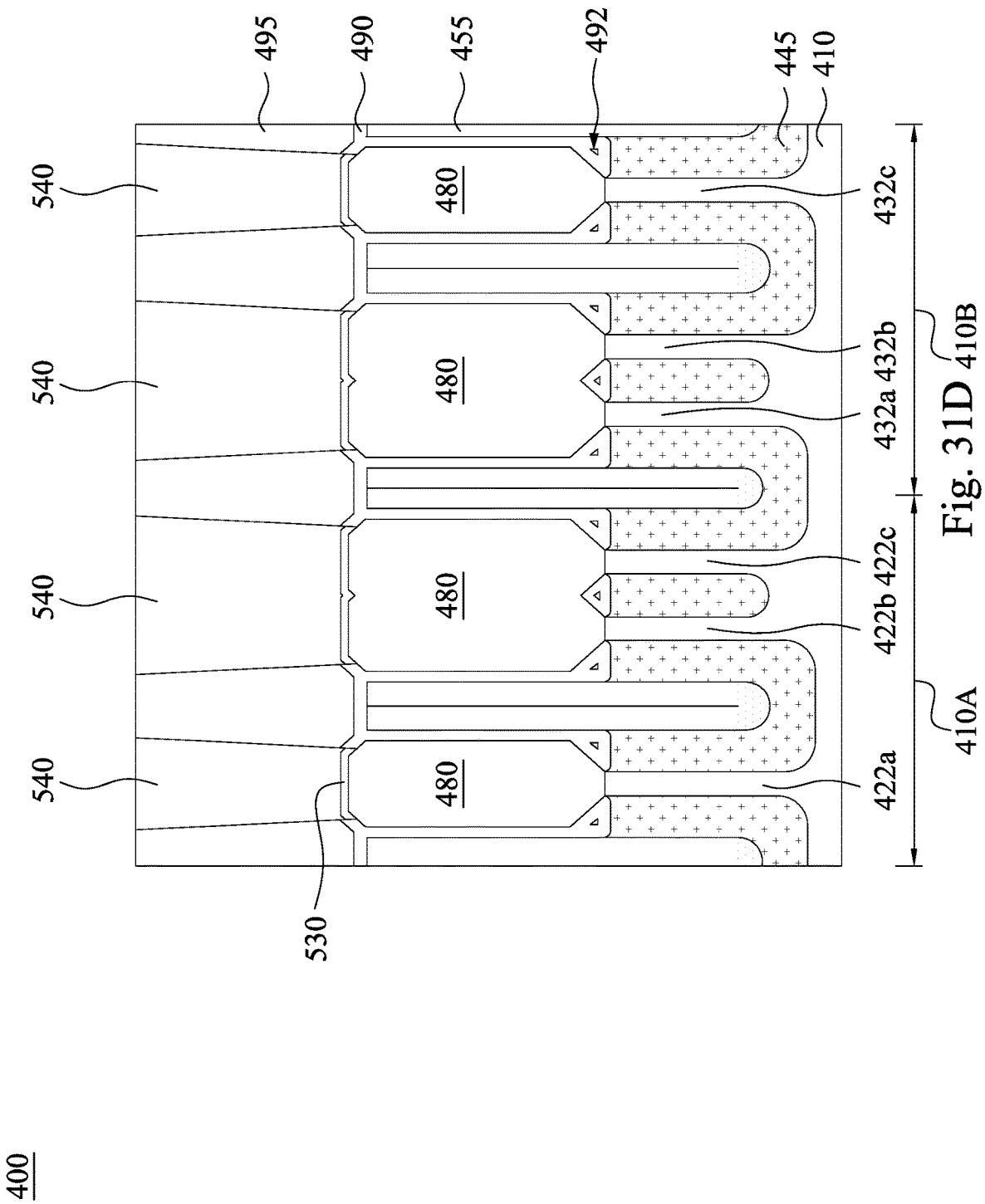

In FIGS. 31A and 31D, the integrated circuit structure 400 includes the isolation structures 445 embedded in the substrate 410 and in contact with the base portions of the fin structures 422a-422c and 432a-432c. For clarity, some of the isolation structures 445 in FIG. 31A are denoted as 445a, 445b, 445c, 445d, and 445e. The isolation structures 445a, 445c, and 445e have similar shapes, and the isolation structures 445b and 445d have similar shapes.

Figure 31E:
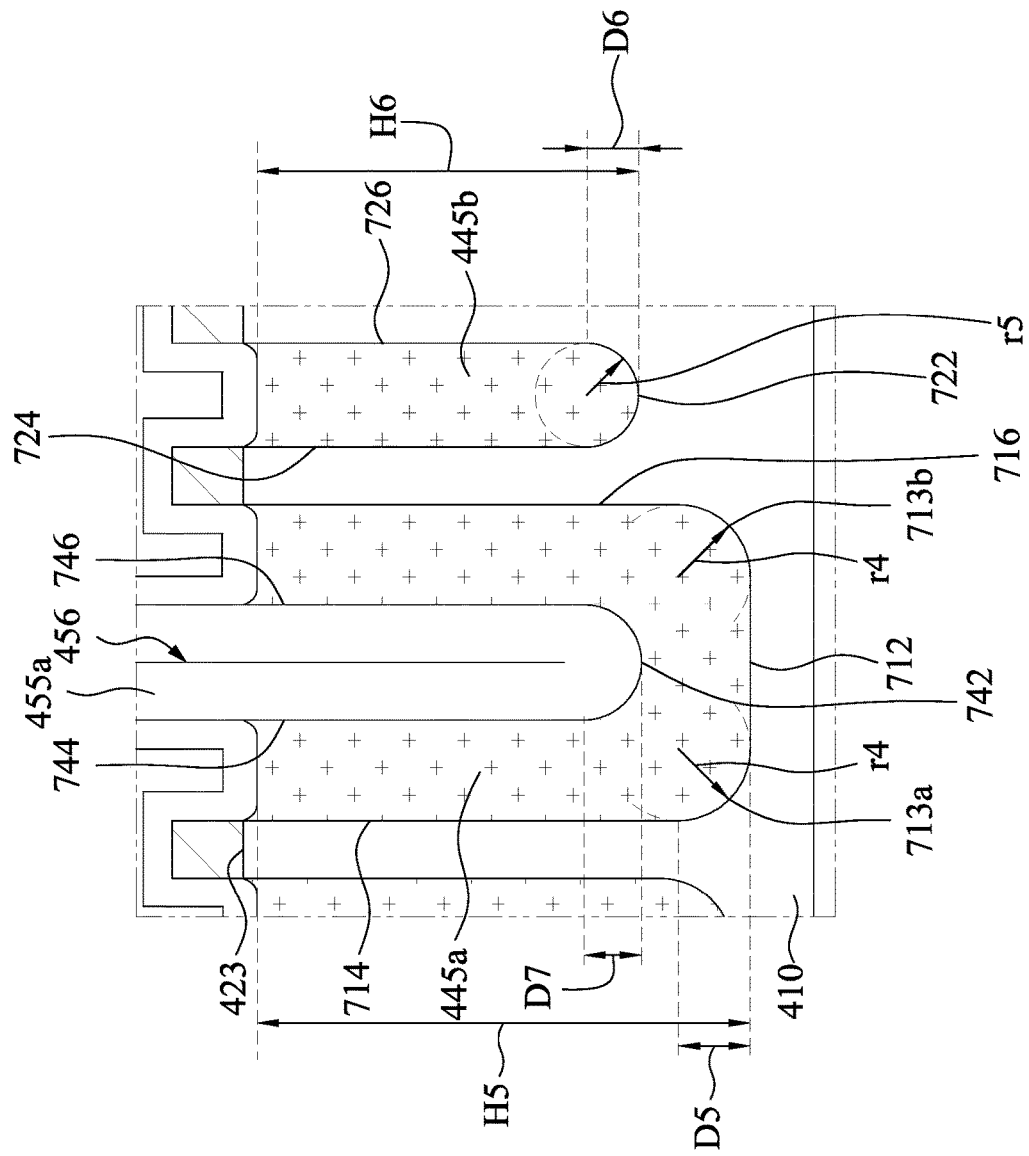
FIG. 31E is an enlarged view of area N in FIG. 31A.

FIG. 31E is an enlarged view of area N in FIG. 31A. Reference is made to FIGS. 31A and 31E. The isolation structure 445a has a bottom surface 712 and opposite sidewalls 714 and 716. The sidewalls 714 and 716 are substantially straight. In some embodiments, the sidewalls 714 and 716 are substantially perpendicular to the top surface 423 of the substrate 410. In some embodiments, the top surface 423 is a top surface of the base portions 42a-42c and 43a-43c (see FIG. 20B). In some embodiments, the sidewalls 714 and 716 are substantially parallel to each other. The sidewall 714 and the bottom surface 712 form a round corner 713a therebetween, and the sidewall 716 and the bottom surface 712 form a round corner 713b therebetween. That is, the round corner 713a is at a bottom of the sidewall 714, and the round corner 713b is at a bottom of the sidewall 716. In some embodiments, each of the round corners 713a and 713b has a radius curvature r4 in a range of about 5 nm to about 20 nm. A distance D5 from a bottom of the round corners 713a and 713b to a top of the round corners 713a and 713b is in a range of about 1 nm to about 3 nm. The isolation structure 445a has a height H5. In some embodiments, a ratio of the distance D5 to the height H5 is about 0.04 to about 0.15. The isolation structures 445c and 445e have similar profiles to the isolation structure 445a, and, therefore, a description in this regard will not be repeated hereinafter.

The isolation structure 445b has a bottom surface 722 and opposite sidewalls 724 and 726. The sidewalls 724 and 726 are substantially straight. In some embodiments, the sidewalls 724 and 726 are substantially perpendicular to the top surface 423 of the substrate 410. The bottom surface 722 is convex, and the round bottom surface 722 has a radius curvature r5 in a range of about 5 nm to about 20 nm. In some embodiments, the radius curvature r4 is greater than the radius curvature r5. A distance D6 from a bottom of the bottom surface 722 to a top of the bottom surface 722 is in a range of about 1 nm to about 3 nm. The isolation structure 445b has a height H6. In some embodiments, a ratio of the distance D6 to the height H6 is about 0.04 to about 0.15. The isolation structure 445d has a similar profile to the isolation structure 445b, and, therefore, a description in this regard will not be repeated hereinafter. In some embodiments, the sidewall 724 is substantially parallel to the sidewall 716.

In FIGS. 31A and 31D, the integrated circuit structure 400 further includes the dielectric fin layers 455 partially embedded in the isolation structures 445. That is, the bottom portions of the dielectric fin layers 455 are surrounded by the isolation structures 445, respectively. For clarity, some of the dielectric fin layers 455 in FIG. 31A are denoted as 455a, 455c, and 455e. In FIG. 31E, the dielectric fin layer 455a has a bottom surface 742 and opposite sidewalls 744 and 746 connected to the bottom surface 742. The bottom surface 642 is curved (or round or convex). The sidewalls 744 and 746 are substantially parallel to each other. A distance D7 from a bottom of the bottom surface 742 to a top of the bottom surface 742 is in a range of about 5 nm to about 20 nm. In some embodiments, the dielectric fin layer 455a has a seam 456 therein. The dielectric fin layers 455c and 455e have similar profiles to the dielectric fin layer 455a, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the aforementioned cyclic etching processes enlarges the bottom of the trenches in the substrate, thereby improves the drain induced barrier lowering (DIBL) problem of the integrated circuit structure. Also, isolation between adjacent fins can be improved due to the enlarged isolation structures.

According to some embodiments, a device includes a substrate, a first fin, a second fin, a first isolation structure, a second isolation structure, and a gate structure. The substrate has a p-type region and an N type region. The first fin extends from the p-type region of the substrate. The second fin extends from the n-type region of the substrate. The first isolation structure is over the p-type region of the substrate and adjacent to the first fin. The first isolation structure has a bottom surface and opposite first and second sidewalls connected to the bottom surface, a first round corner is between the bottom surface and the first sidewall of the first isolation structure, and the first sidewall is substantially parallel to the second sidewall. The second isolation structure is over the n-type region of the substrate and adjacent to the first fin. The first isolation structure is deeper than the second isolation structure. The gate structure is over the first isolation structure and covering the first fin.

According to some embodiments, a device includes a first fin, a second fin, a third fin, a first isolation structure, a second isolation structure, a third isolation structure, and a gate structure. The first fin, the second fin, and the third fin extend from a substrate. The first isolation structure is in contact with the first fin and the second fin. The second isolation structure is in contact with the second fin and the third fin and shallower than the first isolation structure. The second isolation structure has a convex bottom surface, and a sidewall of the second isolation structure is substantially parallel to a sidewall of the first isolation structure. The third isolation structure is in contact with the third fin and deeper than the second isolation structure. A bottom surface of the third isolation structure is inclined with respect to a bottom surface of the first isolation structure. The gate structure is over the second fin and the first, second, and third isolation structures.

According to some embodiments, a method includes forming a mask pattern over a substrate. A first etching process is performed to the substrate to form a trench in the substrate by using the mask pattern as an etching mask. A second etching process is performed to the substrate to deepen the trench. A fluorine amount of an etching gas used in the second etching process is greater than a fluorine amount of an etching gas used in the first etching process. A third etching process is performed to the substrate to further deepen the trench after the second etching process is performed. A fluorine amount of an etching gas used in the third etching process is greater than the fluorine amount of the etching gas used in the second etching process. An isolation structure is formed in the deepened trench after the third etching process is performed. A gate structure is formed over the substrate and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a substrate having a p-type region and an n-type region;

a first fin extending from the p-type region of the substrate;

a second fin extending from the n-type region of the substrate;

a first isolation structure over the p-type region of the substrate and adjacent to the first fin, wherein the first isolation structure has a bottom surface and opposite first and second sidewalls connected to the bottom surface, a first round corner is between the bottom surface and the first sidewall of the first isolation structure, and the first sidewall is substantially parallel to the second sidewall;

a second isolation structure over the n-type region of the substrate and adjacent to the first fin, wherein the first isolation structure is deeper than the second isolation structure, and a bottom surface of the second isolation structure is inclined with respect to the bottom surface of the first isolation structure; and a gate structure over the first isolation structure and covering the first fin.

2. The device of claim 1, wherein the first fin comprises a channel portion and a base portion under the channel portion, and the first sidewall of the first isolation structure is substantially perpendicular to a top surface of the base portion of the first fin.

3. The device of claim 1, wherein a distance between a bottom of the first round corner to a top of the first round corner of the first isolation structure is in a range of about 1 nm to about 3 nm.

4. The device of claim 1, wherein a second round corner is between the bottom surface and the second sidewall of the first isolation structure.

5. The device of claim 1, further comprising a dielectric fin partially embedded in the first isolation structure.

6. The device of claim 5, wherein a bottom surface of the dielectric fin is curved.

7. The device of claim 5, wherein opposite sidewalls of the dielectric fin are substantially parallel to each other.

8. A device comprising:

a first fin, a second fin, and a third fin extending from a substrate;

a first isolation structure in contact with the first fin and the second fin;

a second isolation structure in contact with the second fin and the third fin and shallower than the first isolation structure, wherein the second isolation structure has a convex bottom surface, and a sidewall of the second isolation structure is substantially parallel to a sidewall of the first isolation structure;

a third isolation structure in contact with the third fin and deeper than the second isolation structure, wherein a bottom surface of the third isolation structure is inclined with respect to a bottom surface of the first isolation structure; and a gate structure over the second fin and the first, second, and third isolation structures.

9. The device of claim 8, wherein a difference between a width of a bottom of the first fin and a width of a top of the first fin is less than about 1 nm.

10. The device of claim 8, wherein the first isolation structure has a round corner at a bottom of the sidewall of the first isolation structure.

11. The device of claim 10, wherein a radius curvature of the round corner of the first isolation structure is greater than a radius curvature of the convex bottom surface of the second isolation structure.

12. The device of claim 8, further comprising a dielectric fin, wherein a bottom portion of the dielectric fin is surrounded by the first isolation structure.

13. The device of claim 12, wherein the dielectric fin has a round bottom surface.

14. A method comprising:

forming a mask pattern over a substrate;

performing a first etching process to the substrate to form a trench in the substrate by using the mask pattern as an etching mask;

performing a second etching process to the substrate to deepen the trench, wherein a fluorine amount of an etching gas used in the second etching process is greater than a fluorine amount of an etching gas used in the first etching process;

after performing the second etching process, performing a third etching process to the substrate to further deepen the trench, wherein a fluorine amount of an etching gas used in the third etching process is greater than the fluorine amount of the etching gas used in the second etching process;

after performing the third etching process, forming an isolation structure in the deepened trench; and forming a gate structure over the substrate and the isolation structure.

15. The method of claim 14, wherein the etching gas used in the third etching process comprises $CF_4$, $CH_2F_2$, or combinations thereof.

16. The method of claim 15, wherein an amount of $CF_4$ used in the third etching process is greater than an amount of $CF_4$ used in the second etching process.

17. The method of claim 14, wherein an etching depth of the trench in the third etching process is greater than an etching depth of the trench in the second etching process.

18. The method of claim 14, wherein a first polymer layer is formed in the trench during the first etching process, and the method further comprises:

removing the first polymer layer prior to performing the second etching process.

19. The method of claim 18, wherein a second polymer layer is formed in the trench during the second etching process, and a thickness of the second polymer layer is greater than a thickness of the first polymer layer.

20. The method of claim 14, wherein performing the third etching process is such that a sidewall of the deepened trench is substantially perpendicular to a top surface of the substrate, and the deepened trench has a rounded corner at a bottom of the sidewall.

* * * * *